US011481193B2

(12) United States Patent
Myers et al.

(10) Patent No.: US 11,481,193 B2
(45) Date of Patent: Oct. 25, 2022

(54) METHOD AND APPARATUS FOR GENERATION OF MULTIPHASE STOCHASTIC BINARY STRING

(71) Applicant: Chaoyang Semiconductor Jiangyin Technology CO. LTD., San Diego, CA (US)

(72) Inventors: Regan Myers, San Diego, CA (US); Saeid Safavi, San Diego, CA (US)

(73) Assignee: Chaoyang Semiconductor Jiangyin Technology CO LTD., San Diego, CA (US)

( * ) Notice: Subject to any disclaimer, the term of this patent is extended or adjusted under 35 U.S.C. 154(b) by 204 days.

(21) Appl. No.: 16/792,066

(22) Filed: Feb. 14, 2020

(65) Prior Publication Data

US 2021/0255833 A1    Aug. 19, 2021

(51) Int. Cl.
  *G06F 7/58*    (2006.01)
  *H03K 3/84*    (2006.01)
  *H03K 19/20*    (2006.01)

(52) U.S. Cl.
  CPC .............. *G06F 7/588* (2013.01); *H03K 3/84* (2013.01); *H03K 19/20* (2013.01)

(58) Field of Classification Search
  CPC .......... G06N 3/0472; G06F 7/70; G06F 7/58; G06F 7/582; G06F 7/584; G06F 7/586; H03K 3/84; H03K 19/20; H03K 19/21; H03M 7/26
  See application file for complete search history.

(56) References Cited

U.S. PATENT DOCUMENTS

2018/0204131 A1 *   7/2018   Najafi ................... G06N 7/005

OTHER PUBLICATIONS

A. M. Yang et al., "Design of accurate stochastic number generators with noisy emerging devices for stochastic computing", IEEE 2017 (Year: 2017).*
B. A Alaghi et al., "Survey of Stochastic Computing", ACM Trans. Embed. Comput. Syst. 12, 2s, Article 92, 2013 (Year: 2013).*

* cited by examiner

*Primary Examiner* — Emily E Larocque
(74) *Attorney, Agent, or Firm* — Jaquez Land Greenhaus & McFarland LLP; Bruce W. Greenhaus, Esq.

(57) ABSTRACT

Some of the disclosed methods and apparatuses use several types of stochastic binary string (SBS) generators to generate SBS sequences based on the particular values to be multiplied. Some embodiments use a multiphase SBS generator to more efficiently generate multiple SBS sequences that are offset from one another in "phase".

1 Claim, 41 Drawing Sheets

METHOD AND APPARATUS FOR GENERATION OF MULTIPHASE STOCHASTIC BINARY STRING

BACKGROUND

(1) Technical Field

Systems and methods for improving the efficiency of computational machines and more particularly for reducing the amount of hardware necessary to perform computational operations.

(2) Background

Interest in representing numeric values as a stochastic binary string (SBS) sequence is rising as several types of technologies are emerging that require millions and even billions of pairs of values to be multiplied. In many cases, these multiplication operations are being performed on pairs of numbers that are represented in binary format. The interest in representing the numbers to be multiplied as an SBS sequence stems from the fact that multiplication can be performed more efficiently on numbers that are represented as an SBS sequence.

A string representing a particular value as an SBS sequence has a series of ones and zeros. However, the value represented by the string is not dependent upon the location of the ones and zeros, as is the case with values represented using binary representations. Rather, the value represented by the string is a function of the probability that each bit within the string carries a value of either "1" or "0". That is, whether a particular bit of the string is a one or a zero is determined using a probability p that the bit will be assigned a value of one. The probability p is the same for each bit in the string. The value represented by the string determines the probability p.

This can be stated as follows:
An SBS is a numerical representation of a number n in a range $f<n<c$, as a string N (i.e., bit sequence) of length T (i.e., a string having T bits), where each bit has a probability p of being assigned a value of "1".
In some instances, n is a "unipolar" representation of an integer magnitude (i.e., $f=0$, such that the magnitude is between zero and c, c being an integer greater than 1).
Accordingly:
$f=0$,
$c>0$,
p is equal to n/c, and
$T=c$ It can be shown that for a unipolar SBS, the number of ones in the string divided by the total number of bits in the string will very closely approximate the probability p that a particular bit in the string is a one, as the length T of the string approaches infinity.

In other instances in which n is a "bipolar" or signed representation of an integer magnitude (i.e., magnitude between $-c$ and c):
$f=-c$
$c>f$ and
$p=(n+c)/2c$
$T=2c$ For bipolar representations of values of n, where n is negative, the probability p that a bit will be assigned a value of "1" will be less than 50% and for values of n greater than zero, the probability p will be greater than 50%. When n is equal to zero, the probability that any particular bit will be a one will be exactly 50%.

Conversion from a binary representation of a value n to an SBS representation of the value n can be accomplished using a random number generator that outputs values $R_i$ between $c-1$ and $-c$, inclusive. Accordingly, there are 2c values in this range, since the range includes $-c$ and zero, but does not include c. For each bit $N_i$ of a string N, having length T, a randomly selected value $R_i$ is compared to the value n. If the value $R_i$ is less than the value n then the bit $N_i$ is assigned a value of one. Otherwise, the bit $N_i$ is assigned a value of zero.

It can be seen that (assuming the generator is truly random) the probability that the randomly generated value $R_i$ will be greater than the value n is equal to the value $(n+c)/2c$; where the total number of values that can be generated is 2c, of which n+c potential values are less than n. For example, for a value of $n=0$, the number of values that are less than zero (i.e., the number of values that fall in the range of $-c$ to $-1$) out of the total set of value in the range $-c$ to $c-1$, inclusive is equal to c. Accordingly, there is a 50% probability that the bit $N_i$ will be assigned a value of one. That is, for a sufficiently long string N (i.e., T=infinity), there will be an equal number of ones and zeros in a bipolar SBS representation of the value zero.

For a value of $n=c$, there will be 2c values that are less than n (i.e., all the values from $-c$ to $c-1$, including zero). Accordingly, the probability will be 100% that the value will be less than n. That is for a string N that is an SBS representation of the value c, all of the bits $N_i$ will be assigned to a value of one. Alternatively, for a value of $n=-c$, none of the values $-c$ to $c-1$, inclusive are less than $-c$. Accordingly, there is a 0% probability that a value $R_i$ will be less than $-c$. The result is a string N that is an SBS representation of the value $-c$, in which all of the bits $N_i$ will be zeros.

Extending this to the general case, it can be seen that ideally $(n+c)/2c$ of the bits will be assigned a value of one for a string N having a total of $2c=T$ bits representing a bipolar SBS representation of a value n, where $-c<n<c$.

It should be noted that T may be an integer multiple of 2c (i.e., $T=m2c$, wherein m is an integer). Since the assignment of each bit of the string N is a probability, the probability that the SBS sequence will attain the ideal condition in which the number of bits that are a one is equal to $(n+c)/2c$ is a function of the length T of the SBS sequence. An SBS sequence consistently attains this ideal condition as the length T of the string approaches infinity.

Figures 1A, 1B, 1C:
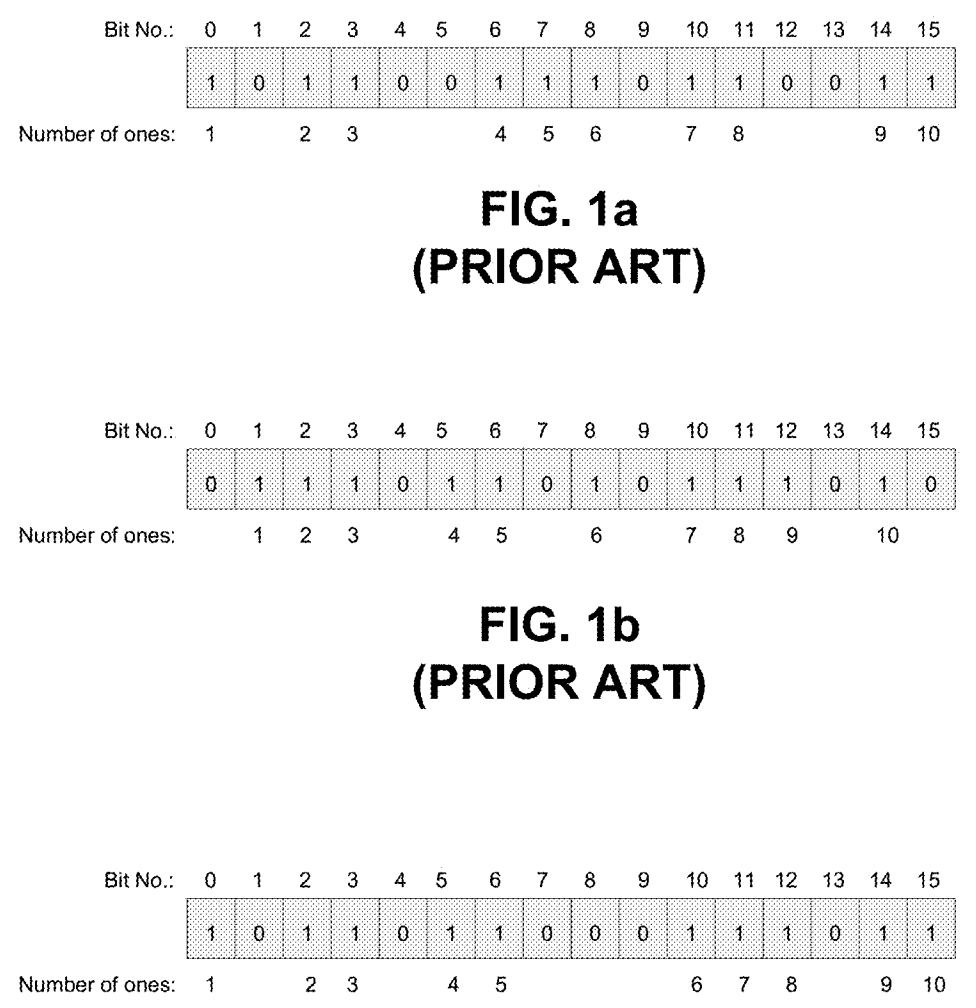

FIG. 1a through FIG. 1c illustrate an "ideal" bipolar SBS sequence N that represents a value of 2. Each string 101, 103, 105 has a total of 16 bits. In each case, $f=-c$, $c=8$, $n=2$, $p=(c+n)/(2c)=10/16$. With $n=2$, the string N represents a value of 2, which can alternatively be represented by a binary value of 010. Since $p=10/16$, there are 10 bits within the 16 bit string N that will be assigned a value of one. The strings 101, 103, 105 are each bipolar (i.e., signed) strings. That is, given sufficient number of instances of the string of length 16, the average number of bits that are assigned a value of one will be equal to $n=10$, and the probability p is equal to the number of bits that are assigned a value of one divided by the total number of bits in the string $(c+n)/(2c)$ $=p=10/16$. It holds true that for a bipolar SBS (BSBS) string N of any length T, the average number of bits that are a "1" will be equal to $(c+n)$. For a Unipolar SBS (USBS) string N of any length T, the average number of bits that are a "1" will be n. In addition, it should be understood that the greater the length of the string T, the more likely it will be that a string N generated in the manner noted above will accurately represent the value n.

Since the strings illustrated in FIG. 1a through FIG. 1c are defined as representing a value based on a probability p that each bit will be assigned a value of "1", these illustrated strings are "ideal" strings. That is, over several instances of the string, the average number of bits that are a one will be equal to 10, but for any particular instance of the string, the number of bits may be equal to anything within the range 0 to 2c for a BSBS sequence and 0 to c for a USBS sequence. Clearly, for a BSBS sequence N that represents a value of 2, the probability that all bits will be assigned a value of "0" is relatively remote, whereas the probability is greatest that the string will have exactly 10 bits that are assigned a "1". Furthermore, the particular strings shown are merely provided as examples to illustrate the way stochastic representations are used to represent numeric values (i.e., to illustrate that the placement of the ones within the string is not relevant to the value represented by the string).

One of the reasons it is becoming more interesting to use an USBS representation of a value is that multiplication of two values represented by an USBS can be performed by a bit-wise AND of the two USBS sequences. Multiplication of two values represented as a BSBS sequence is performed by a bit-wise XNOR of the two BSBS sequences. Therefore, a single gate (either AND for USBS or XNOR for BSBS) can be used to multiply the values represented by two strings.

It can be seen that performing a bit-wise logical AND operation results in the product of two USBS sequences, since the probability that any two particular bits, having probabilities $p_1$ and $p_2$, respectively, will both be assigned a "1" at the same time is equal to the product of the probabilities $p_1 \times p_2$. Therefore, by performing a bit-wise AND operation on a first string $N_1$ with respect to a second string $N_2$, will result in a string $N_p$ in which each bit will have a probability that is the product of the probabilities associated with the two strings. Accordingly, the resulting string $N_p$ is a string that represents the product of the values represented by the first and second strings, $N_1$, $N_2$. Similar logic can be used to show how the bit-wise XNOR of two BSBS sequences $N_1$, $N_2$ will result in a BSBS sequence $N_p$ that represents a value that is the product of the values represented by the two strings $N_1$, $N_2$.

FIG. 2 is an illustration of a circuit (i.e., an AND gate) for multiplying two USBS sequences. The result of the bit-wise AND of these two values (10/16 times 10/16) is a string in which 7 of 16 bits are a "1". It should be noted that this is not an accurate result, since the product of 10/16×10/16 is 6.25/16.

In fact, it should be noted that the accuracy of the multiplication is not very good for smaller strings (i.e., 16 bits), since both the resolution of the string is low and the number of bits subjected to the probability p is low. However, the accuracy of the multiplication of two values represented by stochastic strings increases as the square of the number of bits used in the strings. An intuitive sense for this can be gained by noting that whether each bit location carries a "1" or a "0" in each of the strings that are to be multiplied is based on a probability. Therefore, the larger the number of bits, the more likely the number of bits that are assigned a "1" will be equal to the value n. In addition, the larger the number of bits in the strings to be multiplied, the more likely the result of the multiplication operation will provide the desired result, since there will be a lower probability that the location of all of the bits assigned a value of "1" in one string will correlate with the location of all of the bits assigned a value of "1" in the other string. Similarly, there will be lower probability that the location of all of the bits assigned a value of "0" in one string will correlate with the location of all of the bits assigned a value of "0" in the other string. In fact, the probability that the bits assigned a value of "1" are aligned (i.e., that both bits at the same location are assigned a value of "1") will be equal to the product of the probability $p_1$ that a bit in the first string carries a "1" and the probability 2 that a bit in the second string carries a "1". Therefore, the longer the strings to be multiplied, the greater the likelihood that the number of bits assigned a value of "1" will be equal to the product of the probabilities $p_1$, $p_2$. In addition to that, USBS sequences that represent a value closer to c/2, rather than values close to either 0 or c will have a higher probability of being accurate. That is because the result will be inaccurate for cases in which the bits of the strings are either fully correlated or fully anti-correlated (i.e., either all of the "1"s of one string are aligned with the "1"s of the other string, or none of the "1"s of one string are aligned with the "1"s of the other string). Viewed from another angle, when the values are at one extreme or the other, the probability of a bit being assigned a value of "1" is either very high or very low. Such cases will require a longer string to ensure that the low probability events occur often enough to provide an accurate result. For example, for a string representing a value where the probability of a bit being assigned a value of "1" is very high, it may take a very large number of bits before a bit occurs that is not assigned a value of "1". Similarly, for a string in which the probability of a bit not being assigned a value of "1" is very low, it may take a very large number of bits before a bit occurs that carries a "1". Clearly, for the extreme cases, it can be intuitively understood that the strings will have to be larger to attain the same accuracy that is attained for strings in which the probability of a bit being assigned a value of "1" is closer to 0.50 (i.e., 50%).

In the case shown in FIG. 2, both values to be multiplied have 10 bits that are assigned a value of "1". Ideally, 6 of the bits of the first value that are assigned a value of "1" would align with a bit of the second value that also carries a "1". However, since 7 (rather than 6, or more precisely, 6.25) of the bits are assigned a value of "1" in the first string are aligned with a bit of the second string that is a one, the product of the two numbers is inaccurate. As noted above, longer strings result in a more accurate product of the two strings, as the probability that the ideal number of bits would align increases.

Figures 3, 4:
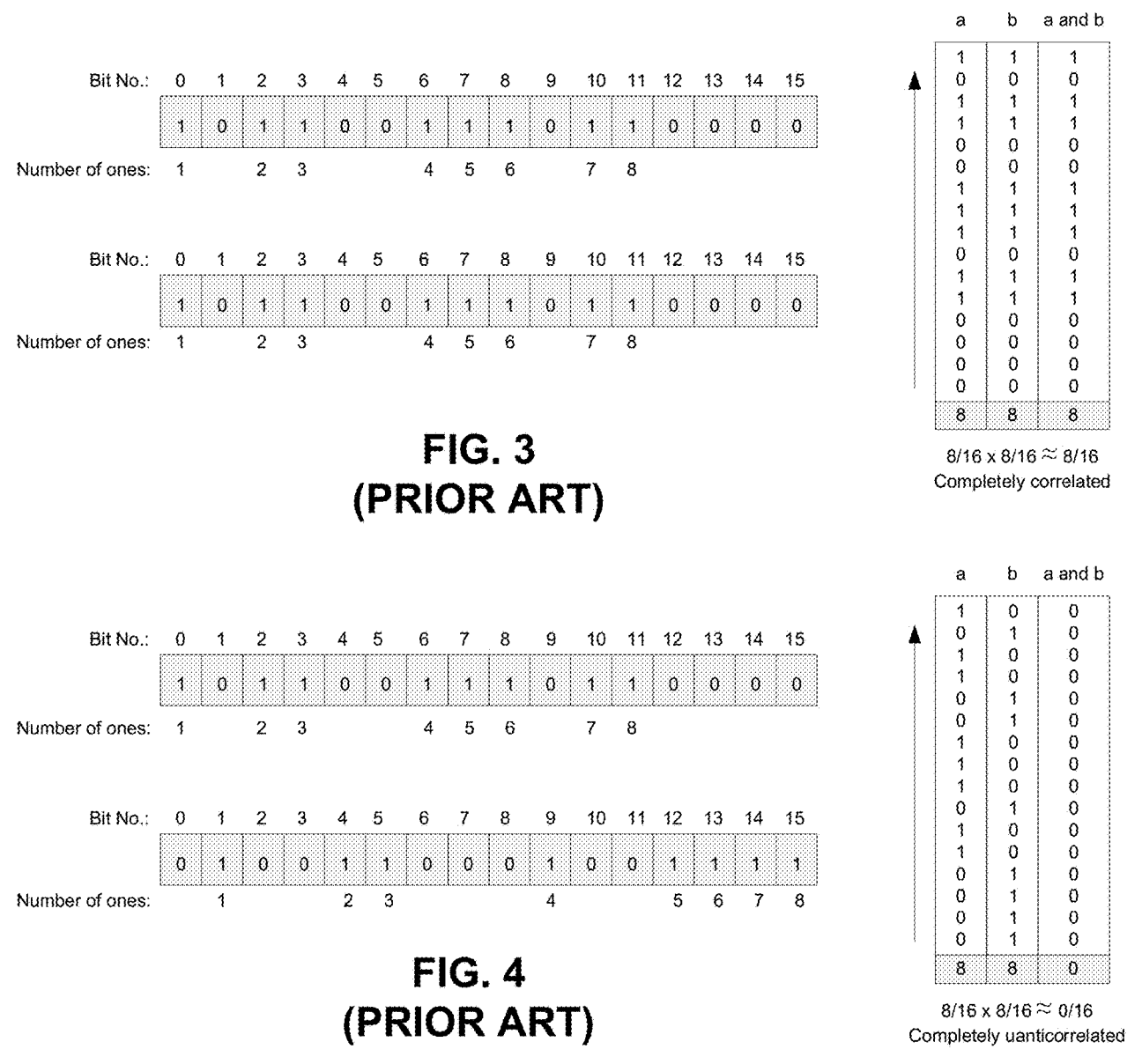

FIG. 3 is an illustration of two USBS sequences that are fully correlated. A bit-wise AND of these two strings results in a string with 10 of the 16 bits in the result being assigned a value of "1". The result of multiplying 8/16×8/16 where the two strings are fully correlated is 8/16. Clearly, this is far from an accurate result. Note that any other relationship between the location of the "1" of each string would result in a product that is closer to the accurate product, which is a value of 4/16.

FIG. 4 is an illustration of two USBS sequences that are anti-correlated. Here again, the product of the two anti-correlated values results in an answer that is equally as bad as the case in which the "1"s are fully correlated. That is, the result of 8/16×8/16 is 0 for two strings that are fully anti-correlated. Again, any other relationship between the locations of the "1"s would result in a product that is closer to the correct answer (with the exception of the fully correlated relationship noted above, in which the answer is in error by an equal magnitude).

The idea with the stochastic computations is that probabilistically, the number of times that the locations of the ones and zeros used to represent the two values to be multiplied are either correlated or anti-correlated will be small with respect to the number of times the locations of only half the bits of the same value are aligned (i.e., locations of bit in each value are correlated). This is more likely to be the case for values that are not near either the maximum value c or the minimum value f. The longer the strings that are being multiplied, the lower the probability that the strings will be either fully correlated or fully anti-correlated.

Figure 5:
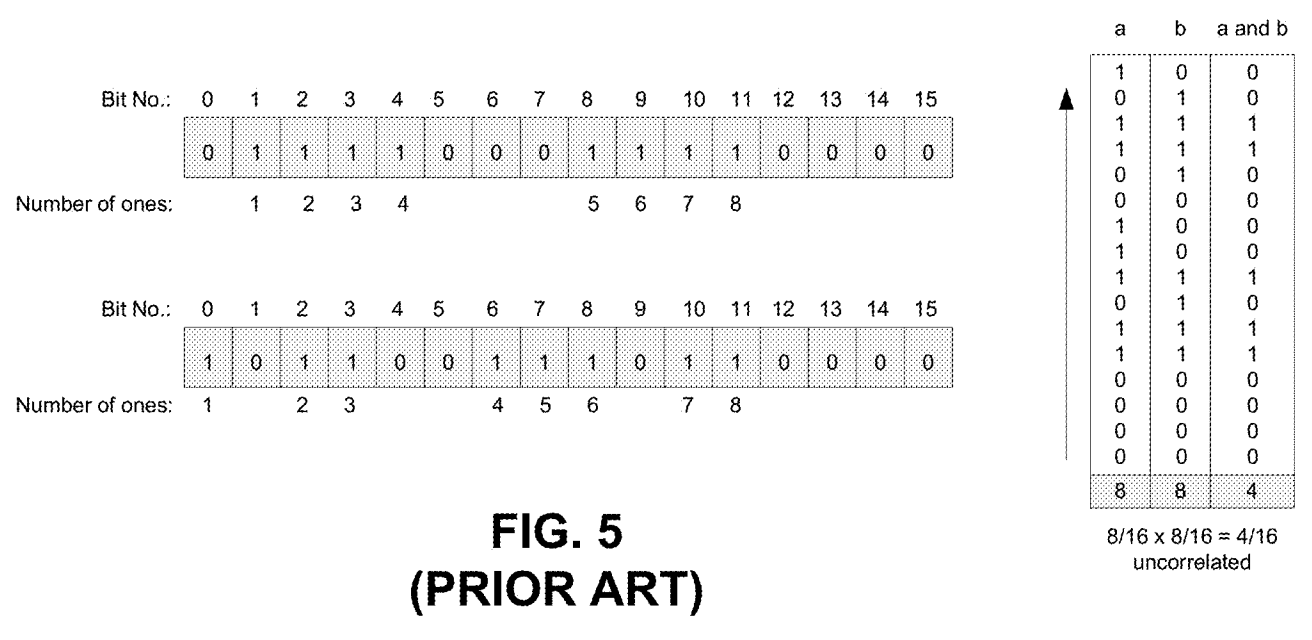

FIG. 5 is an illustration of two USBS sequences in which half the bits are assigned a value of "1" are correlated with bits of the other string that are assigned a value of "1" (i.e., "uncorrelated"). In this case, the result of the multiplication is accurate. That is 8/16×8/16 is equal to 4/16.

Whereas unsigned values represented by USBS sequences are multiplied using an AND gate, signed values represented by BSBS sequences are multiplied using an XNOR gate. As noted above, for BSBS sequences, p=(n+c)/2c. Therefore, if n (the number to be represented) is equal to zero, the probability that a bit will be assigned a value of "1" is:

$$p=(0+c)/2c=c/2c=\frac{1}{2}=0.50 \text{ (i.e., 50\%).}$$

Therefore, ideally, half the bits will be assigned a value of "1" when the string represents a value of zero. For example, for a string of length 16 in which 8 of the bits are assigned a value of "1", the probability is 50% (i.e., 0.50), where n=0, c=16, p=(n+c)/2c=(0+16)/2(16)=0.50.

FIG. 6 is an illustration of an XNOR gate used to multiply two BSBS sequences. Each string has a length c=16, a representative value n=0, and a probability that a bit will be assigned a value of "1", p=0.50. In the example shown, the result is a string having 8 bits that are assigned a "1". This result represents a value of 0. Accordingly, the result of the multiplication 0×0=0 is correct. In this case, it can be seen that the bits that are assigned a value of "1" in each string are uncorrelated.

Figures 7, 8:
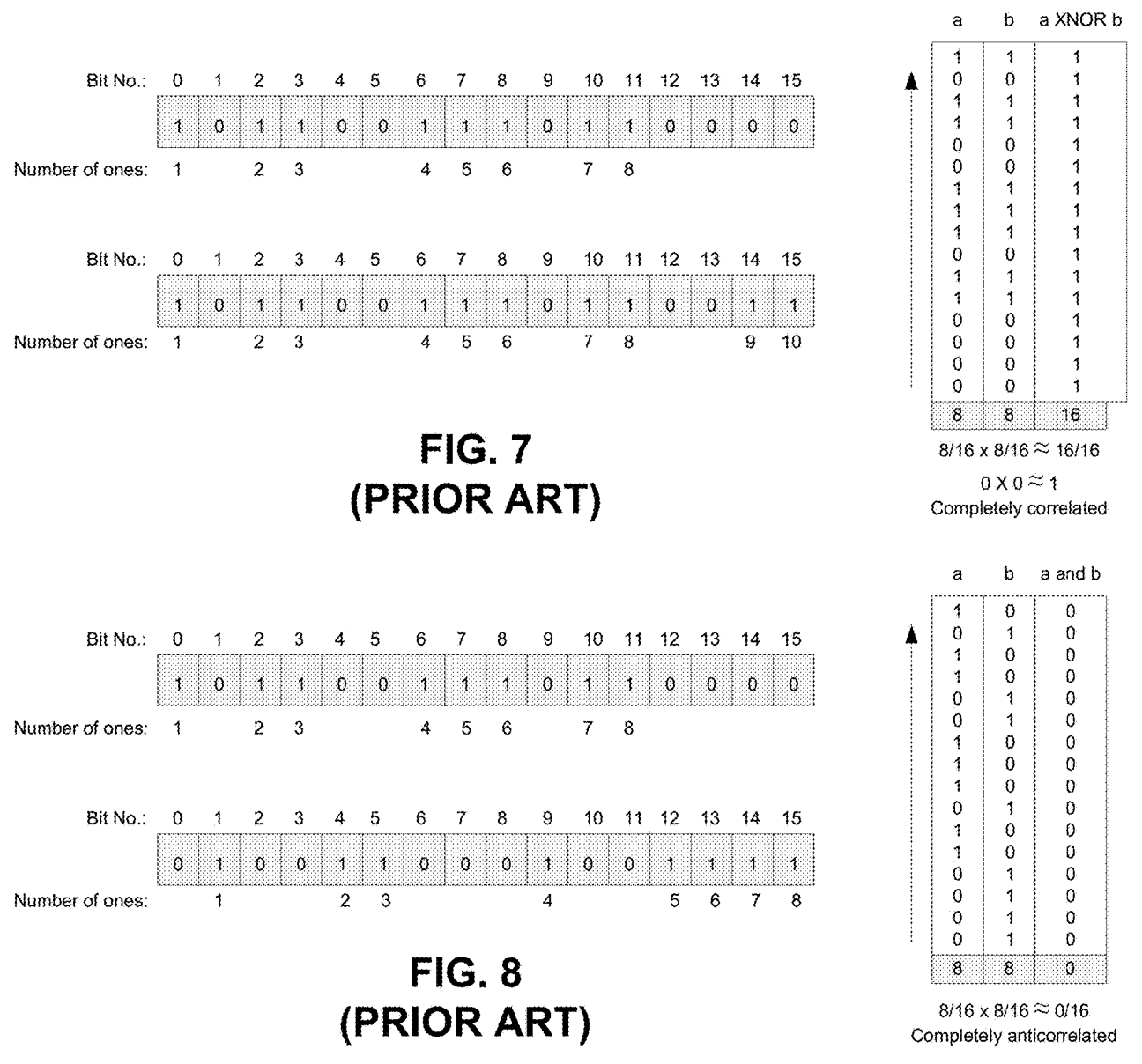

FIG. 7 is an illustration of a case in which two strings representing values of 0 are fully correlated. In this case, the result is a string that represents a value of 1. Clearly, this is an incorrect answer, resulting from the fact that the strings are fully correlated.

FIG. 7 is an illustration of a case in which the two strings representing values of 0 are fully anti-correlated. In this case, the result is a string representing a value of −1. Again, it can be seen that, just as is the case when the strings are fully correlated, the answer is wrong when the strings are fully anti-correlated.

While strings can be multiplied with a very high level of efficiency (i.e., using very little hardware), the size of the strings needed to represent the values to be multiplied are very large. That is, in order to represent a value of $10^7$, you need $10^7$ bits, as opposed to binary representation which only requires 20 bits. Therefore, storing such values is extremely inefficient for large values. The larger the value, the more inefficient the representation becomes.

Nonetheless, the multiplication of values represented in binary form is relatively difficult and requires far more hardware than multiplication of values represented in stochastic form. Furthermore, multiplication operations on SBS sequences can be performed very quickly by having a number of multiplication gates operating in parallel. Note that the particular order of the bits of each stream are not relevant, since the placement of the ones and zeros throughout the strings is arbitrary. Therefore, as long as the timing of the bits entering the multiplication gate is synchronized, it does not matter what order the bits of the strings enter the gates.

FIG. 9 is a simplified schematic of a design of an SBS generator, such as the one described above that can be used to generate an SBS sequence having a value that is determined by a stored binary value. This method for generating an SBS sequence is referred to herein as a "ρ-sequence method" (i.e., the Greek letter rho, referring to the fact that the sequence is derived using a random sequence of values). A pseudo random number generator (PRNG) 901 outputs a stream of randomly generated binary values. The generator 901 is call a "pseudo" random number generator because the stream of values output from the PRNG 901 is periodic over a relatively long period. That is, the sequence of values will repeat, but only after a very large number of values has been output. Accordingly, the values are deterministic (the next value can be determined from a give set of previous values), however, the algorithm used to generate the values is relatively complex and the period over which the sequence is spread is relatively long. Therefore, for all relevant intents and purposes, the sequence can be considered random.

The output of the PRNG 901 is coupled to a first input to a comparator 903. The second input to the comparator 903 is coupled to the output of a memory 905 that provides a binary value to the comparator 903. The number of bits used to represent the binary value output from the PRNG 901 is equal to the number of bits used to represent the binary value output from the memory 905. If the binary value output from the memory 905 is greater than the random value output from the PRNG 901, then the comparator outputs a "1". Otherwise, the comparator outputs a "0". The binary value output from the memory remains constant as a sequence of values output from the PRNG 901 is applied to the comparator 903, until the number of random values is equal to the number of bits to be contained in the SBS sequence to be generated to represent the binary value. The length of the SBS will determine the relative accuracy of the representation. The longer the string of bits in the SBS used to represent value, the more accurate the representation will be. Furthermore, the length of the SBS sequence determines the resolution with which the SBS sequence can determine the value. It should be clear that the maximum resolution is determined by the length of the binary value output from the memory 905 and the PRNG 901.

For example, if the memory outputs a binary value represented in 4 bits, then the range of values will be limited to 0-15. Naturally, this can be shifted, so that the output represents values from −7 to 8, for example, as would be the case if the values are signed binary values. Similarly, the output of the PRNG 901 would be a stream of 4-bit words. Since the stream of words output from the PRNG 901 may be treated as random, at least for a stream that is shorter than the period of the PRNG 901, the probability that the output of the PRNG 901 is greater than the value output from the memory 905 will be determined by the magnitude of the value output from the memory 905. Accordingly, each bit generated by the comparator 903 has a probability of being a "1" that is proportional to and representative of the value of the binary word output from the memory 905.

There are problems that can arise when using SBS sequences generated using the ρ-sequence method. These problems stem from the fact that the SBS sequences generated using the ρ-sequence method have values that are not typically accurate representations of the value that they are intended to represent. That is, SBS sequences generated by the ρ-sequence method have a binomial error distribution with a scaled deviation proportional to:

$$\sqrt{p\left(\frac{(1-p)}{T}\right)} \quad \text{EQ. 1}$$

In addition, the fact that a PRNG is required is not ideal. Furthermore, SBS sequences generated using the ρ-sequence method do not adhere to the additive inverse identity property. That is, an SBS ρ(−b) that is generated to represent a value −b is not equal to the SBS −ρ(b). Accordingly, ρ(−b)−(ρ(b)) is not equal to zero. This can be a problem in some cases in which it would otherwise be desirable to use SBS sequences.

Currently, neural networks and other AI engines are being used to perform an increasing number of tasks. Such neural networks and AI engines require millions of multiplication operations to be performed in order to perform the desired task.

Therefore, performing multiplication with less hardware yields a significant advantage in terms of the size of the multiplication hardware, and thus the cost of the multiplication hardware. However, use of ρ-sequences to generate SBS sequences is not ideal due to the need for a PRNG and the lack of adherence to the additive inverse identity property. Furthermore, it would be beneficial to identify ways to make the results from such SBS multiplication operations more accurate for use with neural networks and other AI engines. The presently disclosed method and apparatus provides a method and apparatus that improves the generation of SBS sequences for use in such situations.

DESCRIPTION OF THE DRAWINGS

FIG. 1a through FIG. 1c illustrate an "ideal" bipolar SBS sequence N that represents a value of 2.

FIG. 3 is an illustration of two USBS sequences that are fully correlated.

FIG. 4 is an illustration of two USBS sequences that are anti-correlated.

FIG. 5 is an illustration of two USBS sequences in which half the bits are assigned a value of "1" are correlated with bits of the other string that are assigned a value of "1".

FIG. 7 is an illustration of a case in which two strings representing values of 0 are fully correlated.

FIG. 8 is an illustration of a case in which the two strings representing values of 0 are fully anti-correlated.

FIG. 12 illustrates the condition once the index i is incremented from zero to 1.

FIG. 13 illustrates incrementing the bit index, i to 2 and the calculation of the value of $A_2$.

FIG. 14 illustrates the next pass, in which the index is incremented to i=3.

FIG. 15 illustrates the next pass, in which the index is incremented to i=4.

Like reference numbers and designations in the various drawings indicate like elements.

DETAILED DESCRIPTION

Some embodiments of the disclosed method and apparatus use several types of stochastic binary string (SBS) generators to generate SBS sequences based on the particular values to be multiplied. Some embodiments use a multiphase SBS generator to more efficiently generate multiple SBS sequences that are offset from one another in "phase", as will be explained in more detail below.

δ-Sequence Generator

One type of SBS generator that can be used in accordance with some embodiments of the disclosed method and apparatus generates an δ-sequence. A δ-sequence is a string that presents a numerical value in either unipolar or bipolar SBS format. The δ-sequence may be used either once or repeated multiple times within an SBS sequence. The δ-sequence evenly spreads the bit positions of the "1"s in the BSBS sequence out so that the "1"s are as evenly spaced across the string as possible.

Figure 2:
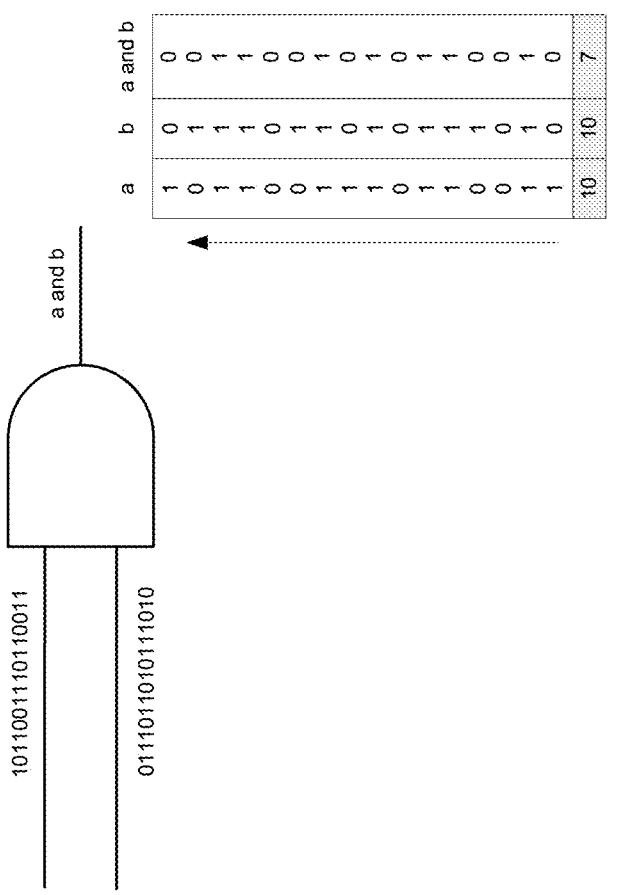
FIG. 2 is an illustration of a circuit (i.e., an AND gate) for multiplying two USBS sequences.
Figure 6:
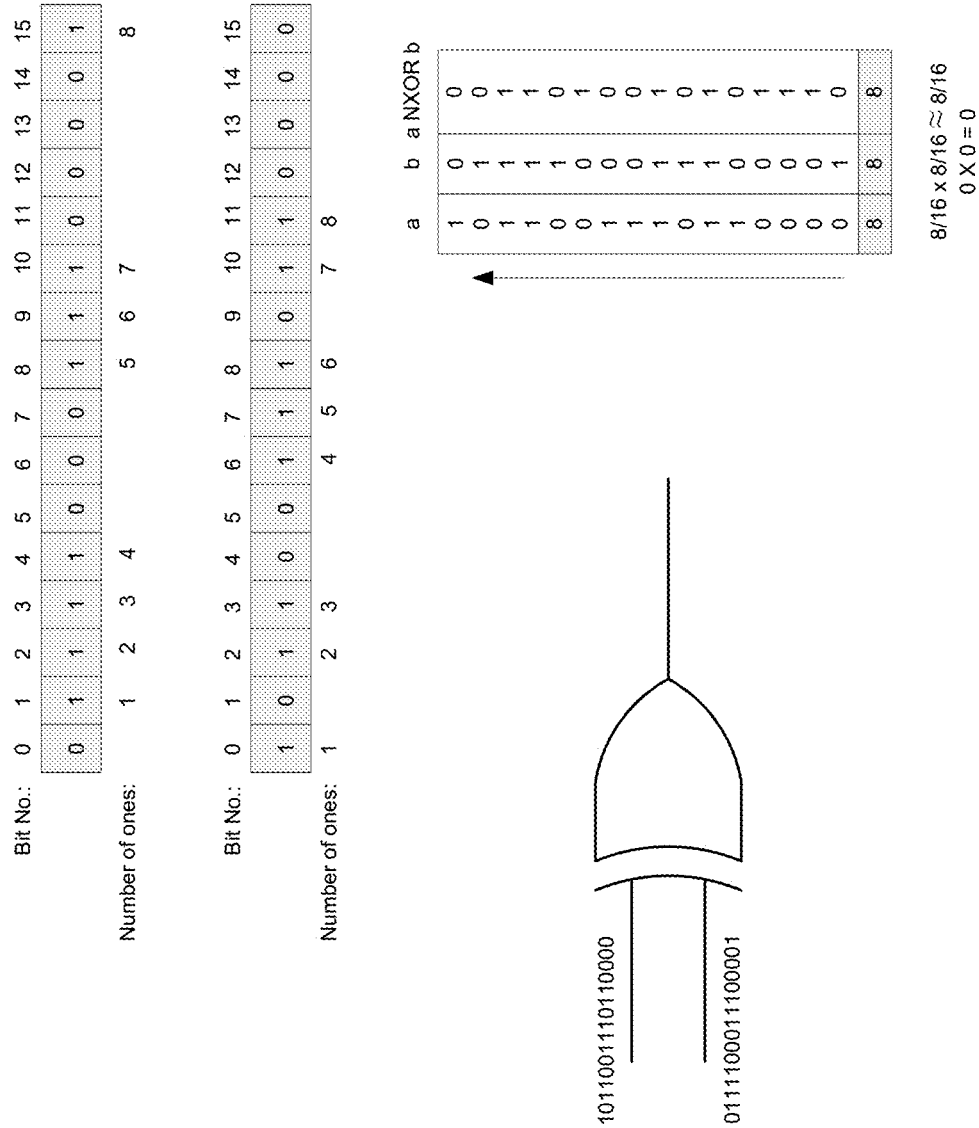
FIG. 6 is an illustration of an XNOR gate used to multiply two BSBS sequences.
Figure 9:
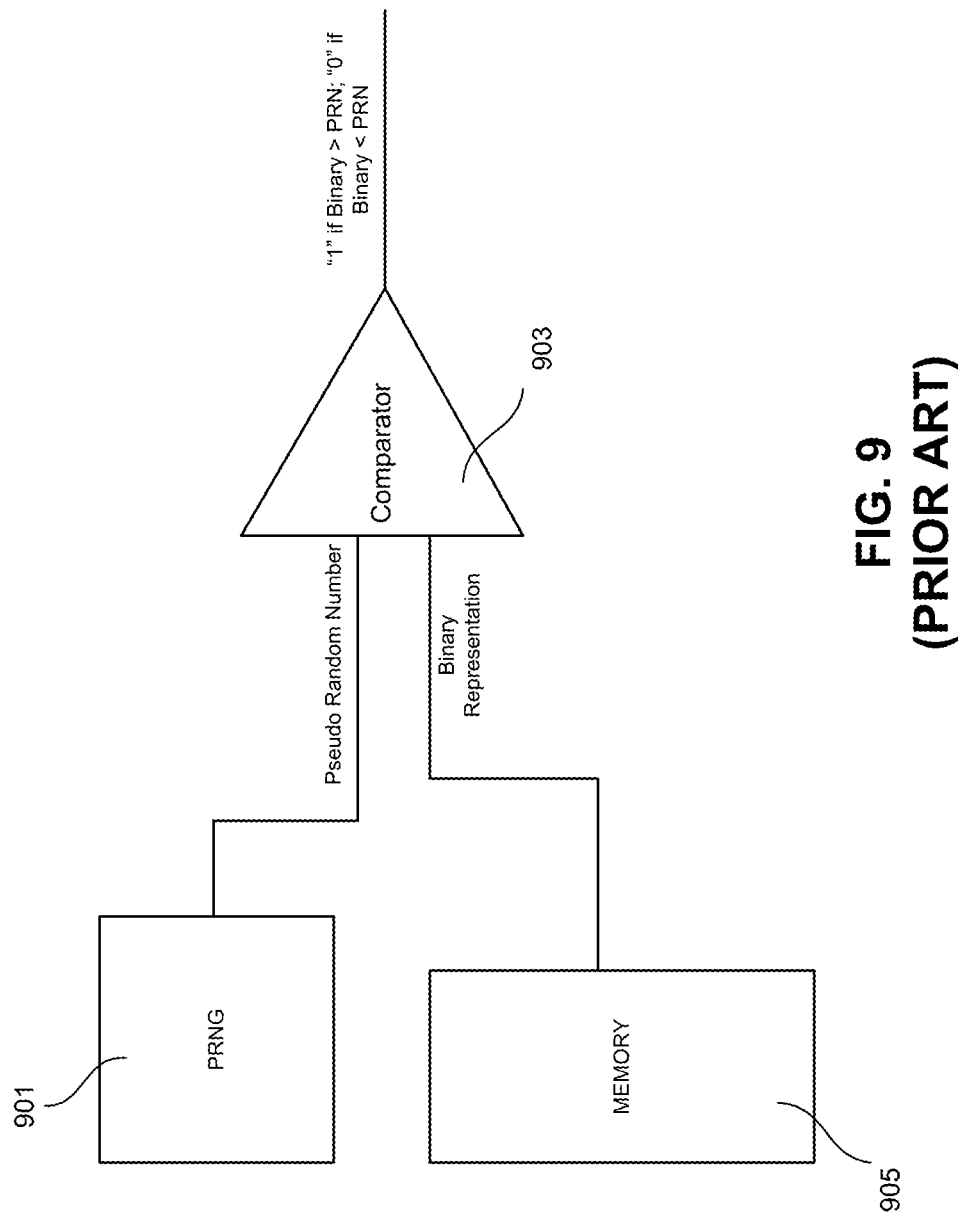
FIG. 9 is a simplified schematic of a design of an SBS generator, such as the one described above that can be used to generate an SBS sequence having a value that is determined by a stored binary value.
Figure 10:
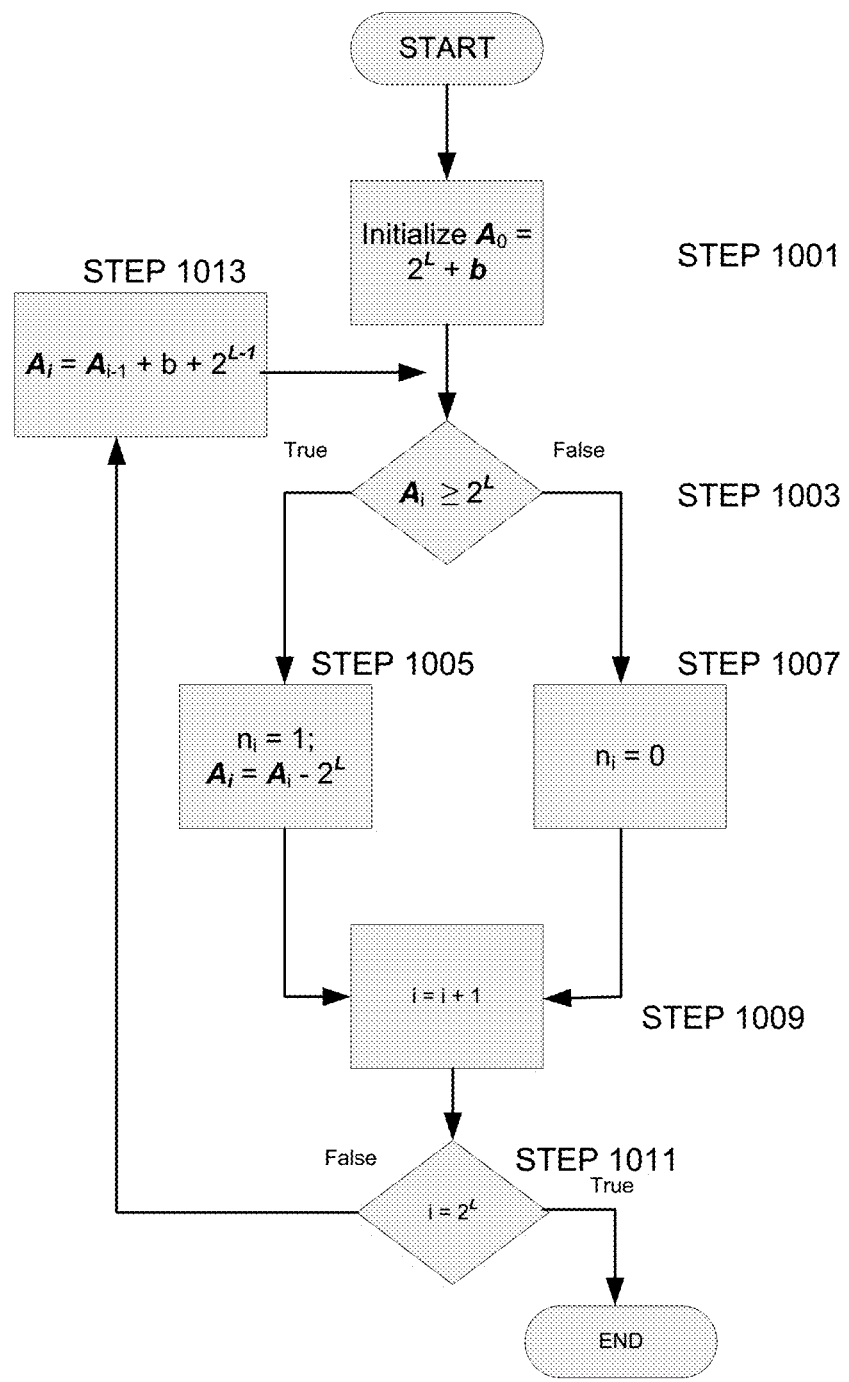
FIG. 10 is a flowchart of an algorithm that is used in some embodiments of the δ-sequence generator to distribute the ones evenly throughout the δ-sequence.

FIG. 10 is a flowchart of an algorithm that is used in some embodiments of the δ-sequence generator to distribute the ones evenly throughout the δ-sequence. The δ-sequence N is a string $N_1$ of L bits in which the index i is an integer from 0 to $2^{L-1}$. To start, a bit index counter 1701 is initialized to zero and an accumulator A having a bit precision of L+1 is initialized to a value of $A_i=2^L+b$ (STEP 1001). As noted above, the value of b is the value to be represented by the δ-sequence (i.e., the value to be converted from a two's complement binary representation to BSBS representation). It should be noted that for values b represented in two's complement, b will be in the range of $-2^{L-1}$ to $2^{L-1}-1$. For example, for a two's complement representation in which L=4 can represent values b in a range from −8 to 7.

It should be noted that a 4-bit two's complement binary number has a bit precision of 4 bits that represents the magnitude of the value. Two's complement binary numbers represent a range of positive and negative numbers by having the most significant bit represent a negative weight. Accordingly, a two's complement representation of the value 4, is b=0100. Accordingly, for L=4: the magnitude is represented as a value from $-2^L=2^3=-8$ to $2^L-1=7$. That is, the range of values that can be represented by b includes 1000=−8 to 0111=7. According, the maximum value that can be represented by b is $7=2^L-1=2^3-1$. A 4-bit two's complement representation of the value −4 is b=1011. The lead bit indicates that the value represented by the following three bits is negative; in this case the following three bits being 011 indicate the magnitude is 4.

By initializing the value of an accumulator, $A_0$ to $2^L+b$, the value of the accumulator, $A_0$ is initialized to b, offset by the total number of values that b can represent. However, it should be noted that in an alternative embodiment, the accumulator could be initialized to any value, since the process is periodic with a period of $2^L$. Once initialized, the value $A_0$ of the accumulator A is then compared to $2^L$ to determine whether it is greater than $2^L$ (STEP 1003). In other embodiments, the comparison can be made to other values within a range from zero to $2^L$. If the comparison of STEP 1003 is true, then a bit $n_i$ of the δ-sequence, N is set to "1".

In some embodiments, the value of the accumulator is maintained within a range of zero to $2^L$. This can be done by decrementing the value $A_i$ of the accumulator, A by $2^L$ if it is greater than $2^L$ (STEP 1005). Alternatively, the accumulator can roll over to zero when incremented by one from the value $2^{L-1}$. If the comparison of STEP 1003 is false, the bit $n_i$ of the δ-sequence, N is set to "0" and the value $A_i$ of the accumulator, A remains the same (STEP 1007). In either case, the index i is then incremented (STEP 1009). After incrementing the index, the index i is checked to see whether all of the bits of the δ-sequence, N have been generated (STEP 1011). Since they have not, the value $A_i$ of the accumulator is updated to $A_i=A_{i-1}+b+2^{L-1}$ (STEP 1013).

Figure 11:
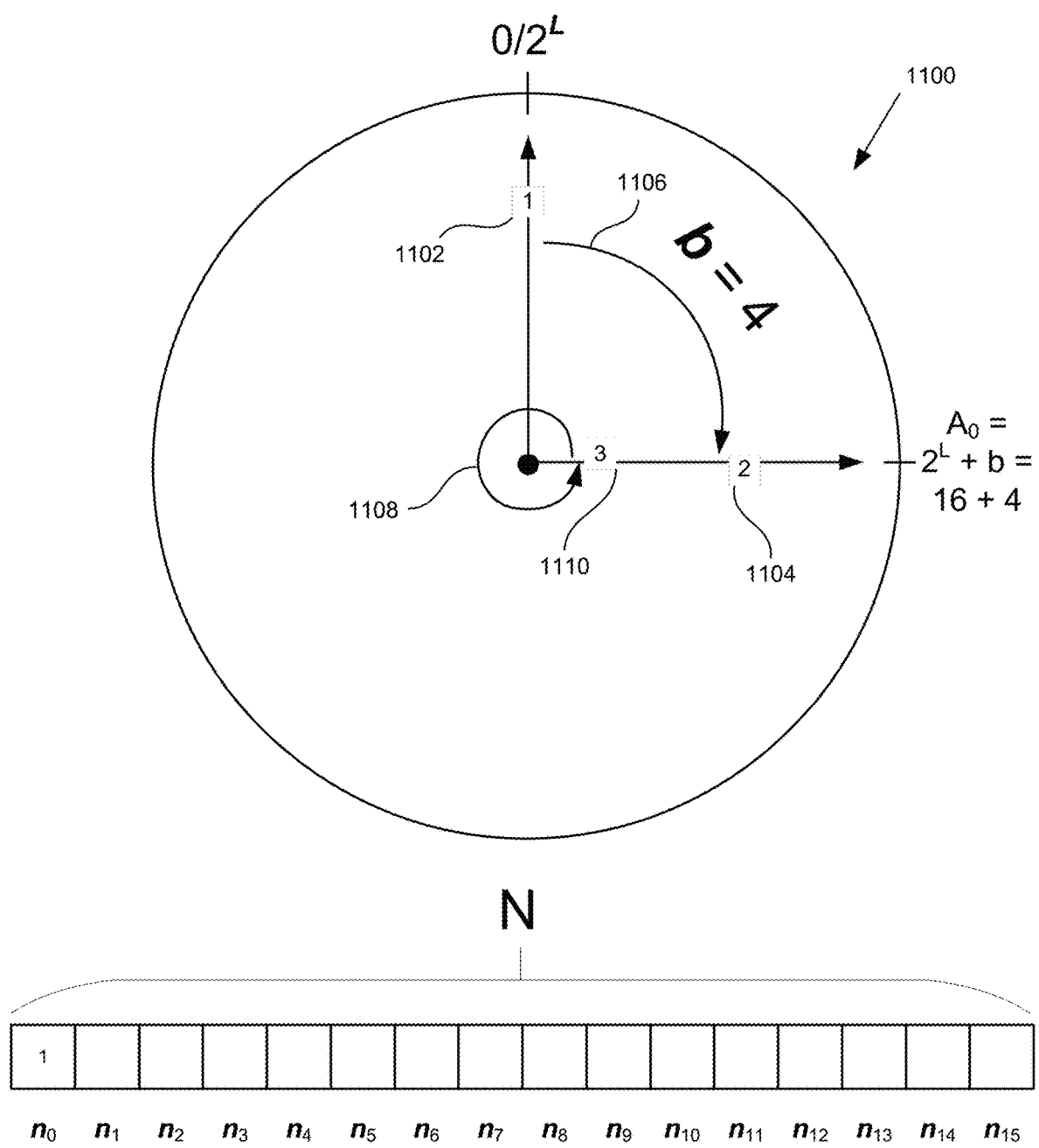
FIG. 11 through FIG. 15 provide a graphic representation of the steps shown in the flowchart of FIG. 10.

FIG. 11 through FIG. 15 provide a graphic representation of the steps shown in the flowchart of FIG. 10. In FIG. 11, a vector circle 1100 is shown having a period of $2^L$, with zero/$2^L$ at the top (i.e., at zero degrees, top center, "12-o'clock"). Values represented around the circle increase linearly from 0 to $2^L$ in a clockwise direction around the circle over 360 degrees. In the example shown, L=4 and b=4. The circle 1100 illustrates the state of the accumulator A with the index, i=0. A first pointer 1102 is shown at position "1", representing a value of $2^L=2^4=16$. A pointer 1104 is rotated 90° clockwise with respect to the pointer 1102 to a position "2", representing $A_0=2^L+b=16+4=20$ (i.e., the point on the circle representing the value $A^0$ to which the accumulator A is initialized at STEP 1001, with the index i=0), as indicated by an arrow 1106. Upon performing a comparison in STEP 1003, the value of $A_0=20$ is determined to be greater than $2^L=16$. Accordingly, on the first pass through STEP 1003, the answer is "true". STEP 1005 is performed and the value of Bit 0, $n_i=n_0$ for i=0 is set to "1". The bits $n_0-n_{15}$ of the δ-sequence, N are shown, with the value of no set to 1. In addition, the value $A_0$ of the accumulator A with a bit index equal to zero (indicated by the subscript) is reduced by $2^L$. Accordingly, $A_0=A_0-2^L=20-16=4$, as shown by the 360° counter-clockwise rotation of the pointer 1104 indicated by the arrow 1108 to result in a pointer 1110 located at position "3", which is the collocated with position "2" of the pointer 1104. Note that a series of numbers from "1" to "3" are shown on the pointers 1102, 1104, 1110 to indicate the order of the rotation of the pointers around the vector circle 1100.

Note that the index is not yet incremented. It should also be noted that in some embodiments in which $2^L=16$, the accumulator A is a 4-bit register that will overflow at count 16, making the content of the accumulator at $A_0$ equal to b=4, thus negating the need to subtract $2^L$ from the value in the accumulator $A_0$. However, in such embodiments, the test performed in STEP 1003 is more complicated, since there is a need to determine whether the pointer has rotated past zero, rather than simply testing for a value greater than $2^L$.

Figure 12:
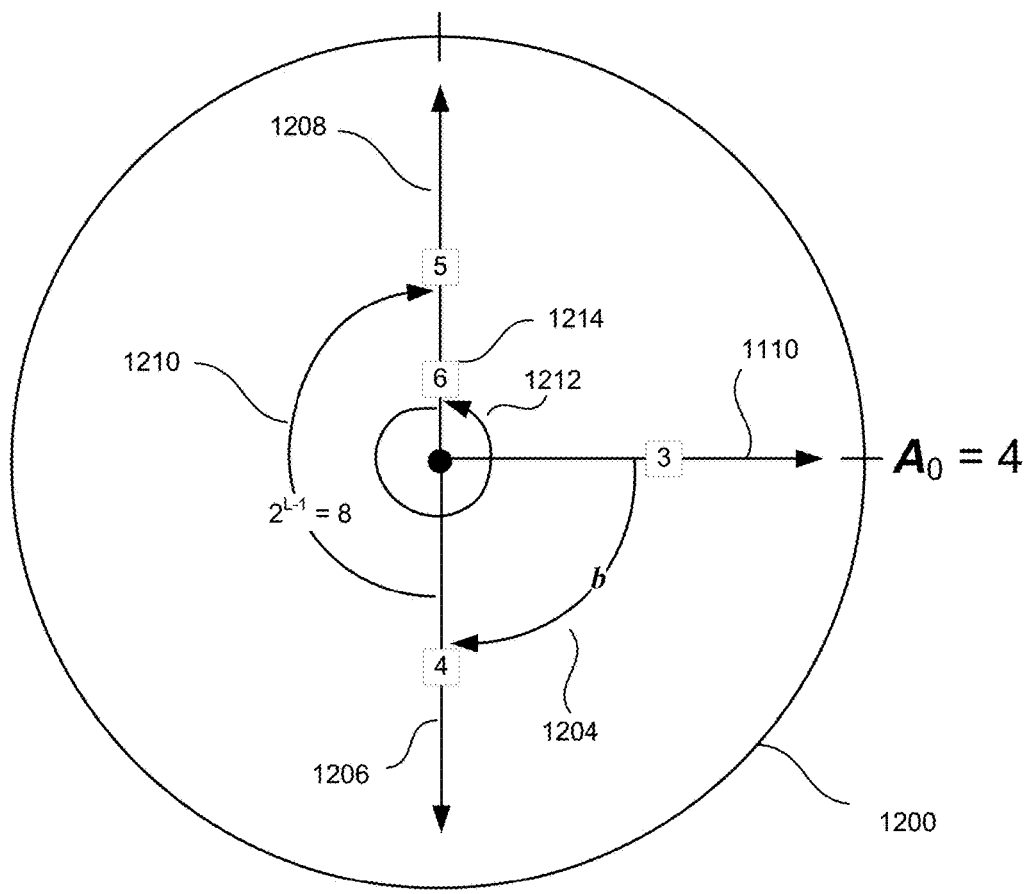

FIG. 12 illustrates the condition once the index i is incremented from zero to 1 (STEP 1009). Next, the index i is then checked to see whether all of the bits of the δ-sequence, N have been generated (STEP 1011). Since they have not, STEP 1013 is performed, in which the next value $A_1$ is calculated as $A_1=A_0+b+2^{L-1}=4+4+8=16$ (STEP 1013). The pointer 1110 at position "3" representing the current value of $A_0$ is first rotated 90° clockwise by the value b, illustrated by the arrow 1204, resulting in a pointer 1206 at position "4". The pointer 1206 is then rotated another 180° to the top of the circle 1200 as indicated by arrow 1210, illustrating the addition of the value of $2^{L-1}=8$, resulting in pointer 1208 at position "5". The process then returns to STEP 1003 and the value $A_1$ is compared to 16 (STEP 1003). Since $A_1=16$, the result of the compare is true and the value of $n_1$ is set to 1 (STEP 1005). It can be seen that each time the value of the accumulator is updated in STEP 1013, a check is made at STEP 1003 to see whether the pointer representing the value of the accumulator has rotated to, or past, the top of the vector circle 1100. If not, the associated bit is set to "0"; if so, the associated bit is set to "1". The smaller the value b, the more bits will be set to zero, since it will take more passes through STEP 1013 to cause the pointer to rotate to the top of the vector circle 1100. At the one extreme (i.e., when b=−8), the increment added to $A_i$ in STEP 1013 will be zero (i.e., $b+2^{L-1}=-8+8=0$). Therefore, all of the bits will be set to "0". In the other extreme (i.e., when b=7), the increment added to $A_i$ will be 15 (i.e., $b+2^{L-1}=7+8$). Therefore, for each of the 16 bits, the sum in STEP 1003 will be greater than or equal to 16. It should be noted that the when the bit index i=0, the sum in STEP 1011 will be equal to 31 and after incrementing the bit index i to a value of 15, the sum $A_{15}$ in STEP 1013 will be equal to 16. Accordingly, upon making the last pass through STEP 1009 all of the bits will have been set to "1".

When the pointer 1208 representing the value of the accumulator for the next index value i has rotated to or past the top, the value of the accumulator $A_1$ is reduced by $2^L$ (STEP 1005) as illustrated by the arrow 1212 indicating a 360° counter-clockwise rotation of the pointer 1208 back to a value of zero. The resulting value is represented by a pointer 1214 at position "6".

Figure 13:
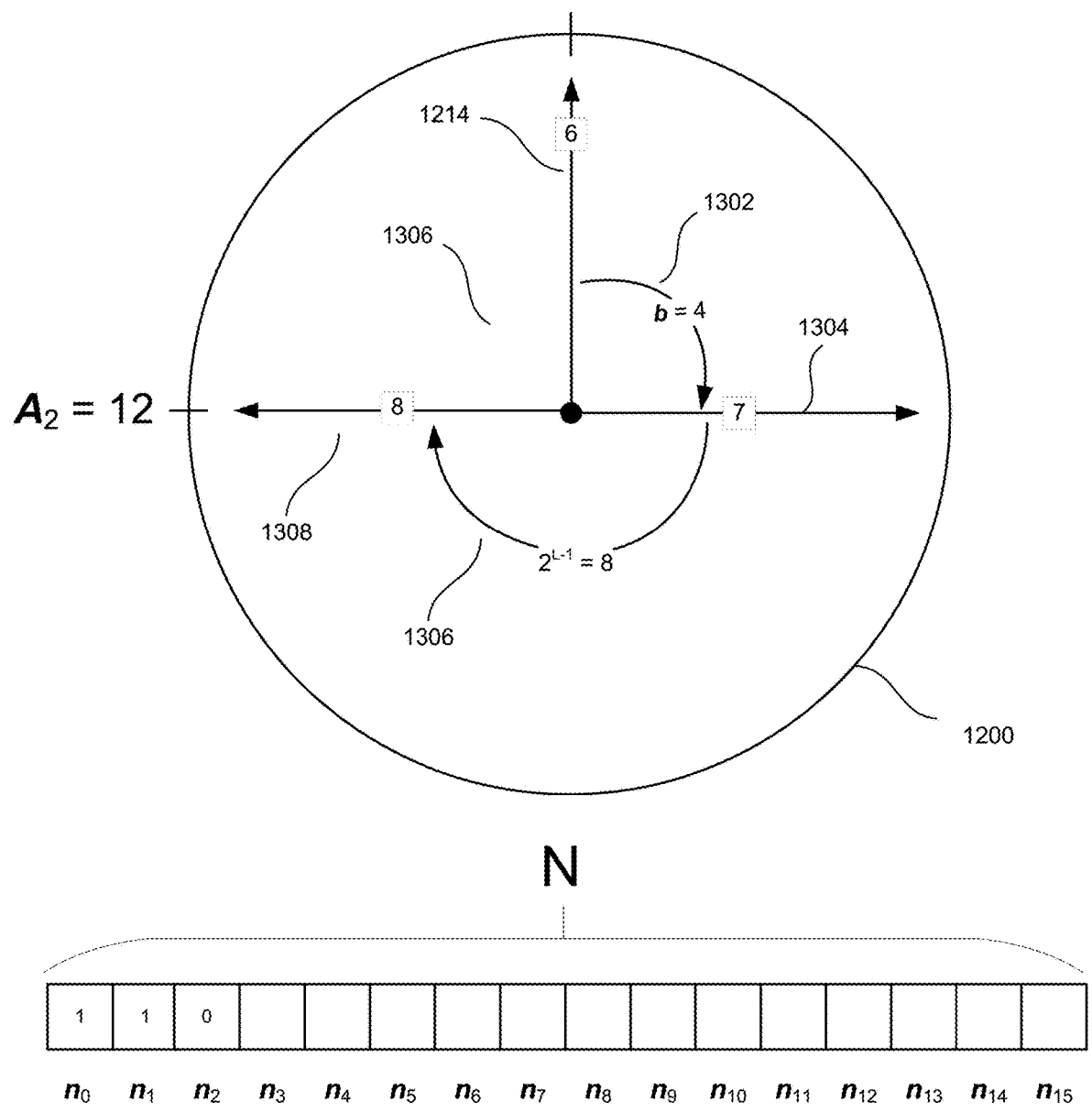

FIG. 13 illustrates incrementing the bit index, i to 2 (STEP 1009) and the calculation of the value of $A_2=A_1+b+2^{L-1}=0+4+8=12$ (STEP 1013). The pointer 1214 at position "6" represents $A_1$, the current value of the accumulator. Adding the value b is shown by an arrow 1302 representing a 90° clockwise rotation of the pointer 1214 resulting in a pointer 1304 at position "7". The addition of the value $2^L$ is shown by an arrow 1306 representing a 180° clockwise rotation of the pointer 1404, resulting in a pointer 1308 at position "8", indicating a value of $A_2$=12. Since $A_2$=12 is less than $2^L$=16, the value of the bit $n_2$ as determined in STEP 1005 is set to 0.

Figure 14:
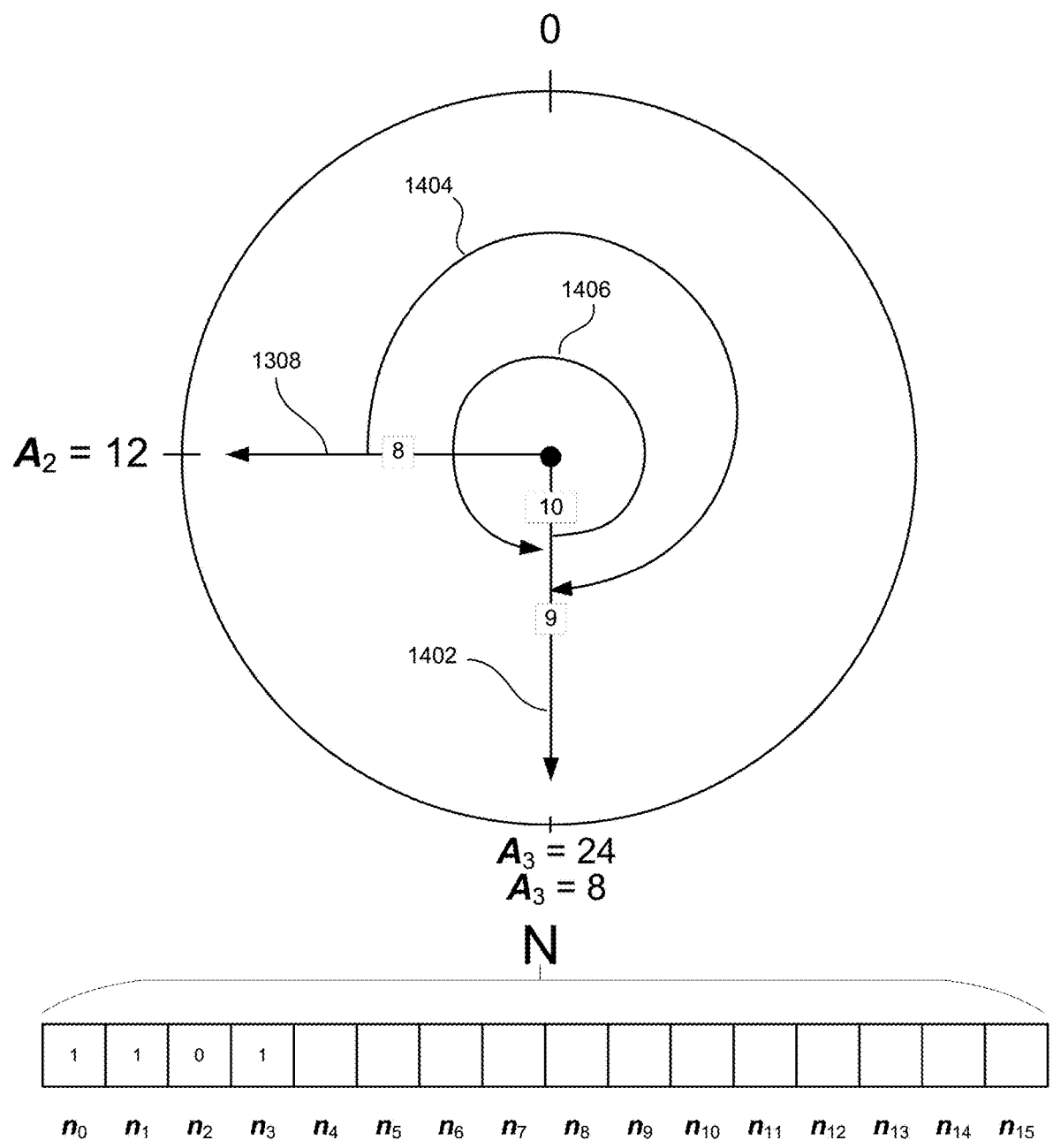

FIG. 14 illustrates the next pass through STEP 1009, in which the index is incremented to i=3. The bit index i is then checked to see whether all of the bits of the δ-sequence, N have been generated (STEP 1011). Since they have not, a new value is calculated for $A_3=A_2+b+2^{L-1}=12+4+8=24$ (STEP 1013). An arrow 1404 shows the 270° clockwise rotation of the pointer 130 from position "8" representing the addition of the value $b+2^L=12$ to pointer 1402 at position "9" having a value of 24. The process then returns to STEP 1003. In STEP 1003, $A_3$=24 is compared to $2^L$=16. Since $A_3$=24 is greater than $2^L$, the value of $n_3$ is set to 1 and a new value is calculated for $A_3$ in STEP 1005. The new value is $A_3=A_3-2^L=24-16=8$, which rotates the pointer 1402 from position "9" counter-clockwise by 360° to position "10", as indicated by the arrow 1406.

Figure 15:
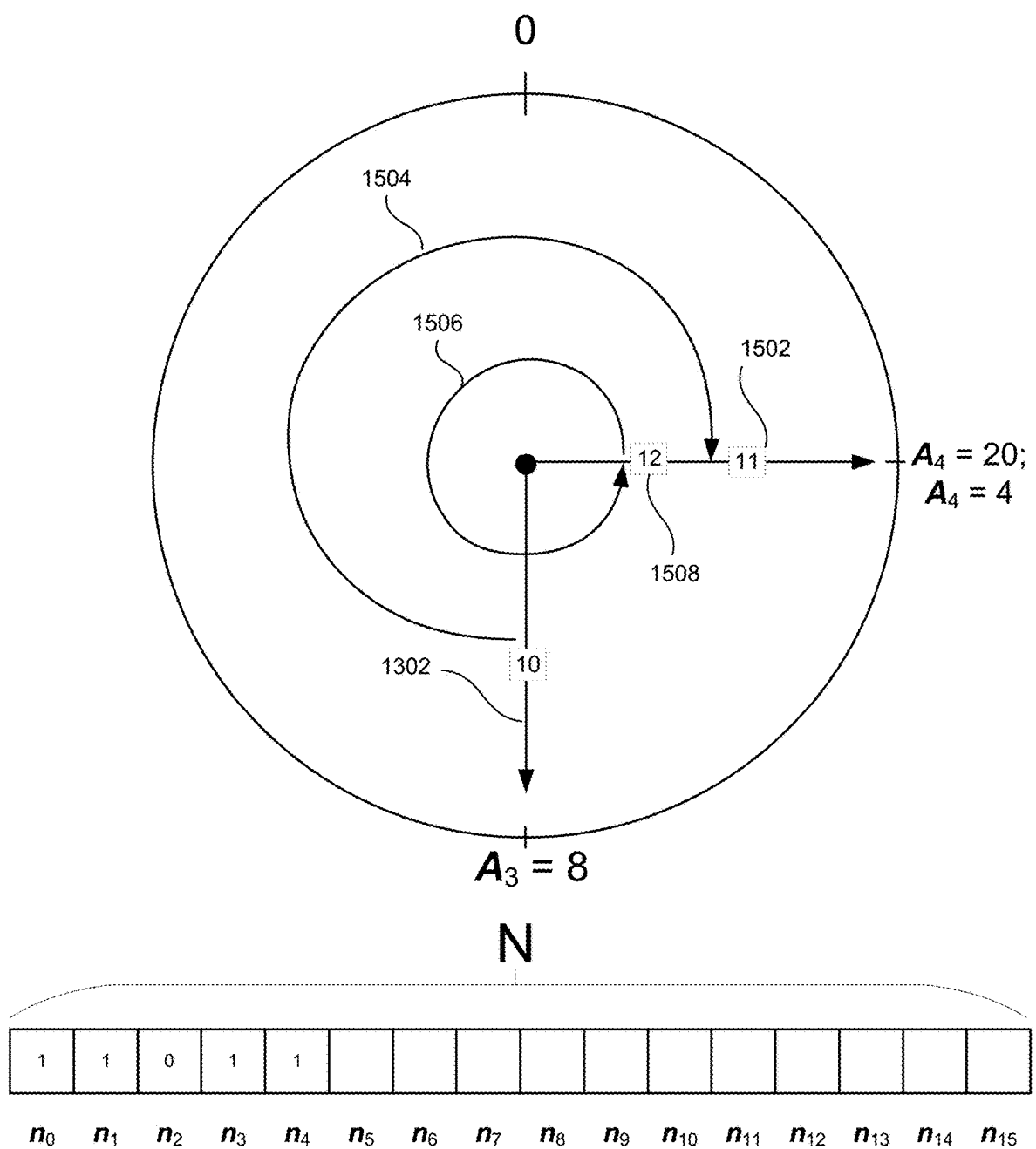

FIG. 15 illustrates the next pass through STEP 1009, in which the index is incremented to i=4. The index i is then checked to see whether all of the bits of the δ-sequence, N have been generated (STEP 1011). Since they have not, a new value is calculated for $A_4=A_3+b+2^{L-1}=8+4+8=20$ (STEP 1013). An arrow 1504 shows the 270° clockwise rotation of the pointer 1302 at position "10", resulting in a pointer 1502 at position "11". The process then returns to STEP 1003. In STEP 1003, $A_4$=20 is compared to $2^L$=16. Since $A_4$ is greater than $2^L$, the value of $n_4$ is set to 1 and a new value is calculated for $A_4$ in STEP 1005. The new value is $A_4=A_4-2^L=20-16=4$, which rotates the pointer 1502 from position "11" 360° counter-clockwise, as indicated by arrow 1506, resulting in pointer 1508 at the position "12". It can be seen that the pointer 1508 at position "12" has the same value as the pointer 1104 at position "2" show in FIG. 11, when the index value was i=0. Accordingly, when the index increments to i=5, the process will proceed exactly as it did when the index incremented to i=1. Therefore, it can be seen that the value of the bit $n_5$ will be set to 0 and the value of $A_5$ will be calculated to be the same as the value of $A_1$=16. Similarly, the value of the bit $n_6$ will be set to 1, the same as bit $n_2$ and the value of $A_7$ will be calculated to be the same as the value of $A_3$=12. This pattern will continue for all the remaining bits from $n_7$ through $n_{15}$, with bit $n_{15}$ having the same value as bit $n_3$. The index i is checked to see whether all of the bits of the δ-sequence, N have been generated (STEP 1011). Once the index i, is equal to $2^L$=16 the process ends.

Figure 16:
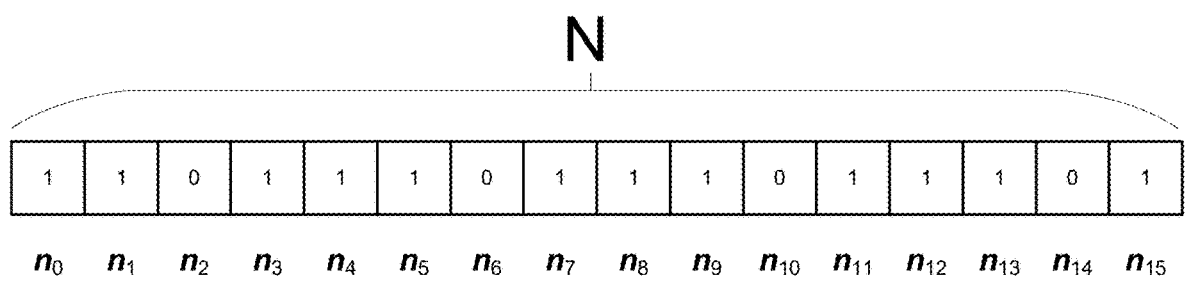
FIG. 16 illustrates the result for each of the bits $n_0$ through $n_{15}$.

FIG. 16 illustrates the result for each of the bits $n_0$ through $n_{15}$. As can be seen from the values of the bits $n_0$-$n_{15}$, the ones and the zeros have been evenly distributed over the 16 bits of the δ-sequence N. For each bit that is equal to zero, there are three bits that are ones.

Figure 17:
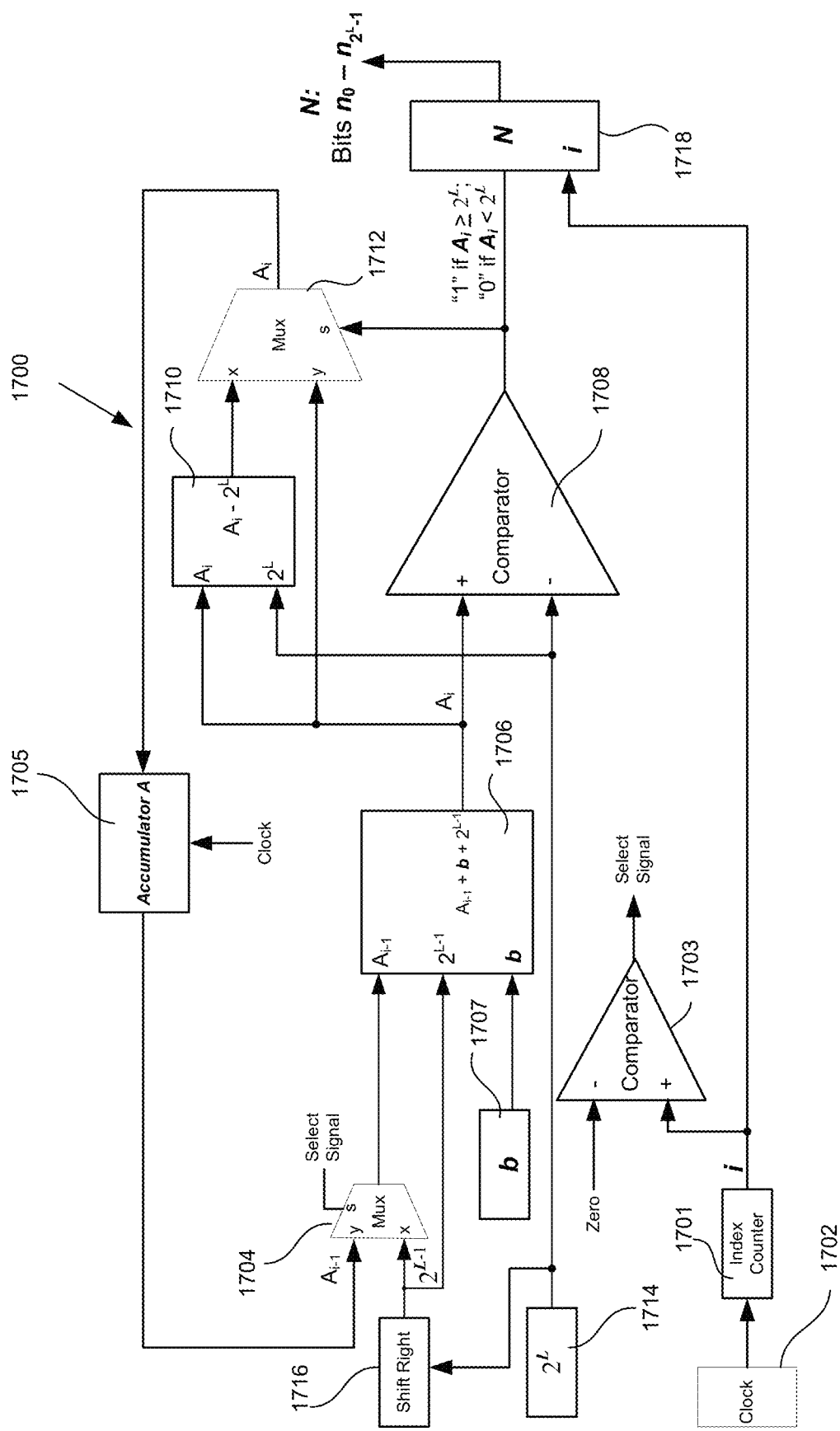
FIG. 17 is an illustration of one embodiment for implementing the δ-sequence.

FIG. 17 is an illustration of one embodiment for implementing the 6-sequence 1700. Initially, a bit index counter 1701 is initialized to a count of i=0. A clock 1702 coupled to the bit index counter 1701 increments the bit index counter 1701 to a terminal value of $2^L$−1, at which point the bit index counter 1701 wraps around to zero (i.e., modulo $2^L$). The output of the bit index counter 1701 is coupled to the input of a comparator 1703. The comparator 1703 generates a select signal by comparing the index value i output from the bit index counter 1701 to zero. If i=zero, the select signal is one; otherwise, the select signal is zero. The select signal is coupled to a first select input to a multiplexer 1704 that selects between coupling a second $2^L$−1 input and a third b input to an output of an $A_{i-1}$ input to the multiplexer 1704. In accordance with some embodiments of the disclosed method and apparatus, the $2^L$−1 input is coupled a register 1714 that holds the value $2^L$-1. The output of the register 1714 is coupled to the input of a right shift register 1716. In such embodiments, the value $2^L$−1 is derived by performing a right shift of the output of the register 1714. Alternatively, a register (not shown) stores the value $2^L$-1.

The $A_{i-1}$ input to the multiplexer 1704 is coupled to the output of an Accumulator A 1705. A memory register 1707 in which the value b is stored provides the value b to be converted from a two's complement binary representation to a BSBS sequence to the b input of a summing circuit 1706.

The output of the summing circuit 1706 is the sum of the three outputs $A_{i-1}+b+2^{L-1}$ that is equal to an intermediate value of $A_i$. Note that when the index value i is equal to zero, an initialization value of $2^{L-1}$ is used in this sum rather than the value stored in Accumulator A 1705. That is, by selecting an initialization value rather than the value of the Accumulator A 1705, the value at which the process starts is initialized to $2^{L-1}+b+2^{L-1}=2^L+b$ (see STEP 1001 in flowchart of FIG. 10).

The intermediate value of $A_i$ is coupled to three different inputs. The first of these inputs is a positive input to a comparator 1708. The second is an input to a difference circuit 1710. The third is an input to a multiplexer 1712. The negative input to the comparator 1708 is coupled to the register 1714 in which the value $2^L$ is stored. If the positive input is greater than the negative input, then the output of the comparator 1708 is a one. That is, if the sum $A_i=A_{i-1}+b+2^{L-1}$ produced by the summing circuit 1706 is greater than $2^L$ then the comparator outputs a "1". Otherwise, the comparator outputs a "0".

The output of the comparator 1708 is coupled to the select input of the multiplexer 1712. When the comparator outputs a "1", the multiplexer 1708 couples the "x" input to the output of the multiplexer 1708. The "x" input to the multiplexer 1708 is coupled to the output of the difference circuit 1710. The difference circuit 1710 outputs the difference between $2^L$ and the intermediate value of $A_i$. When the comparator 1708 outputs a "0", the multiplexer 1710 couples the intermediate value of $A_i$ to the output of the multiplexer 1710. The output of the multiplexer 1712 is coupled to the input of the accumulator A 1705. A clock, which may either be the clock that increments the bit index counter 1701 or a clock derived from that clock, determines when the value $A_i$ should be updated.

Accordingly, when the intermediate value of $A_i$, which is the sum $A_{i-1}+b+2^{L-1}$ is greater than $2^L$ (see STEP 1003), the multiplexer 1712 sets the value of $A_i$ equal to the intermediate value of $A_i$ (see STEP 1011) minus $2^L$ (see STEP 1005). Alternatively, when the intermediate value of $A_i$ (i.e., the sum $A_{i-1}+b+2^{L-1}$) is less than, or equal to $2^L$, the multiplexer 1712 maintains the value of $A_i$ to be equal to the intermediate value of $A_i$ output from the summing circuit 1706 (see STEP 1011).

The output of the comparator 1708 is also coupled to the input to an N register 1718 that holds the values of each of the bits $n_i$ of the δ-sequence N. The index i is used to save the bits $n_i$ of the δ-sequence in distinct bit locations associated with the value of the index i. It should be noted that the δ-sequence generator 1700 comprises very simple circuit element, such as a bit index counter 1701, a summing circuit 1706, a difference circuit 1710, 2 comparators 1703, 1708, 2 multiplexers 1704, 1712, a shift register 1716 and four registers 1705, 1707, 1714, 1718.

A BSBS sequence generated using a δ-sequence has several properties of interest. The first of these properties is that the maximum error for the δ-sequence is less than 1/T. That is, converting a binary value to a BSBS sequence, and then converting the BSBS sequence back to a binary number will result in an error that is less than 1/T, where T is the length of the δ-sequence. Another property of a BSBS sequence generated with an δ-sequence is that it can be generated without the use of a random number generator. Yet another property of a BSBS that has been generated with an δ-sequence is that the BSBS sequence will have the maximum number of transitions possible (state changes between one and zero). However, an accurate product cannot be obtained when multiplying a BSBS sequence that has been generated using a δ-sequence generator with another BSBS sequence that has been generated using a δ-sequence. Neither can an accurate product be attained when multiplying a BSBS sequence that has been generated using a δ-sequence with a time-shifted version of itself. Nonetheless, a BSBS sequence that has been generated using an w-sequence (i.e., a sequence in which the "1"s are all grouped together and the "0"s are all grouped together) can be multiplied with a BSBS sequence that has been generated using a δ-sequence.

Multiphase δ-Sequence Generator

In some embodiments, the δ-sequence generator is implemented as a multi-phase δ-sequence generator. A multi-phase δ-sequence generator is a δ-sequence generator in which more than one δ-sequence is generated concurrently. Each of the δ-sequences, $N_p$ represents the same binary value b, but is "offset in phase" from the other δ-sequences that are concurrently generated. A second sequence, $N_1$ is considered to be offset in phase from a first sequence, $N_0$ when the bits generated for the second sequence are the same as those generated for the first sequence, but are shifted in location along the sequence. Accordingly, bits $n_{0,i}$ of the first sequence $N_0$ have the same value as bits $n_{1,i-4}$ of the second sequence $N_1$.

Figure 18:
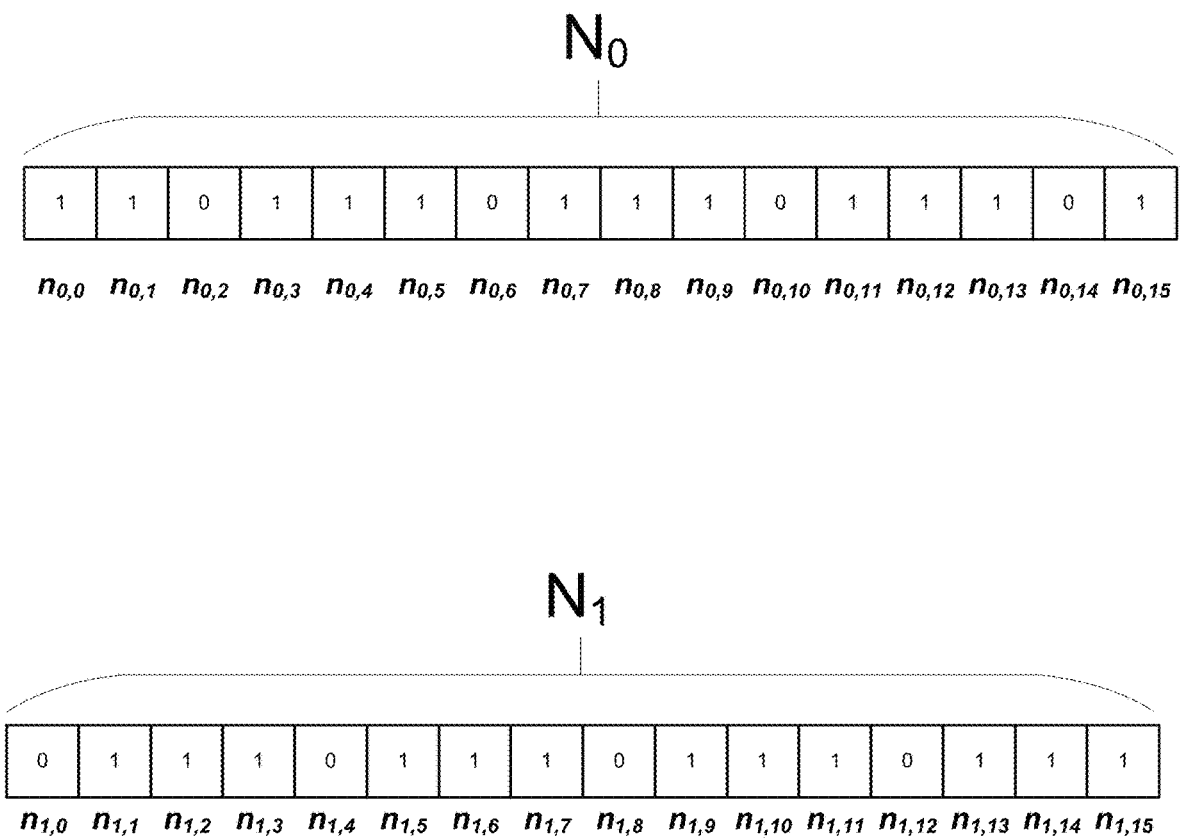
FIG. 18 is an illustration of a first sequence $N_0$ and a second sequence $N_1$, in which the second sequence $N_1$ is offset from the first sequence $N_0$ by two bit positions.

FIG. 18 is an illustration of a first sequence $N_0$ and a second sequence $N_1$, in which the second sequence $N_1$ is offset from the first sequence $N_0$ by two bit-positions. Accordingly, it can be seen that each bit $n_{0,i}$ of the first sequence $N_0$ has the same value as the bit $n_{1,i-2}$ of the second sequence $N_1$. For example, the bit $n_{0,2}$ has the same value as the bit $n_{1,0}$. The bit $n_{0,3}$ has the same value as the bit $n_{1,1}$. The bit $n_{0,4}$ has the same value as the bit $n_{1,2}$. The bit $n_{0,5}$ has the same value as the bit $n_{1,3}$. And so on.

Two new variables, in addition to the variables defined for the δ-sequence generator above, are defined for the multi-phase δ-sequence. The first new variable is m, indicating the total number of δ-sequences that will be generated (i.e., the number of "phases"). The second new variable is a phase index, p having a value from 0 to m−1 and indicating the particular phase at issue (not to be confused with p as used above to represent the probability that a bit in the sequence is a "1"). For ease in describing the disclosed method and apparatus, each δ-sequence is referred to as a "phase", $N_p$ that is generated in association with a phase index, p and has a string of bits $n_{p,i}$, where i is a bit index of the particular bit $n_{p,i}$ of the δ-sequence, Np. Accordingly, the $1^{st}$ bit ("Bit 0") of the first phase $N_0$ ("Phase 0") that is output from the generator is $n_{0,0}$, and the $5^{th}$ bit ("Bit 4") of the second phase $N_1$ ("Phase 1") that is output from the generator is $n_{1,4}$. FIG. 18 provides an example of the manner in which the bits of two phases are referenced.

Figure 19:
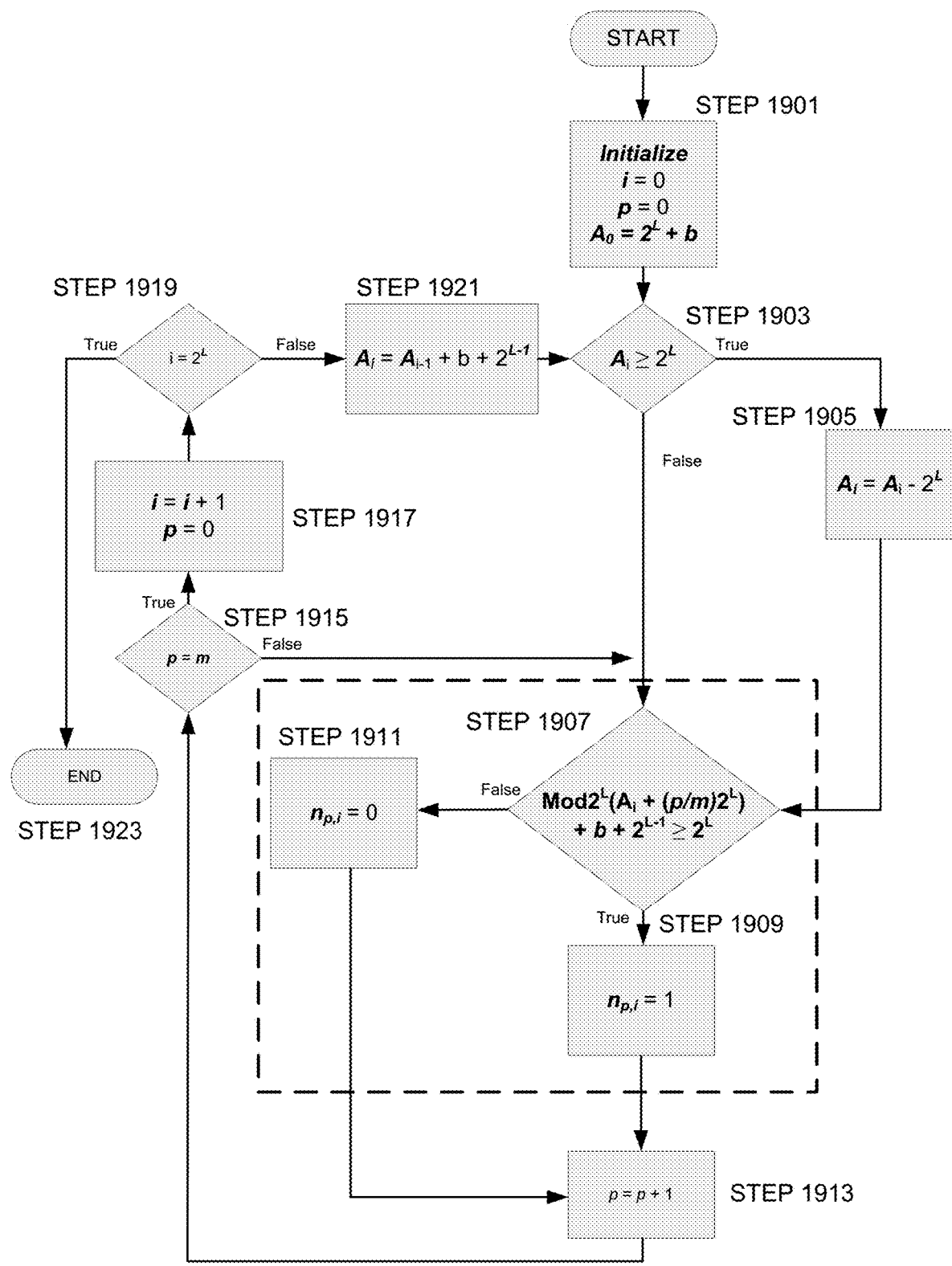
FIG. 19 is a flowchart of an embodiment of a multi-phase δ-sequence generator.

FIG. 19 is a flowchart of an embodiment of a multi-phase δ-sequence generator. The process for generating the δ-sequences starts with the initialization of the value of the bit index i, phase index p, and the value $A_i$ stored in a shared accumulator (STEP 1901). The bit index i and the phase index p are initialized to the value 0. The value $A_0$ of the accumulator is initialized to:

$$A_0 = 2^L + b. \quad \text{EQ. 1}$$

The same accumulator can be used to generate the δ-sequence for each phase of the multiple δ-sequence. After initializing the value $A_0$, the value is checked to see whether it is greater than $2^L$ or not. If greater (i.e., the result of STEP 1903 is true), the value of $A_0$ is reduced by $2^L$ (STEP 1905). If, on the other hand, the result is false, no reduction of the value of $A_0$ is required. In either case, a check is made (STEP 1907) to see whether the following logic statement is true:

$$\text{Mod } 2^L (A_i + (p2^L)/m) + b + 2^{L-1} >= 2^L \quad \text{EQ. 2}$$

In all cases, b is in a range from $-2^{L-1}$ to $2^{L-1}$, therefore, $b+2^{L-1}$ will be in the range of 0 to $2^L$. The comparison of STEP 1907 checks whether the modulo $2^L$ value of $A_i+(p\,2^L)/m)$ plus the value of $b+2^{L-1}$ is greater than or equal to $2^L$. This compare step is essentially the same as the compare performed in STEP 1011 (see FIG. 10) for the single phase δ-sequence generator, but with an offset to the value of the accumulator A that is dependent upon the value of the phase index, p. For the phase in which p is zero (the zero-phase offset, or the "baseline δ-sequence"), the offset is zero. That is, the offset factor $2^L/m$ is multiplied by the value of p=0 and the comparison in STEP 1907 essentially determines whether $Ai+b+2^{L-1}$ is greater than $2^L$, similar to the STEP 1011. For other values of p, the offset is a fraction of $2^L$ that is equal to $(p/m)2^L$. In one example that is discussed here, there are 4 phases (i.e., four δ-sequences) generated. In this example, m=4 and p is a value from 0 to 3. The first δ-sequence is the baseline with a zero phase offset, the second has phase offset that is equal to ¼ of the period, where the period is equal to $2^L$. The third δ-sequence has a ½ period phase offset, and the fourth has a ¾ period phase offset, where $2^L$ is the length of the period. If there are 8 phases (i.e., eight δ-sequences) generated, then m=8 and the first δ-sequence for which p=0 is the baseline (zero phase offset), the second δ-sequence for which p=1 is offset by $2^L$ times p/m=$2^L$ (1/8), the third δ-sequence for which p=2 is offset by $2^L$ times p/m=$2^L$ (2/8)=$2^L$(1/4), etc.

If the comparison in STEP 1907 is true, then the value of Bit 0, $n_{0,0}$ of Phase 0 is set to "1" (STEP 1909), and if false, the bit is set to "0" (STEP 1911). The phase index p is then incremented (STEP 1913). The value of the phase index p is checked to see whether Bit 0 in each phase has been determined (STEP 1913). If not, state of Bit 0 of the next phase is set depending upon whether the comparison in STEP 1907 is true or false. When the phase index p reaches m (STEP 1915), the first bit of each sequence will have been set. In an alternative embodiment, the phase index p roles over to zero on the next count after p=m−1. In some such embodiments, a comparison is made in STEP 1915 to determine whether p=0. The bit index i is then incremented and the phase index p is reset to zero (STEP 1917). The value of the bit index i is checked to see whether all of the bits of each phase have been generated (STEP 1919). If not, then the value of the shared accumulator A is incremented by $b+2^{L−1}$ (STEP 1921) and the process repeats from STEP 1903 to generate the next bit of each phase. If, however, the value of the bit index i is equal to $2^L$ (STEP 1919), then all of the bits for all of the phases have been generated. In that case, the process ends (STEP 1923). Similar to the phase index, the bit index i may role over to zero in the next count after i=$2^{L−1}$. In that case the bit index i is compared to zero to determine whether all of the bits have been generated.

Generation of Bit 0 (i.e., the First Bit)

Figure 20:
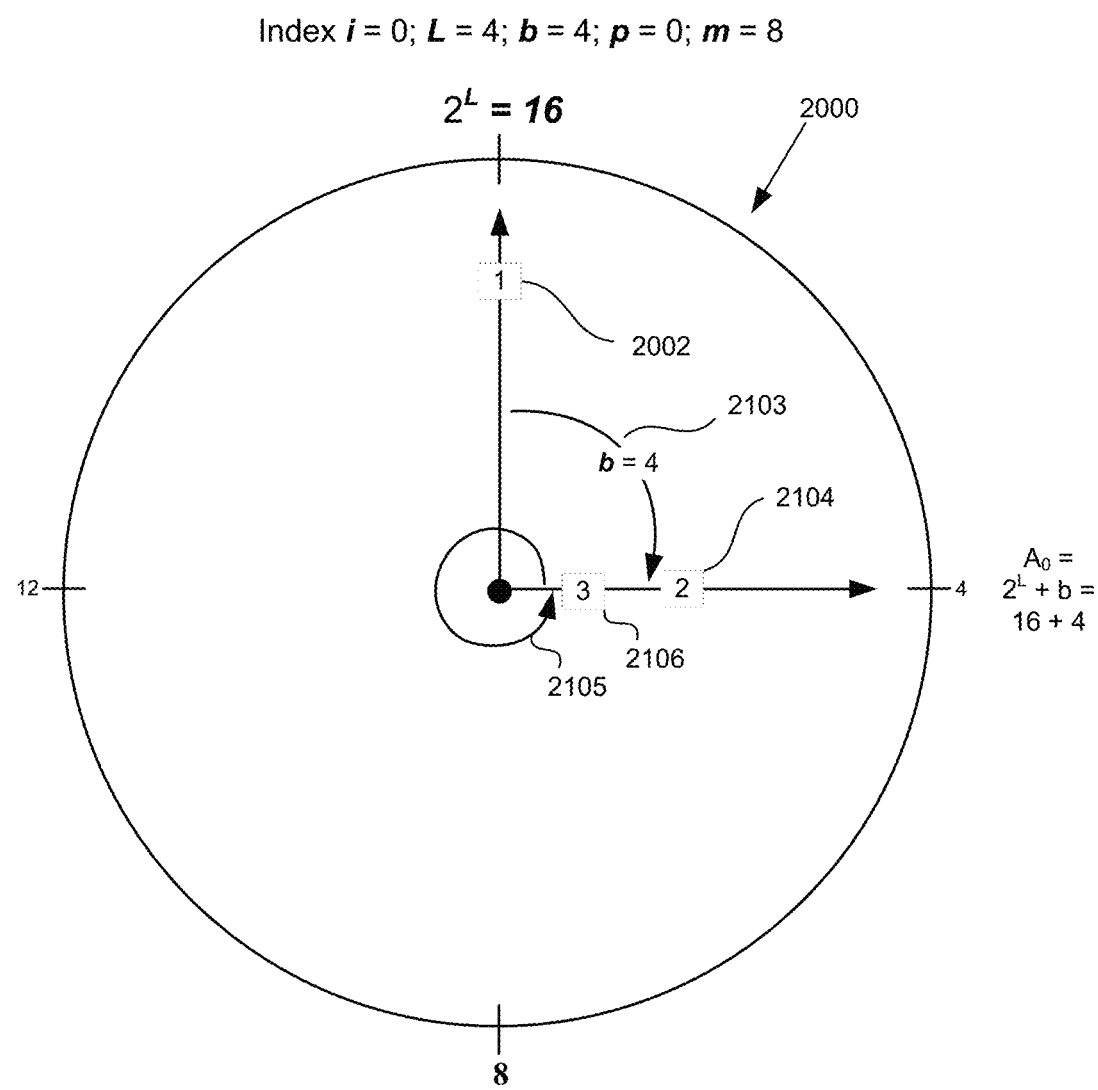
FIG. 20 is an illustration of a vector chart showing a vector circle and pointers providing a graphical representation of the values that are calculated in the first pass through STEP 1901 through STEP 1905 of FIG. 19 to initialize the value of the accumulator $A_i$ to a value of $A_0$.

FIG. 20 is an illustration of a vector chart showing a vector circle 2000 and pointers providing a graphical representation of the values that are calculated in the first pass through STEP 1901 through STEP 1905 to initialize the value of the accumulator $A_i$ to a value of $A_0$. In the example, the generator at issue is a 4-phase δ-sequence generator (i.e., where m=4, p=0 and i=0). In addition, in this example, each of the four SBS strings in each of the four phases ("Phase 0", "Phase 1", "Phase 2" and "Phase 3") to be generated represent a value b=4 and where the length (number of bits) L of the binary value b is 4.

Initially, a pointer 2002 points straight up at "12-o'clock" and represents the value $2^L$=16. A reference number "1" on the pointer 2002 indicates that the pointer 2002 is in position "1" in the process shown in FIG. 20. The pointer 2002 is rotated 90° clockwise, as indicated by the arrow 2003. This rotation illustrates the addition of the value b to attain the initial value of the accumulator $A_0$, and results in a pointer 2004 being located at position "2", indicated by the reference number "2" on the pointer 2004. That is, the pointer 2104 at position "2" represents the value $2^L$+b to which $A_0$ is initialized in STEP 1901:

$$A_0 = 2^L + b = 16 + 4 = 20 \qquad \text{EQ. 3}$$

Since the value of $A_0$ is greater than $2^L$ (STEP 1903), the value of the accumulator is reduced by $2^L$ (STEP 1905). Therefore:

$$A_0 = A_0 - 2^L = \qquad \text{EQ. 4}$$

$$A_0 = 20 - 16 = 4 \qquad \text{EQ. 5}$$

STEP 1903 and STEP 1905 ensure that the value $A_i$ of the accumulator remains in the range of 0 to $2^L$−1. This is illustrated by the pointer 2004 rotating counter-clockwise 360°, as indicated by arrow 2005, resulting in the pointer 2006 coming to rest at position "3" indicated by the reference number "3" on the pointer 2006. It can be seen that each time the value of the accumulator is altered (i.e., in STEP 1901 initially, and then in STEP 1921 as the process moves on), the value of the accumulator is checked to ensure the value is less than $2^L$ (STEP 1903 and STEP 1905). In some embodiments, this might be done simply by having the accumulator be a register that overflows at $2^L$ and rolls back to zero. Accordingly, the pointer 2006 represents the value $A_0$ of the accumulator with the bit index i=0.

Generation of Bit 0, $n_{0,0}$ of the First Phase (i.e., Phase 0)

Figure 21:
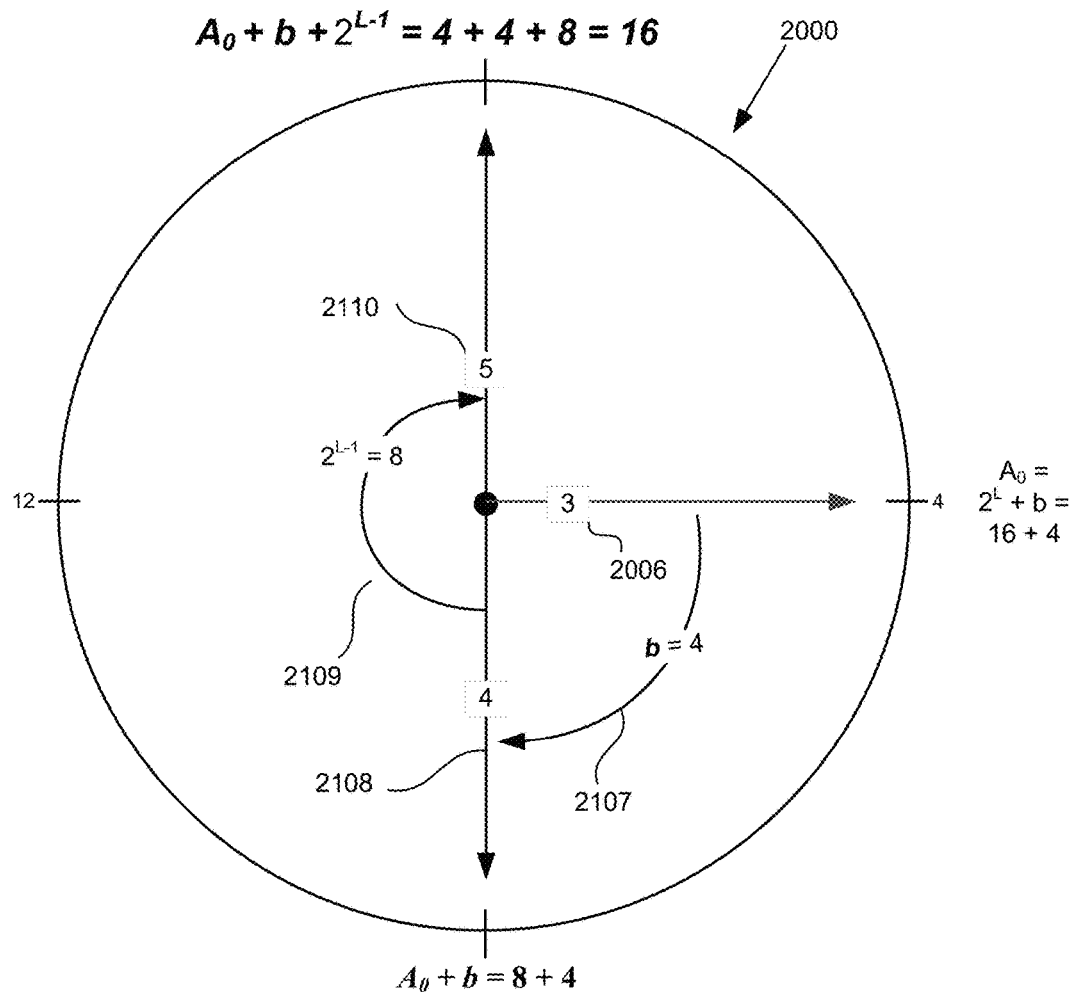
FIG. 21 illustrates STEP 1907 and STEP 1909 in which Bit 0, $n_{0,0}$ of Phase 0 is generated.

FIG. 21 illustrates STEP 1907 and STEP 1909 in which Bit 0, $n_{0,0}$ of Phase 0 is generated. The sum of STEP 1907 is calculated in EQ. 6:

$$\text{Mod } 2^L(A_0+(p/m)2^L)+b+2L^{−1}= \qquad \text{EQ. 6}$$

The first term (Mod $2^L(A_0+(p/m)2^L)$) of EQ. 2 represents the value of the accumulator plus a phase offset. Since this first term is operated on by the Modulo $2^L$ operator, the value will always be in the range of 0 to $2^L$. In the current example, first term resolves to a value of 4, as shown in EQ. 7 through EQ. 10 below. It can be seen that the phase offset (i.e., second term within the parenthesis of the Modulo 16 operation (i.e., $(p/m)2^L$)) is equal to zero for Phase 0 in which the phase index, p=0.

$$\text{Mod } 2^L(A_0+(p/m)2^L)= \qquad \text{EQ. 7}$$

$$\text{Mod } 2^L(4+(p/m)2^L)= \qquad \text{EQ. 8}$$

$$\text{Mod } 16((4)+(0/4)16)= \qquad \text{EQ. 9}$$

$$\text{Mod } 16(4)=4. \qquad \text{EQ. 10}$$

The pointer 2006 is shown in red in FIG. 21 to highlight the reference pointer provided by the value $A_0$ held in the accumulator A plus the phase offset ($A_i$+(p/m)16). Adding the second term of EQ. 2 (the value of b=4) rotates the pointer 2106 from position "3" clockwise by 90° to pointer 2108 at position "4", as indicated by arrow 2107. Adding another 8 (i.e., the value of $2^{L−1}$, the third term of EQ. 2), rotates the pointer 2108 to pointer 2110 at position "5", as indicated by the arrow 2109. The pointer 2110 represents the value that is compared in STEP 1907 to the value of $2^L$. That is, the pointer 2110 represents a value of:

$$\text{Mod } 16(A_0+(p/m)2^L)+b+2^{L−1}= \qquad \text{EQ. 11}$$

$$\text{Mod } 16(4+(0/4)16)+4+8= \qquad \text{EQ. 12}$$

$$\text{Mod } 16(4)+4+8= \qquad \text{EQ. 13}$$

$$4+4+8=16. \qquad \text{EQ. 14}$$

Since the result of the compare in STEP 1907 is true (i.e., the pointer 2110 has rotated up to at least the top of the vector circle 2000), Bit 0 of Phase 0 $n_{0,0}$ is set to 1 (STEP 1909). The phase index, p is then incremented by 1 (STEP 1913) and the value of the phase index p is checked to see whether Bit 0 of each phase has been generated (STEP 1915).

Generation of Bit 0, $n_{1,0}$ of Phase 1

Since only Bit 0 $n_{0,0}$ of Phase 0 has been generated, the process moves on to generate Bit 0, $n_{1,0}$ of Phase 1 by performing the compare in STEP 1907. Once again, the sum of EQ. 11 is calculated, but with the value of p incremented to a value of 1 (STEP 1915). The value of $A_0$ remains the same (i.e., $A_0$=4). Accordingly, the value of the equation of STEP 1907 is calculated as:

$$\text{Mod } 16(4+(1/4)16)+4+8= \qquad \text{EQ. 15}$$

$$\text{Mod } 16(4+4)+4+8= \qquad \text{EQ. 16}$$

$$8+4+8=20. \qquad \text{EQ. 17}$$

Figure 22:
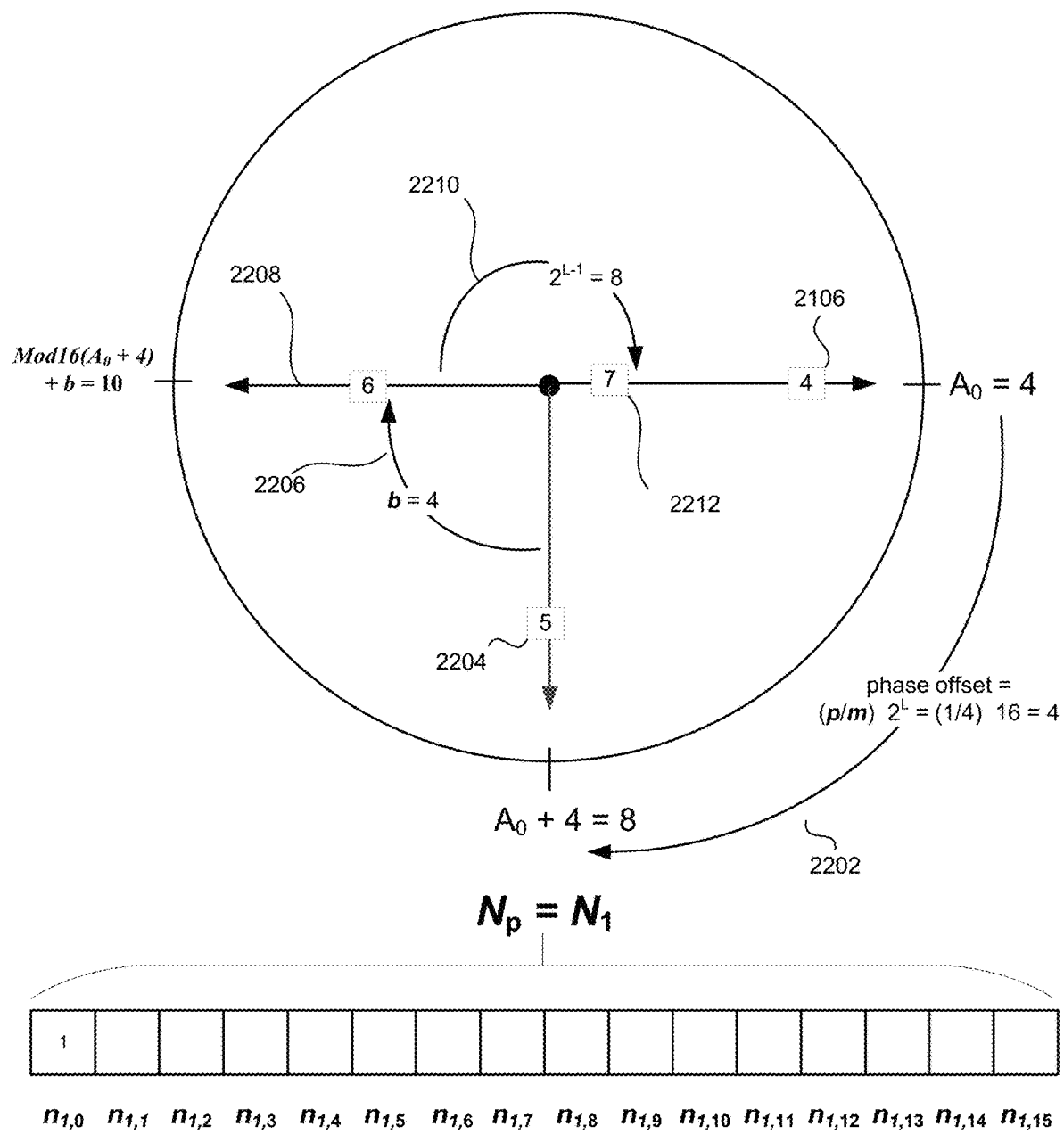
FIG. 22 is a graphical representation of the calculation of the sum in EQ. 11 for Bit 0, $n_{1,0}$ of Phase 1.

FIG. 22 is a graphical representation of the calculation of the sum in EQ. 11 for Bit 0, $n_{1,0}$ of Phase 1. Calculation of the sum is shown in detail in EQ. 15 through EQ. 17 above. It should be noted that the value of $A_0$ will not change as the sum of EQ. 17 is calculated, since the value of the accumulator A only changes after the bit index i is incremented (STEP 1917). Accordingly, the value of the accumulator A is updated in STEP 1921 after the ith bit of each phase has been determined and the bit index i has been incremented, assuming the terminal value i=$2^L$ has not yet been reached (STEP 1919).

As noted above, the value of $A_0$ is represented by the pointer 2106 at position "1". The value of the phase offset (shown within the parenthesis of the modulo 16 operation in EQ. 11) is added, as indicated by the arrow 2202 shown outside the phase circle 2000, resulting in the pointer 2204 at position "2". The arrow 2202 is shown outside the phase circle 2000 to distinguish it from the factors that are common to each phase, and to highlight the relative rotation that occurs by adding the phase offset. In addition, the pointer 2204 is red to further highlight the phase offset. The phase offset, $(p/m)2^L$, is shown in EQ. 16 to be equal to 4.

The next term of EQ. 11 (i.e., b) is added, as indicated by the arrow 2206, resulting in the pointer 2208 at position "3". Lastly, the final term of EQ. 11 (i.e., $2^L$) is added, as indicated by the arrow 2210, resulting in the pointer 2212 at position "4". As shown above in EQ. 17, the sum represented by the pointer 2212 is equal to 20.

Since 20 is greater than $2^L$, the result of the compare in STEP 1907 is true for Bit 0, $n_{1,0}$ of Phase 1. Accordingly, Bit 0" $n_{1,0}$ of Phase 1 is set to "1". It can be seen that the positions 2, 3, and 4 of the pointers 2204, 2208, 2212 are each offset by 4 (i.e., 90° or ¼ of the way around the vector circle) with respect to the positions, 3, 4, 5, respectively, of the pointers 2006, 2108, 2110 shown in FIG. 21.

The phase index, p is then incremented (STEP 1913) to a value of p=2 in order to determine the value of Bit 0, $n_{2,0}$ of the next phase, "Phase 2".

Generation of Bit 0, $n_{2,0}$ of Phase 2

Once again, the sum of EQ. 11 is calculated. However, the value of p is incremented to 2 (STEP 1913). Accordingly:

$$\text{Mod } 16(4+(2/4)16)+4+8= \qquad \text{EQ. 18}$$

$$\text{Mod } 16(4+8)+4+8= \qquad \text{EQ. 19}$$

$$8+8+8=24. \qquad \text{EQ. 20}$$

Figure 23:
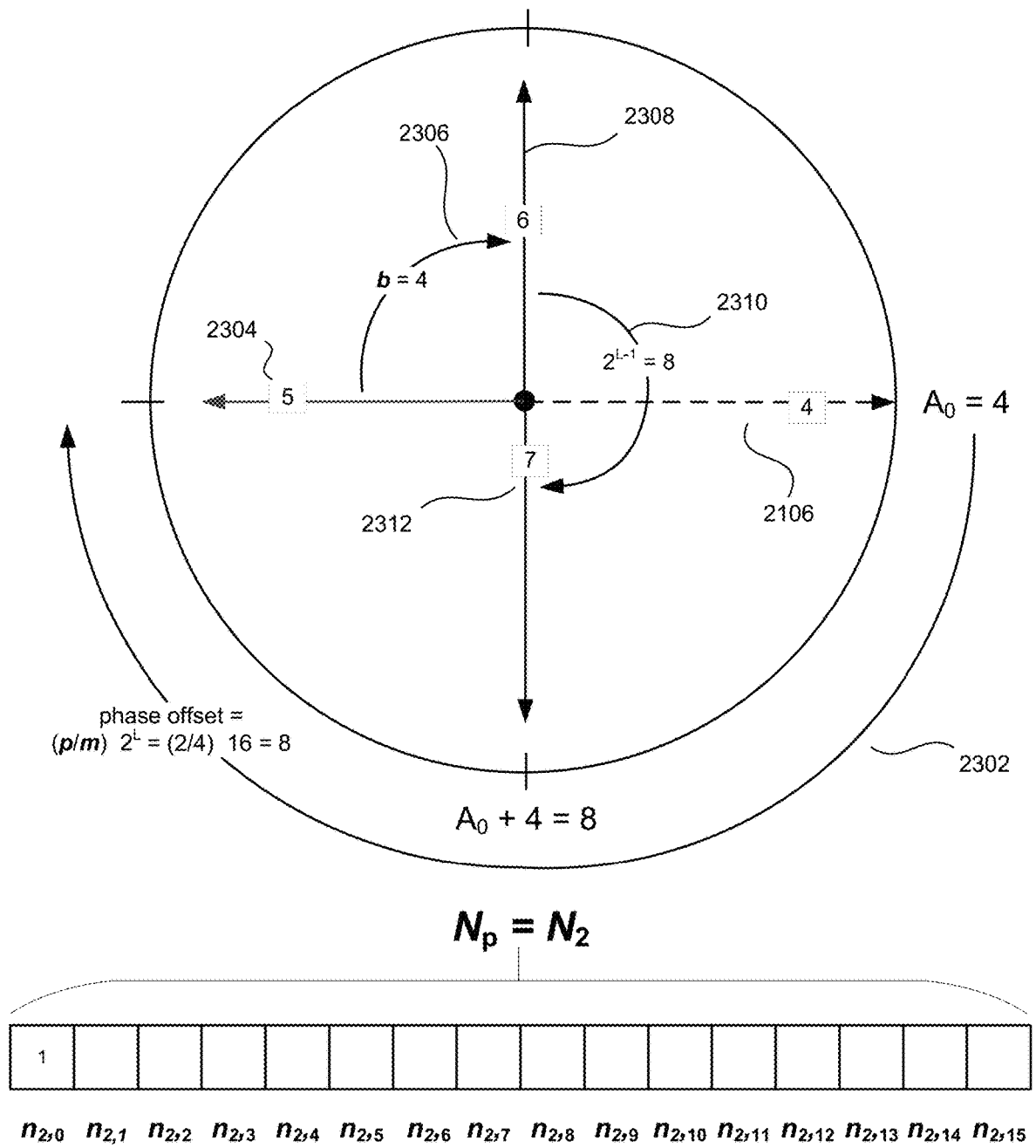
FIG. 23 is a graphical representation of the calculation of the sum in EQ. 18 for Bit 0, $n_{2,0}$ of Phase 2.

FIG. 23 is a graphical representation of the calculation of the sum in EQ. 18 for Bit 0, $n_{2,0}$ of Phase 2. It should be noted that the current value of $A_0$ (i.e., the value to be used in EQ. 18), remains equal to 4 as represented in FIG. 23 by the pointer 2106. It should be further noted that the value of $A_0$ will not change as the sum of EQ. 20 is calculated, since this sum is merely used to determine whether Bit 0, $n_{1,0}$ of Phase 1 should be set to "1" or "0" (STEP 1907).

The value of the phase offset within the parenthesis of the modulo 16 operation in EQ. 11 is added to $A_0$, resulting in a clockwise 180° rotation to the pointer 2304 at position 2, as indicated by the arrow 2302. The phase offset, $(p/m)2^L$, is shown in EQ. 19 to be equal to 8. The next term of EQ. 11 (i.e., b) is added, as indicated by the arrow 2306, resulting in the pointer 2308 at position 3. Lastly, the final term of EQ. 11 (i.e., $2^L$) is added, as represented by the arrow 2310, resulting in the pointer 2312 at position 4. As shown above in EQ. 20, the sum represented by the pointer 2312 is equal to 24. Accordingly, the positions 2, 3, and 4 of the pointers 2304, 2308, 2312 are each offset by 4 (i.e., 90° or ¼ of the way around the vector circle) with respect to the positions, 2, 3, 4, respectively, of the pointers 2204, 2208, 2212 shown in FIG. 22.

Since 24 is greater than $2^L$, the result of the compare in STEP 1907 is true for Bit 0, $n_{2,0}$ of Phase 2. Accordingly, Bit 0, $n_{2,0}$ of Phase 2 is set to "1". The phase index, p is then incremented (STEP 1913) to a value of 3 in order to determine the value of Bit 0, $n_{3,0}$ of "Phase 3".

Generation of Bit 0, $n_{3,0}$ of Phase 3

Once again, the sum of EQ. 11 is calculated. However, the value of p is 3. Accordingly:

$$\text{Mod } 16(4+(3/4)16)+4+8= \qquad \text{EQ. 21}$$

$$\text{Mod } 16(4+12)+4+8= \qquad \text{EQ. 22}$$

$$0+4+8=12. \qquad \text{EQ. 23}$$

Figure 24:
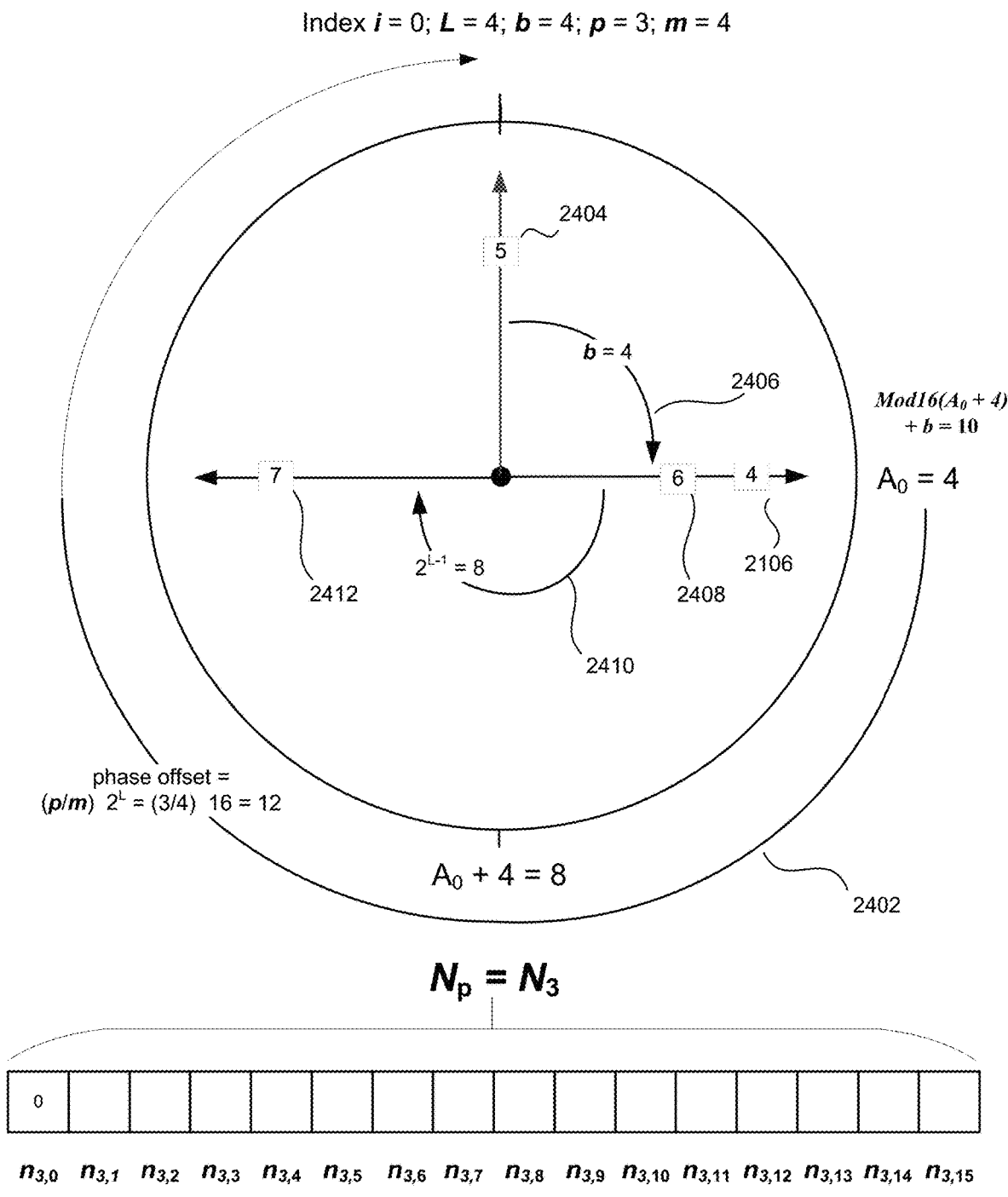
FIG. 24 is a graphical representation of the calculation of the sum in EQ. 21 for Bit 0, $n_{3,0}$ of Phase 3.

FIG. 24 is a graphical representation of the calculation of the sum in EQ. 21 for Bit 0, $n_{3,0}$ of Phase 3. As noted above, the value of $A_0$ remains equal to 4 as represented in FIG. 24 by the pointer 2106 at position "1". The value of the phase offset, as indicated by the arrow 2402, rotation that results in the pointer 2404 at position "2". The phase offset, $(p/m)2^L$, is shown in EQ. 22 to be equal to 12. The next term of EQ. 11 (i.e., b) is added, as indicated by the arrow 2406, resulting in the pointer 2408 at position "3". Lastly, the final term of EQ. 11 (i.e., $2^L$) is added, as represented by the arrow 2410, resulting in the pointer 2412 at position "4". As shown above in EQ. 23, the sum represented by the pointer 2412 is equal to 12. The pointers at positions "2", "3", and "4" are each offset by 12 (i.e., 90° or ¼ of the way around the vector circle) with respect to the positions, "2", "3", "4", respectively, of the pointers 2304, 2308, 2312 shown in FIG. 23.

Since the sum shown in EQ. 23 is equal to 12 and is therefore less than $2^L$, the result of the compare in STEP 1907 is false for Bit 0, $n_{3,0}$ of Phase 3. Accordingly, Bit 0, $n_{3,0}$ of Phase 3 is set to "0". The phase index, p is then incremented (STEP 1913) to a value of 4, indicating in STEP 1915 that the first bit of each of the four phases have now been set.

It can be seen that for each successive phase of the 4-phase δ-generator, the value represented by each of the pointers (except the first pointer that represents the value $A_0$ of the accumulator A), increases by 4 with respect to the similar pointer of the previous phase due to the value of the phase offset. This includes pointers representing the sum calculated in STEP 1907. This is illustrated by the relative rotation of each of the pointers by 90° in FIG. 21, FIG. 22, FIG. 23 and FIG. 24.

In STEP 1917, the bit index i is incremented from zero to 1 to begin generating the second bit of each of the four sequences.

Generation of "Bit 1" (i.e., the Second Bit)

Figure 25:
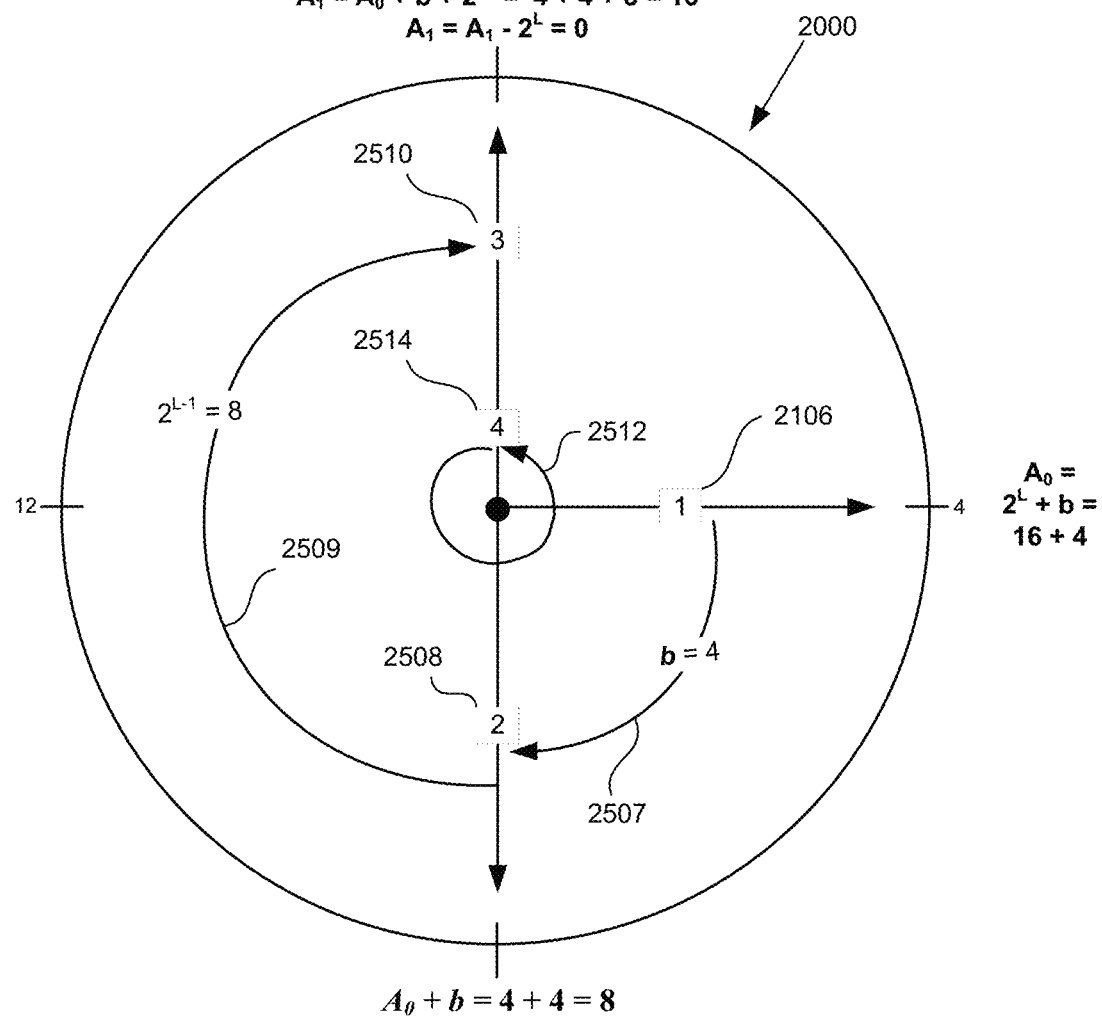
FIG. 25 illustrates the update of the value $A_i$ stored in the accumulator from $A_0$ to $A_1$.

FIG. 25 illustrates the update of the value $A_j$ stored in the accumulator from $A_0$ to $A_1$ (STEP 1921 and STEP 1905). EQ. 24 through EQ. 27 below show the calculation of $A_1$:

$$A_1 = A_0 + b + 2^{L-1} = \qquad \text{EQ. 24}$$

$$A_1 = 4+4+8=16 \qquad \text{EQ. 25}$$

$$A_1 = A_1 - 2^L =$$ EQ. 26

$$A_1 = 16 - 16 = 0$$ EQ. 27

The value b is added to $A_0$, as indicated by the arrow 2507 illustrating the rotation of the pointer 2106 from position "1" representing a value of 4, to position "2" of the pointer 2508 representing a value of 8. $2^{L-1}$ is then added, as illustrated by the arrow 2509 showing the pointer 2508 at position "2" rotating 180° clockwise to pointer 2510 at position "3". In some embodiments, the value $A_i$ stored in the accumulator should remain in the range of 0 to $2^{L-1}$ (i.e., between 0 and 15 in the example shown). Accordingly, if the value $A_1$ is equal or greater than $2^L$ (STEP 1903), it is reduced by $2^L$ (STEP 1905). The pointer 2510 at position "3" representing a value of 16 is rotated counter-clockwise by 360°, as indicated by arrow 2512, resulting in the pointer 2514 at position "4" (STEP 1905) representing a value of 0.

Generation of "Bit 1", $n_{0,1}$ of Phase 0

Figure 26:
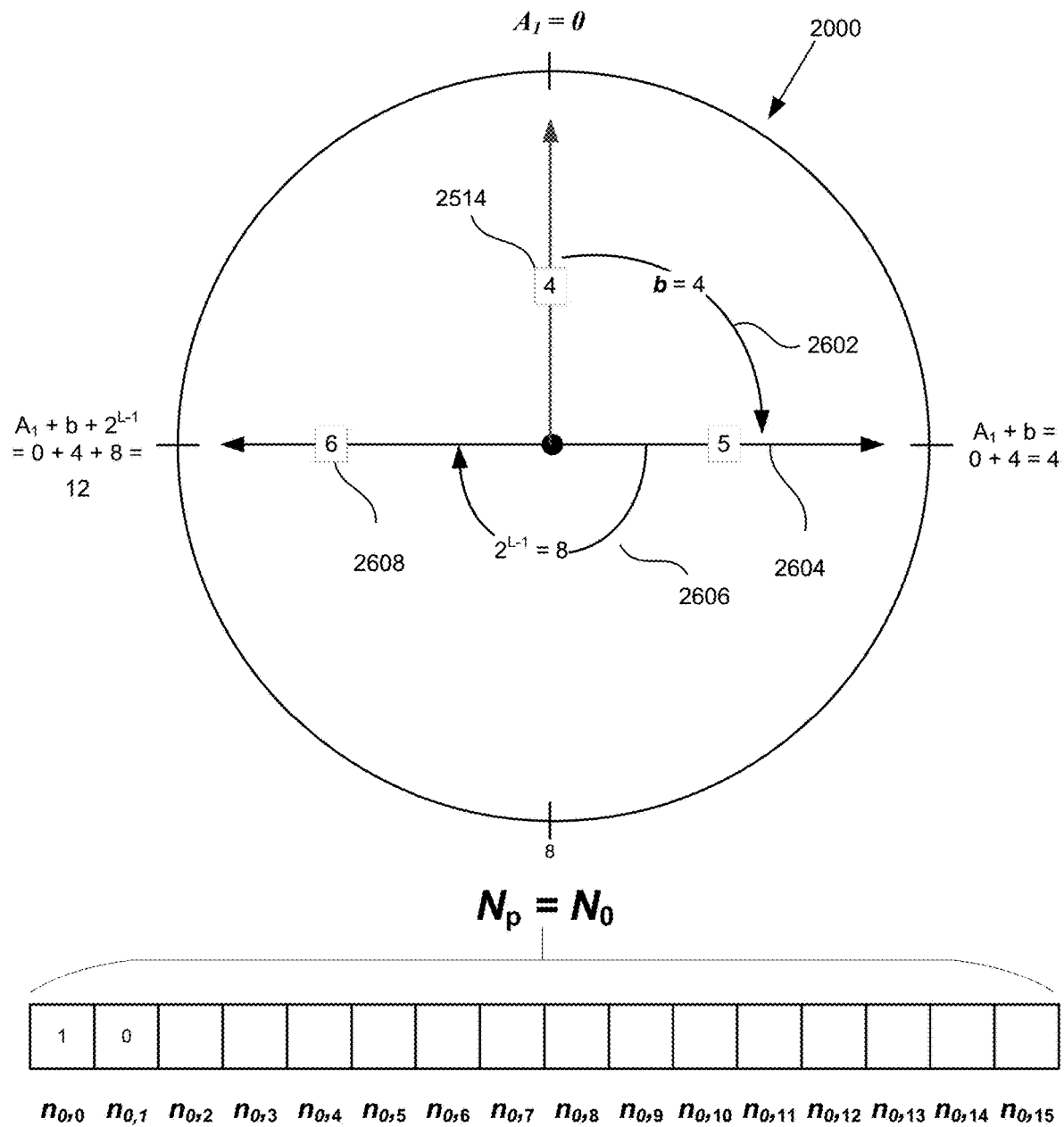
FIG. 26 is a graphical illustration of the process performed in STEP 1907 for a phase index value p=0 and a bit index value i=1.

FIG. 26 is a graphical illustration of the process performed in STEP 1907 for a phase index value p=0 and a bit index value i=1.

$$\text{Mod } 16(A_1 + (p/m)2^L) + b + 2^{L-1} =$$ EQ. 28

$$\text{Mod } 16(0 + (0/4)16) + 4 + 8 =$$ EQ. 29

$$\text{Mod } 16(0 + 0) + 4 + 8 =$$ EQ. 30

$$0 + 4 + 8 = 12$$ EQ. 31

The value $A_1$ can be seen from EQ. 27 to be equal to 0. A pointer 2514 at position "4" represents the value $A_1$. The pointer 2514 is rotated 90° clockwise by the addition of b, as illustrated by the arrow 2602, resulting in the pointer 2604 at position "5". The value $2^{L-1}$ is then added, resulting in a further 180° rotation of the pointer 2604, as illustrated by the arrow 2606 and resulting in the pointer 2608 at position "6" representing a value of 12. Since the sum of EQ. 33 represented by the pointer 2608 is less than 16 (i.e., $2^L$), Bit 1, $n_{0,1}$ of Phase 0 will be set to "0". That is, since the pointer 2514 representing the value $A_1$ did not rotate up to or past the top of the vector circle 2000 when summed with $b + 2^{L-1}$ in STEP 1907, the bit is set to "0".

Generation of Bit 1, $n_{1,1}$ of Phase 1

Figure 27:
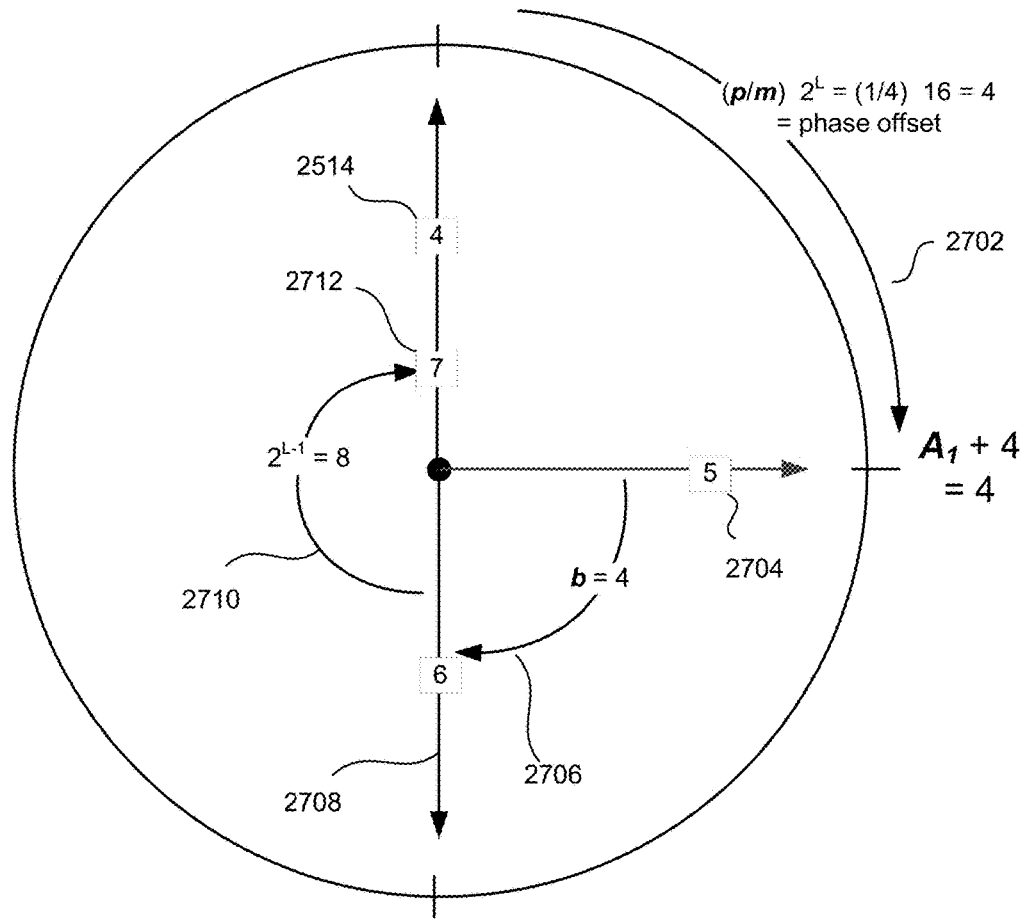
FIG. 27 is a graphical illustration of the process for a phase index value p=1 and a bit index value i=1 for generating Bit 1 of Phase 1.
Figure 27:
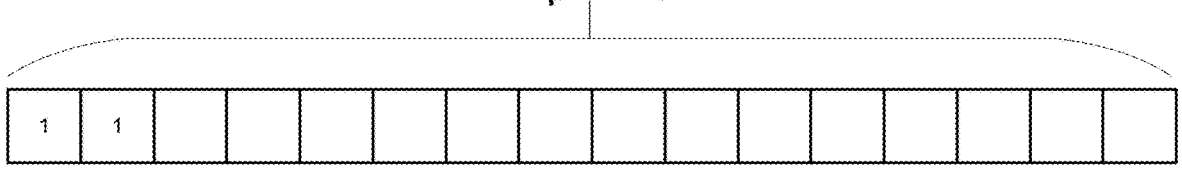

FIG. 27 is a graphical illustration of the process performed in STEP 1907 for a phase index value p=1 and a bit index value i=1 for generating Bit 1 of Phase 1. EQ. 32 through EQ. 35 show the details of the calculation performed in STEP 1907.

$$\text{Mod } 16(A_1 + (p/m)2^L) + b + 2^{L-1} =$$ EQ. 32

$$\text{Mod } 16(0 + (1/4)16) + 4 + 8 =$$ EQ. 33

$$\text{Mod } 16(0 + 4) + 4 + 8 =$$ EQ. 34

$$4 + 4 + 8 = 16$$ EQ. 35

As noted above in EQ. 27, the value $A_1 = 0$ and remains the same for each phase until the bit index i is incremented in STEP 1917 (i.e., upon all of the second bits of each phase being set). The pointer 2514 at position "4" represents the value $A_1$, similar to the case shown in FIG. 26. The pointer 2514 is rotated 90° by the addition of the phase offset (i.e., (p/m)16=4 for Phase 1, as can be seen in EQ. 33 above, and illustrated by arrow 2702, resulting in a pointer 2704 at position "5".

A further 90° clockwise rotation representing the addition of b, is shown by the arrow 2706, resulting in the pointer 2708 at position "6". The value $2^{L-1}$ s then added, as shown by the arrow 2710, resulting in a further 180° clockwise rotation of the pointer 2708, resulting in the pointer 2712 at position "7", representing a value of 16. Since the sum of EQ. 35 represented by the pointer 2712 is equal to 16 (i.e., $2^L$), Bit 1, $n_{1,1}$ of Phase 1 will be set to "1" (STEP 1909). That is, since the pointer 2514 representing the value $A_1$ rotated up to the top of the vector circle 2000 when rotating in response to the sum Mod 16 $(A_i + (p/m)16) + b + 2^{L-1}$ in STEP 1907, the bit is set to "1".

Generation of Bit 1, $n_{2,1}$ of Phase 2

Figure 28:
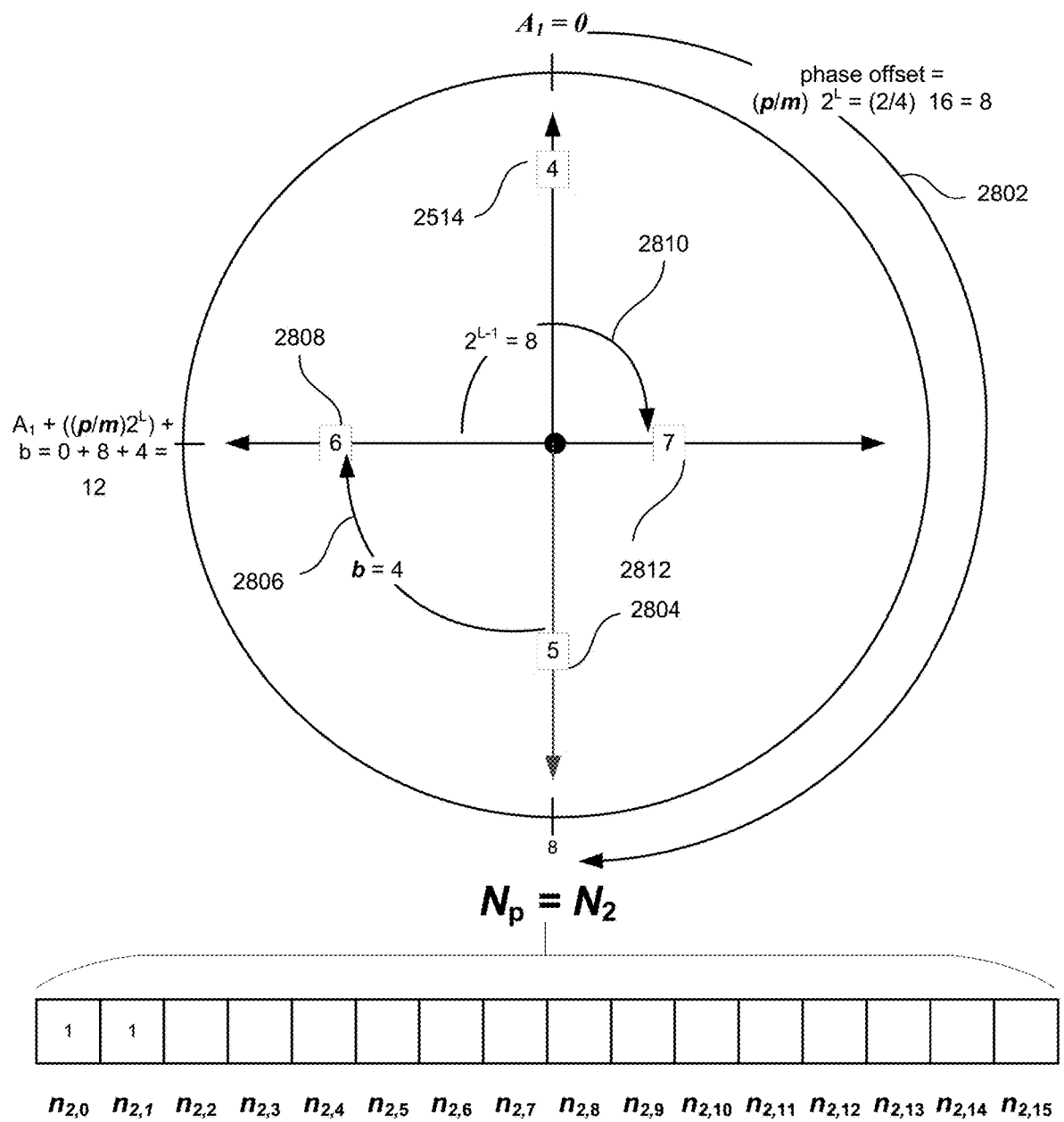
FIG. 28 is a graphical illustration of the process for a phase index value p=2 and a bit index value i=1.

FIG. 28 is a graphical illustration of the process performed in STEP 1907 for a phase index value p=2 and a bit index value i=1.

$$\text{Mod } 16(A_1 + (p/m)2^L) + b + 2^{L-1} =$$ EQ. 36

$$\text{Mod } 16(0 + (2/4)16) + 4 + 8 =$$ EQ. 37

$$\text{Mod } 16(0 + 8) + 4 + 8 =$$ EQ. 38

$$8 + 4 + 8 = 20$$ EQ. 39

As noted above, the value $A_1$ of the accumulator A remains equal to 0 represented by the pointer 2514 at position "4". The pointer 2514 is rotated clockwise 180° by the addition of the phase offset (i.e., (p/m)16)=8 for Phase 2, as can be seen in EQ. 37 above, and illustrated by arrow 2802, resulting in a pointer 2804 at position "5".

A further 90° clockwise rotation representing the addition of b, is shown by the arrow 2806, resulting in the pointer 2808 at position "6". The value $2^{L-1}$ is then added, by a further 180° clockwise rotation of the pointer 2808, as shown by the arrow 2810, resulting in the pointer 2812 at position "7", representing a value of 20. Since the sum of EQ. 49 represented by the pointer 2812 is greater than 16 (i.e., $2^L$), Bit 1, $n_{2,1}$ of Phase 2 will be set to "1". That is, since the pointer 2514 representing the value $A_1$ rotated past the top of the vector circle 2000 when rotating in response to the sum Mod 16 $(A_1 + (p/m)16) + b + 2^{L-1}$ in STEP 1907, the bit $n_{2,1}$ is set to "1".

Generation of Bit 1, $n_{3,1}$ of Phase 3

Figure 29:
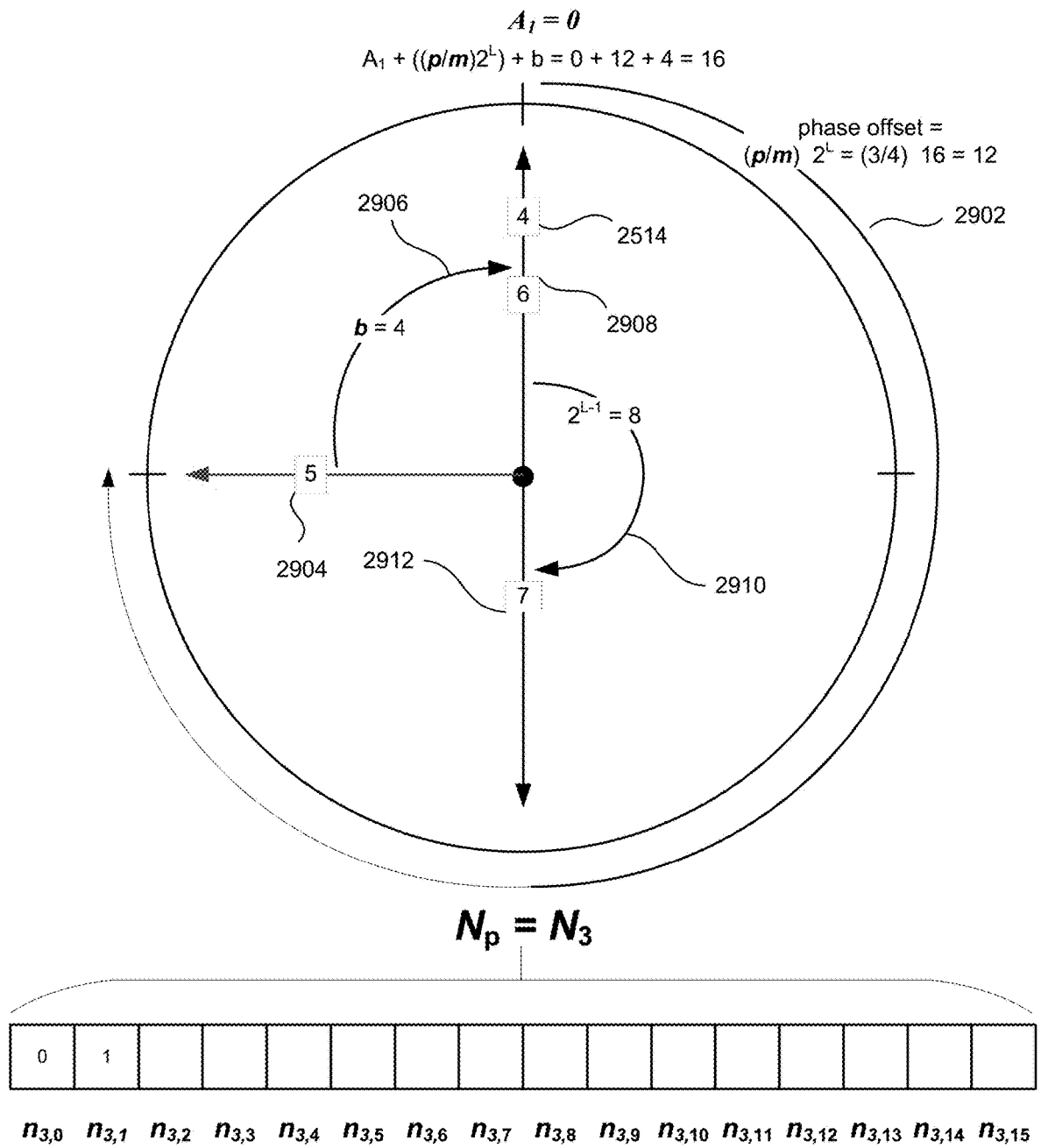
FIG. 29 is a graphical illustration of the process for a phase index value p=3 and a bit index value i=1.

FIG. 29 is a graphical illustration of the process performed in STEP 1907 for a phase index value p=3 and a bit index value i=1.

$$\text{Mod } 16(A_1 + (p/m)2^L) + b + 2^{L-1} =$$ EQ. 40

$$\text{Mod } 16(0 + (3/4)16) + 4 + 8 =$$ EQ. 41

$$\text{Mod } 16(0 + 12) + 4 + 8 =$$ EQ. 42

$$12 + 4 + 8 = 24$$ EQ. 43

As noted above, the value $A_1$ of the accumulator A remains equal to 0 represented by the pointer 2514 at position "4". The pointer 2514 is rotated clockwise 270° by the addition of the phase offset (i.e., (p/m)16)=12 for Phase 3, as can be seen in EQ. 41 above, and illustrated by arrow 2902, resulting in a pointer 2904 at position "5".

A further 90° clockwise rotation representing the addition of b, is shown by the arrow 2906, resulting in the pointer 2908 at position "6". The value $2^{L-1}$ is then added, by a further 180° clockwise rotation of the pointer 2908, as shown by the arrow 2910, resulting in the pointer 2912 at position "7", representing a value of 24. Since the sum of EQ. 43 represented by the pointer 2912 is greater than 16 (i.e., $2^L$), Bit 1, $n_{3,1}$ of Phase 3 will be set to "1". That is, since the pointer 2514 representing the value $A_1$ rotated past the top of the vector circle 2000 when rotating in response to the sum Mod 16 $(A_1+(p/m)16)+b+2^{L-1}$ in STEP 1907, the bit $n_{3,1}$ is set to "1" (STEP 1909).

Next the value of p is incremented to a value of p=4 (STEP 1913). Accordingly, the comparison of STEP 1915 is true, indicating that Bit 1 has been set for all four phases. Therefore, the bit index i is incremented to i=2 and the phase index p is reset to p=0 (STEP 1917). The comparison in STEP 1919 is false, indicating that there are still more bits to be set, since the value of i has not yet reached $2^L$.

Generation of Bit 2 (the Third Bit)

Figure 30:
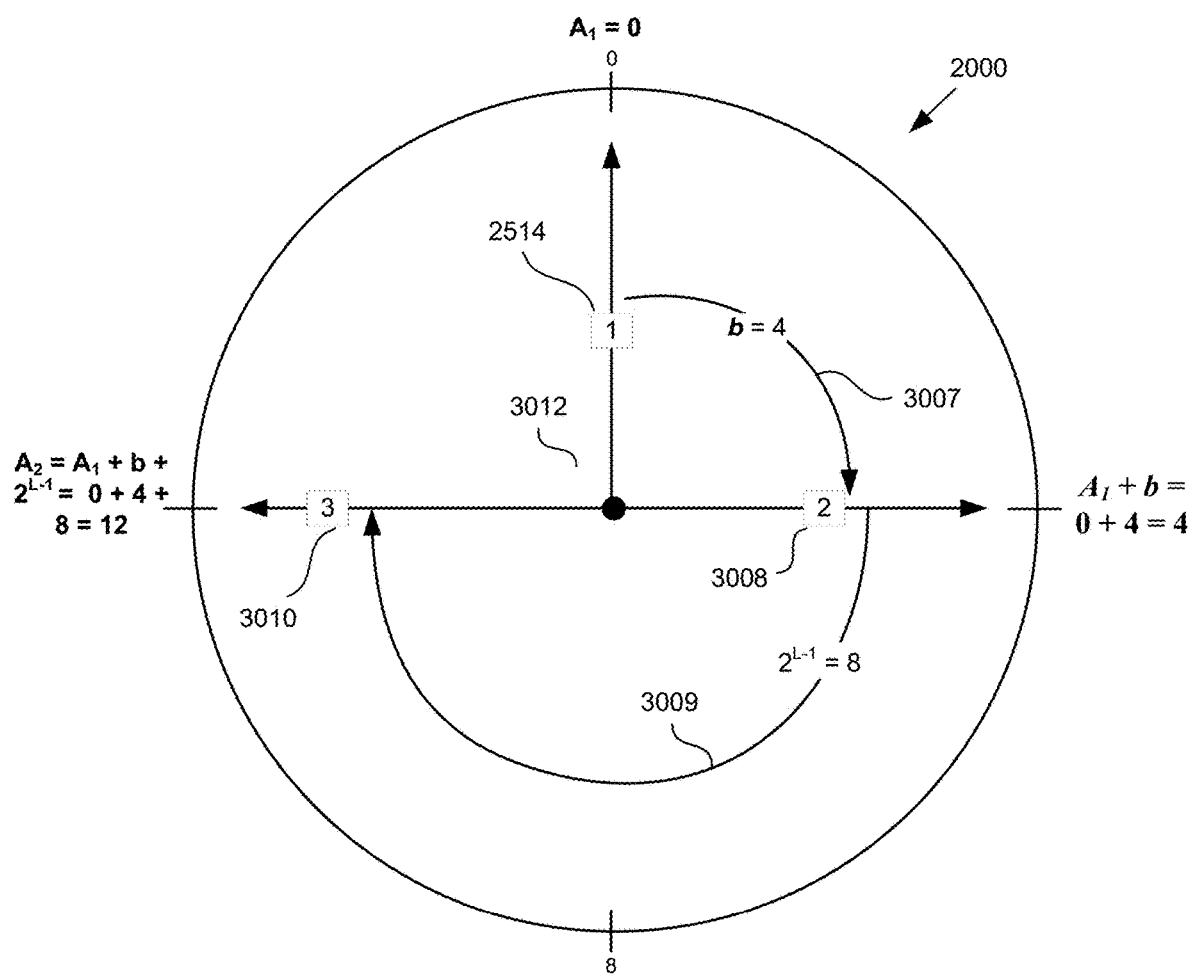
FIG. 30 illustrates the update of the accumulator A from $A_1$ to $A_2$ upon incrementing the bit index i to 2.

FIG. 30 illustrates the update of the accumulator A from $A_1$ to $A_2$ as performed by STEP 1921 upon incrementing the bit index i to 2. The update of the accumulators is shown in EQ. 44.

$$A_2 = A_1 + b + 2^{L-1} \quad \text{EQ. 44}$$

In this step, the value of the accumulator is updated by adding the value b as shown by the arrow 3007 illustrating a 90° clockwise rotation of the pointer 2514 at position "4" (representing the previous value $A_1$ of the accumulator), resulting in the pointer 3008 at position "5" and adding the value $2^{L-1}$, as illustrated by the arrow 3009 showing the pointer 3008 at position "5" rotating to pointer 3010 at position "6" representing the new value $A_2=12$ of the accumulator A.

Generation of Bit 2, $n_{0,2}$ of Phase 0

Figure 31:
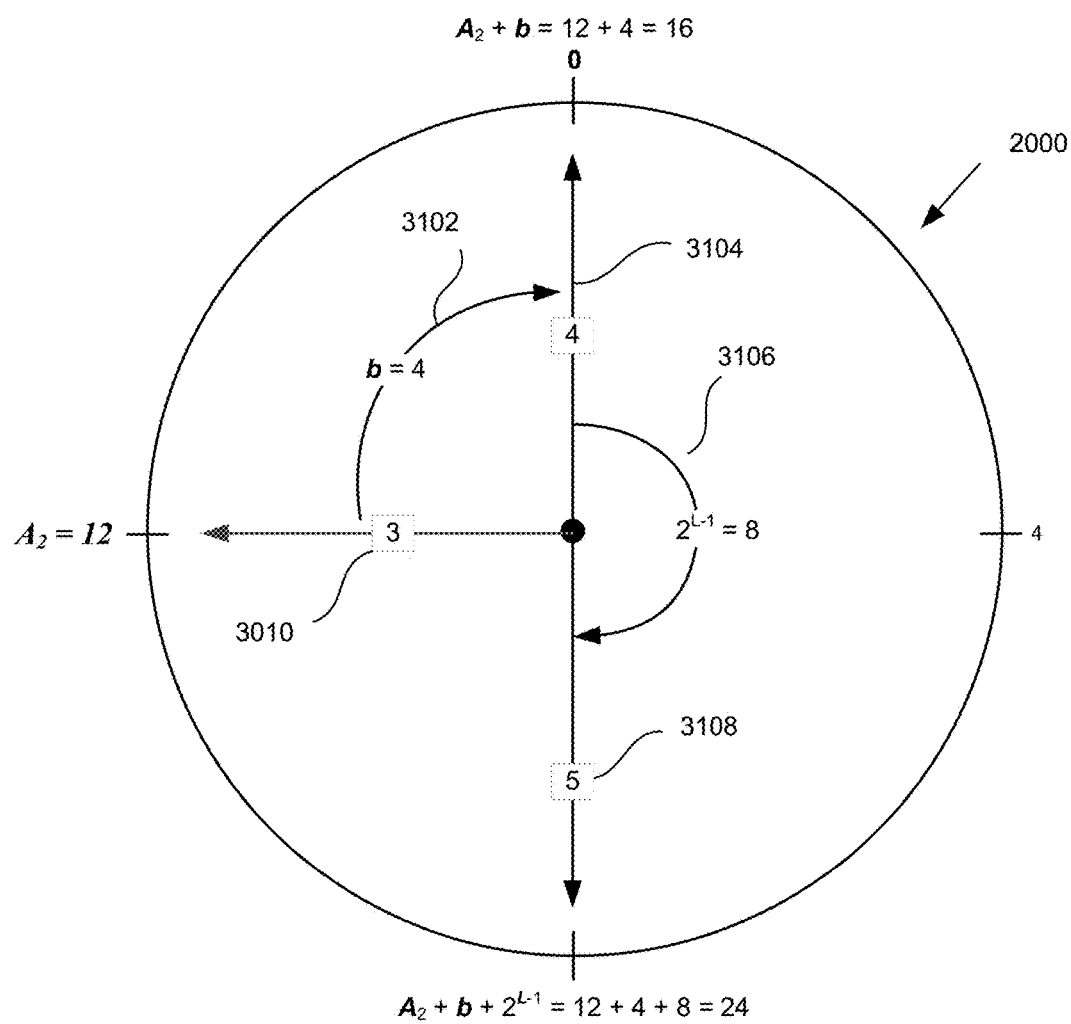
FIG. 31 is a graphical illustration of the process for a phase index value p=0 and a bit index value i=2.

FIG. 31 is a graphical illustration of the process performed in STEP 1907 for a phase index value p=0 and a bit index value i=2.

$$\text{Mod } 16(A_2+(p/m)2^L)+b+2^{L-1}= \quad \text{EQ. 45}$$

$$\text{Mod } 16(12+(0/4)16)+4+8= \quad \text{EQ. 46}$$

$$\text{Mod } 16(12+0)+4+8= \quad \text{EQ. 47}$$

$$12+4+8=24 \quad \text{EQ. 48}$$

A pointer 3010 at position "3" highlighted in red, represents the value $A_2$. The pointer 3010 is rotated 90° clockwise by the addition of b, as shown by the arrow 3102, resulting in the pointer 3104 at position "4". The value $2^{L-1}$ is then added, as shown by the arrow 3106, resulting in a further 180° rotation of the pointer 3104, resulting in the pointer 3108 at position "5", representing a value of 24. Since the sum of EQ. 48 represented by the pointer 3108 is greater than 16 (i.e., $2^L$), Bit 2, $n_{0,2}$ of Phase 0 will be set to "1". That is, since the pointer 3110 representing the value $A_2$ rotated past the top of the vector circle 2000 when summed with $b+2^{L-1}$ in STEP 1907, the bit $n_{0,2}$ is set to "1".

Generation of Bit 2, $n_{1,2}$ of Phase 1

Figure 32:
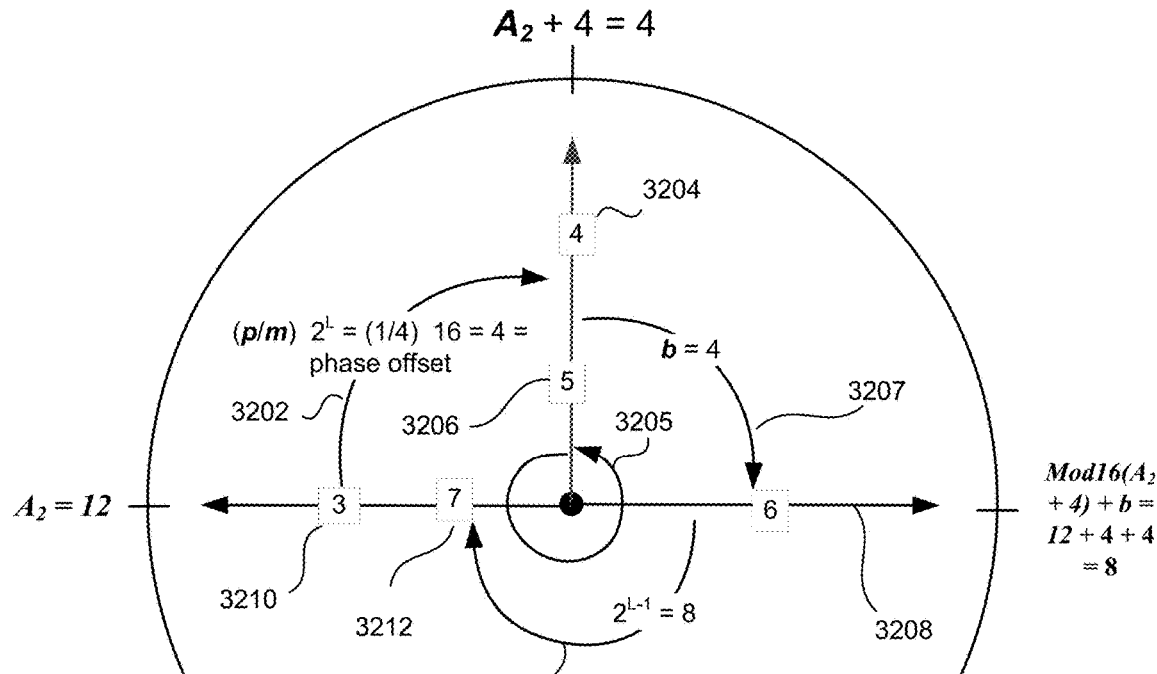
FIG. 32 is a graphical illustration of the process for a phase index value p=1 and a bit index value i=2.

FIG. 32 is a graphical illustration of the process performed in STEP 1907 for a phase index value p=1 and a bit index value i=2.

$$\text{Mod } 16(A_2+(p/m)2^L)+b+2^{L-1} \quad \text{EQ. 47}$$

$$\text{Mod } 16(12+(1/4)16)+4+8= \quad \text{EQ. 48}$$

$$\text{Mod } 16(12+4)+4+8= \quad \text{EQ. 49}$$

$$0+4+8=12 \quad \text{EQ. 50}$$

As noted above, the value $A_2$ of the accumulator A is 12 and remains the same for each phase until the bit index i is once again incremented in STEP 1917 (i.e., upon the third bit of each phase being set). The pointer 3010 at position "3" represents the value $A_2$, similar to FIG. 30. The pointer 3010 is rotated clockwise 90° by the addition of the phase offset (i.e., (p/m)16)=4 for Phase 1, as can be seen in EQ. 48 above, and illustrated by arrow 3202, resulting in a pointer 3204 at position "4" representing a value of 16. As can be seen from EQ. 49 and EQ. 50, the modulo 16 operator will cause a 360° counter-clockwise rotation of the pointer 3204 as illustrated by arrow 3205, resulting in a pointer 3206 at position "5" representing a value of 0.

A further 90° clockwise rotation representing the addition of b, is shown by the arrow 3207, resulting in the pointer 3208 at position "6". The value $2^{L-1}$ is then added, as shown by the arrow 3210, resulting in a further 180° clockwise rotation resulting in the pointer 3212 at position "7", representing a value of 12. Since the sum of EQ. 50 represented by the pointer 3212 is less than 16 (i.e., $2^L$), Bit 2, $n_{1,2}$ of Phase 1 will be set to "0". That is, since the pointer 3204 representing the value $A_2$ plus the phase offset did not rotate past the top of the vector circle 2000 when rotating in response to the sum Mod 16 $(A_2+(p/m)16)+b+2^{L-1}$ in STEP 1907, the bit is set to "0". It should be noted that the rotation caused by the offset ((p/m)16) is not included when determining whether the advance of the pointer caused the pointer to reach the top of the vector circle 2000. That is, it is only the rotation that occurs after the addition of the phase offset that determines whether the bit is set to a "1" or a "0".

Generation of Bit 2, $n_{2,2}$ of Phase 2

Figure 33:
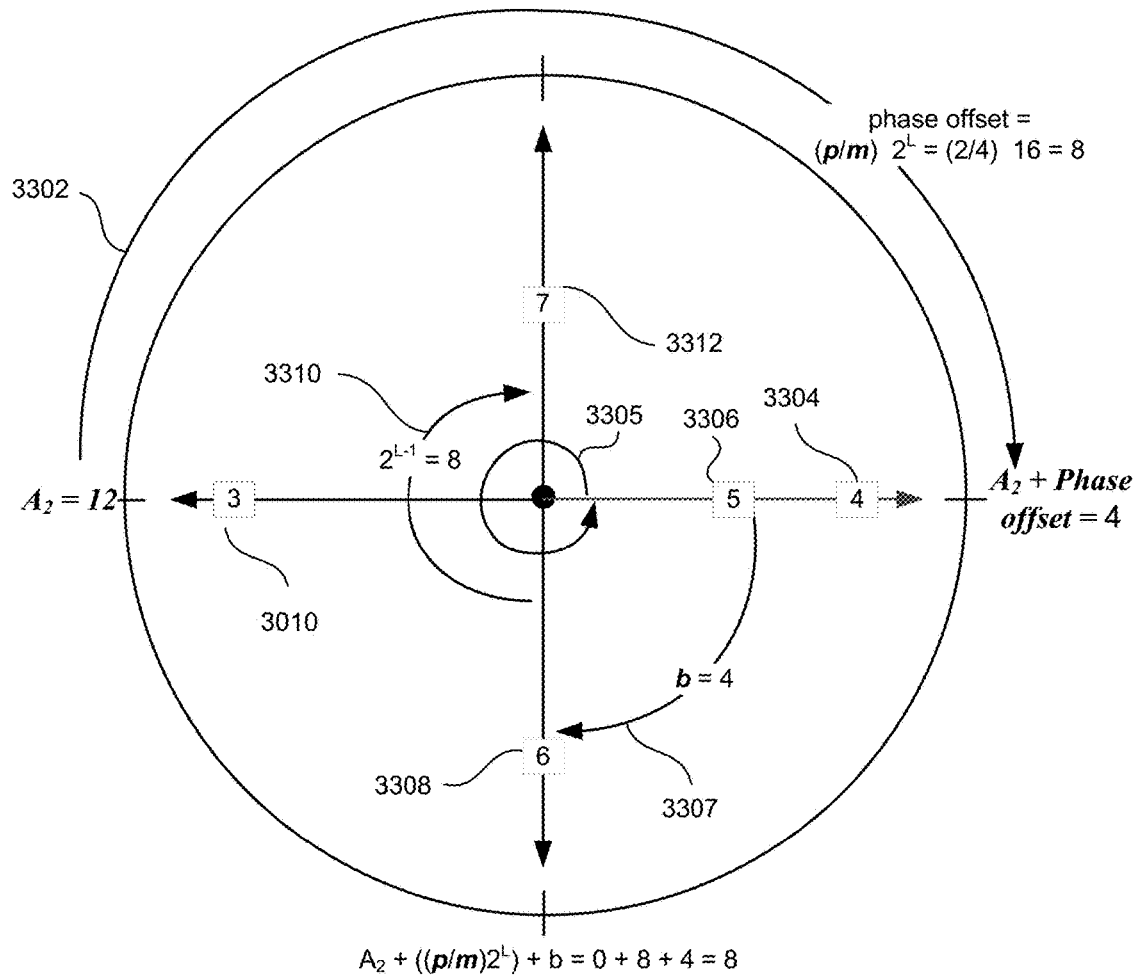
FIG. 33 is a graphical illustration of the process for a phase index value p=2 and a bit index value i=2.

FIG. 33 is a graphical illustration of the process performed in STEP 1907 for a phase index value p=2 and a bit index value i=2.

$$\text{Mod } 16(A_2+(p/m)2^L)+b+2^{L-1}= \quad \text{EQ. 51}$$

$$\text{Mod } 16(12+(2/4)16)+4+8= \quad \text{EQ. 52}$$

$$\text{Mod } 16(12+8)+4+8= \quad \text{EQ. 53}$$

$$4+4+8=16 \quad \text{EQ. 54}$$

As noted above, the value $A_2$ of the accumulator A remains equal to 12 and the pointer 3010 at position "3" represents the value $A_2=12$ The pointer 3010 is rotated clockwise 90° by the addition of the phase offset (i.e., (p/m)16)=4 for Phase 2, as can be seen in EQ. 52 above, and illustrated by arrow 3202, resulting in a pointer 3204 at position "4". Since the sum within the modulo 16 operator is equal to 20, the value after performing the modulo 16 operation is 4. Arrow 3305 illustrates the sum of $A_2$ with the phase offset being set to 4 by the modulo 16 operation, resulting in a pointer 3306 at position "5".

A 90° clockwise rotation representing the addition of b, is shown by the arrow 3307, resulting in the pointer 3308 at position "6" representing a value of 8. The value $2^{L-1}$ is then added, resulting in a further 180° clockwise rotation as shown by the arrow 3310, resulting in the pointer 3312 at position "7", representing a value of 16. Since the sum of EQ. 54 represented by the pointer 3212 is equal to 16 (i.e., $2^L$), Bit 2, $n_{2,2}$ of Phase 2 will be set to "1". That is, since the pointer 3306 representing the value $A_2$ plus the phase offset rotated up to the top of the vector circle 2000 when rotating in response to the sum Mod 16 $(A_2+(p/m)16)+b+2^{L-1}$ in STEP 1907, the bit is set to Generation of Bit 2, $n_{3,2}$ of Phase 3

Figure 34:
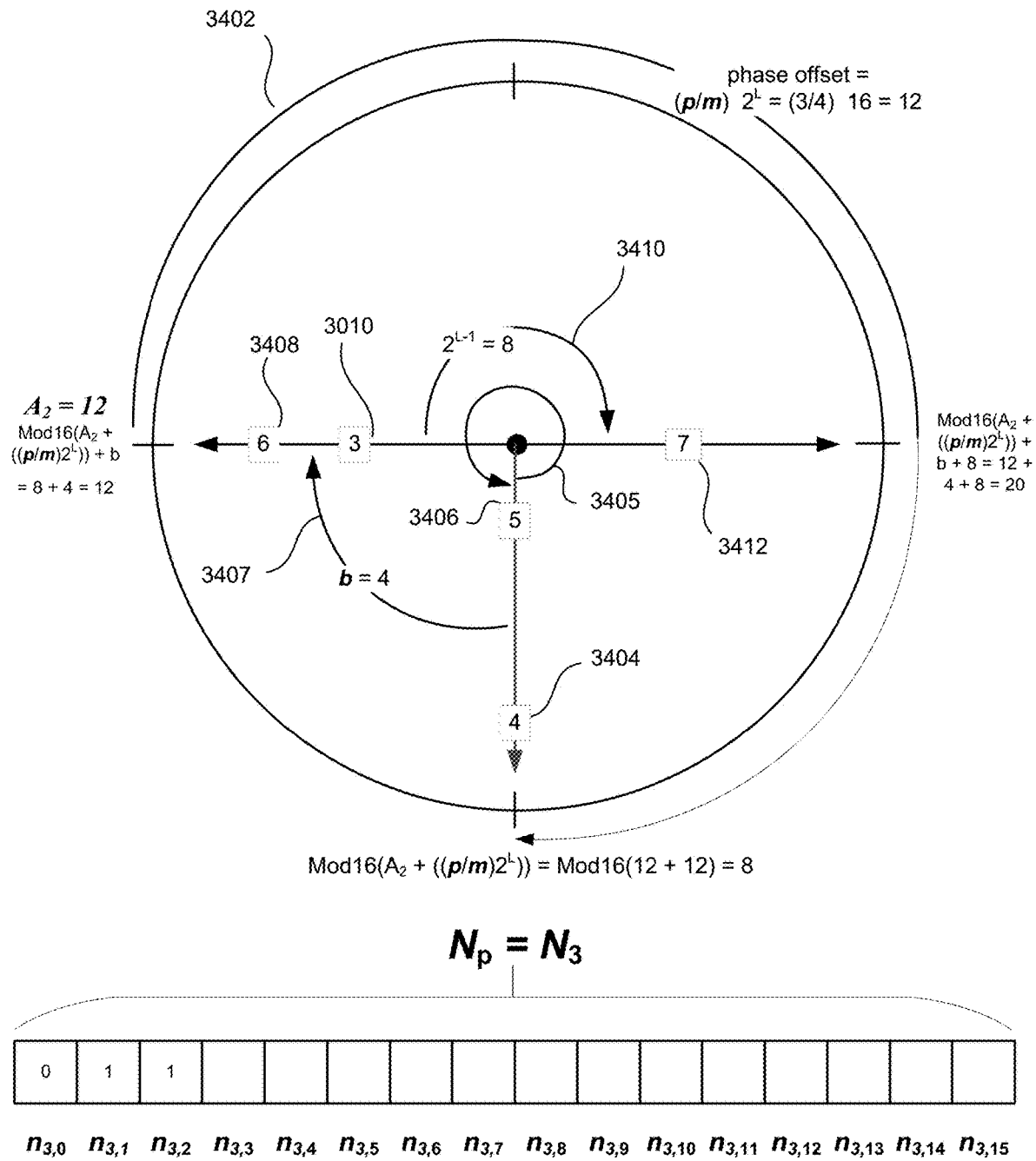
FIG. 34 is a graphical illustration of the process for a phase index value p=3 and a bit index value i=2.

FIG. 34 is a graphical illustration of the process performed in STEP 1907 for a phase index value p=3 and a bit index value i=2.

$$\text{Mod } 16(A_2+(p/m)2^L)+b+2^{L-1}= \quad \text{EQ. 55}$$

$$\text{Mod } 16(12+(3/4)16)+4+8= \quad \text{EQ. 56}$$

Mod 16(12+12)+4+8= $\quad$ EQ. 57

8+4+8=20 $\quad$ EQ. 58

As noted above, the value $A_2$ of the accumulator A remains equal to 12 represented by the pointer 3010 at position "3". The pointer 3010 is rotated clockwise 270° by the addition of the phase offset (i.e., (p/m)16)=12 for Phase 3, as can be seen in EQ. 57 above, and illustrated by arrow 3402, resulting in a pointer 3404 at position "4" representing a value of 24. However, because the sum of $A_2$ plus the phase offset is operated on by the modulo 16 operator, the pointer 3404 is rotated 360° counter-clockwise, as illustrated by arrow 3405, resulting in the pointer 3406 at position "5".

A further 90° clockwise rotation representing the addition of b, is shown by the arrow 3407, resulting in the pointer 3408 at position "6" representing a value of 12. The value $2^{L-1}$ is then added, causing a further 180° clockwise rotation of the pointer 3408, illustrated by the arrow 3410, resulting in the pointer 3412 at position "7", representing a value of 20. Since the sum of EQ. 58 represented by the pointer 3412 is greater than 16 (i.e., $2^L$), Bit 2, $n_{3,2}$ of Phase 3 will be set to "1". That is, since the pointer 3404 (highlighted in red) representing the value $A_2$ plus the phase offset rotated past the top of the vector circle 2000 when rotating in response to the sum Mod 16 $(A_2+(p/m)16)+b+2^{L-1}$ in STEP 1907, the bit $n_{3,2}$ is set to "1" (STEP 1909).

Next the value of p is incremented to a value of p=4 (STEP 1913). Accordingly, the comparison of STEP 1915 is true, indicating that Bit 2 has been set for all four phases. Therefore, the bit index i is incremented to i=3 and the phase index p is reset to p=0 (STEP 1917). The comparison in STEP 1919 is false, indicating that there are still more bits to be set, since the value of i has not yet reached $2^L$.

Generation of "Bit 3" (i.e., the Fourth Bit)

Figure 35:
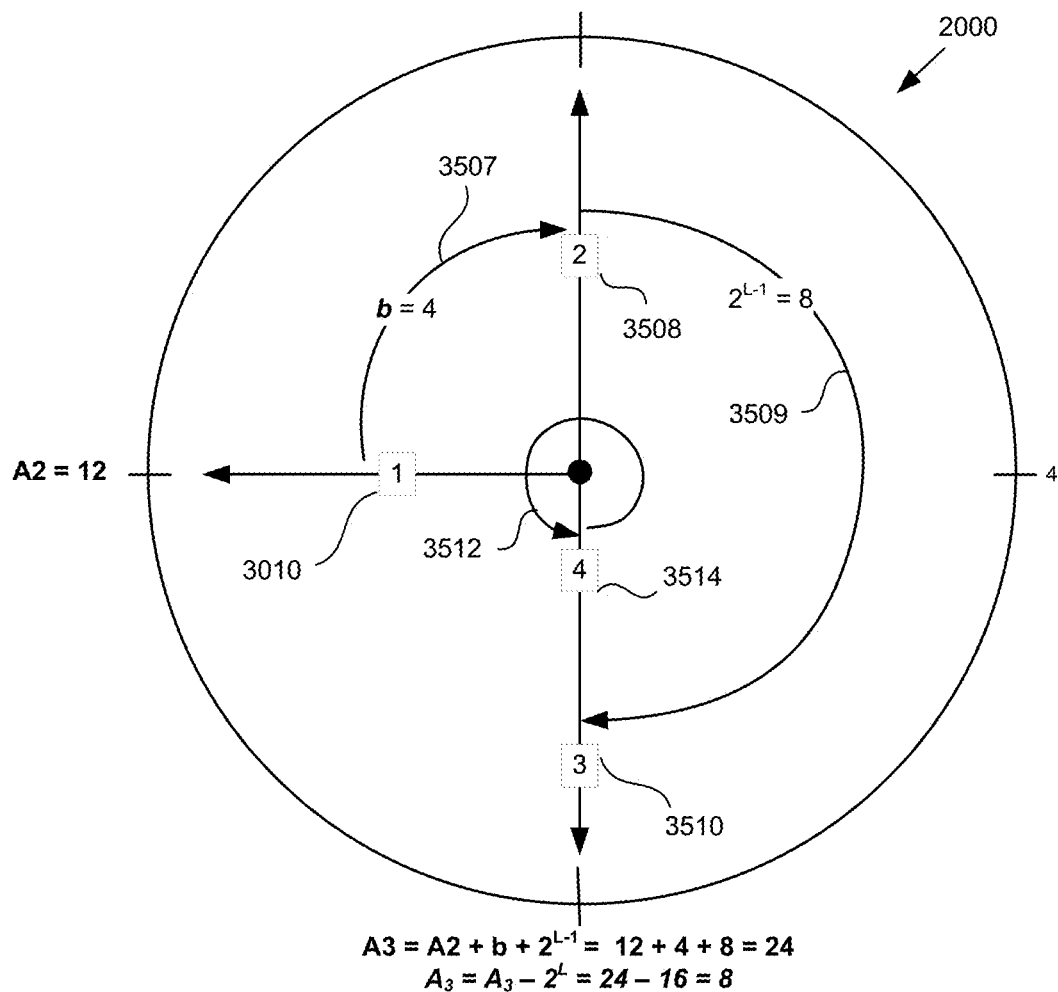
FIG. 35 illustrates the update of the value $A_1$ stored in the accumulator from $A_2$ to $A_3$.

FIG. 35 illustrates the update of the value $A_i$ stored in the accumulator from $A_2$ to $A_3$ (STEP 1921 and STEP 1905). EQ. 24 through EQ. 27 below show the calculation of $A_3$:

$A_3 = A_2 + b + 2^{L-1}$ $\quad$ EQ. 59

$A_3 = 12 + 4 + 8 = 24$ $\quad$ EQ. 60

$A_3 = A_3 - 2^L =$ $\quad$ EQ. 61

$A_3 = 24 - 16 = 8$ $\quad$ EQ. 62

The value b is added to $A_2$, as indicated by the arrow 3507 illustrating the rotation of the pointer 3010 from position "1" representing a value of 12, to position "2" of the pointer 3508 representing a value of 16. $2^{L-1}$ is then added, as illustrated by the arrow 3509 showing the pointer 3508 at position "2" rotating 180° clockwise to pointer 3510 at position "3". In some embodiments, the value $A_i$ stored in the accumulator should remain in the range of 0 to $2^{L-1}$ (i.e., between 0 and 15 in the example shown). Accordingly, if the value $A_3$ is equal or greater than $2^L$ (STEP 1903), it is reduced by $2^L$ (STEP 1905). Accordingly, the pointer 3510 at position "3" representing a value of 24 is rotated counter-clockwise by 360°, as indicated by arrow 3512, resulting in the pointer 3514 at position "4" (STEP 1905) representing a value of 8, as indicated by EQ. 62.

Generation of "Bit 3", $n_{0,3}$ of Phase 0

Figure 36:
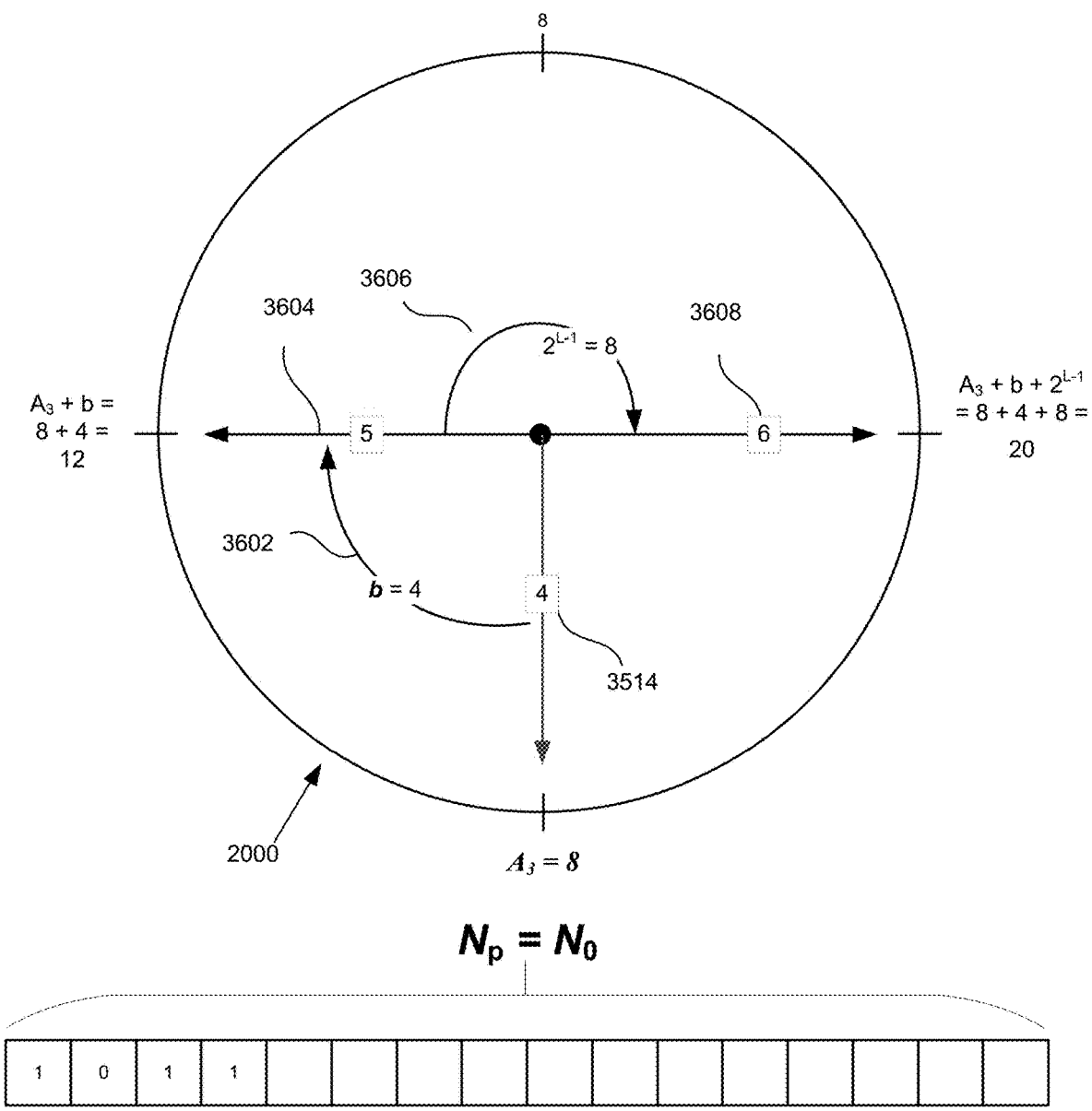
FIG. 36 is a graphical illustration of the process for a phase index value p=0 and a bit index value i=3.

FIG. 36 is a graphical illustration of the process performed in STEP 1907 for a phase index value p=0 and a bit index value i=3.

Mod 16($A_3$+(p/m)$2^L$)+b+$2^{L-1}$ $\quad$ EQ. 63

Mod 16(8+(0/4)16)+4+8= $\quad$ EQ. 64

Mod 16(8+0)+4+8= $\quad$ EQ. 65

8+4+8=20 $\quad$ EQ. 66

The value $A_3$ can be seen from EQ. 62 to be equal to 8. A pointer 3514 at position "4" represents the value $A_3$. The pointer 3514 is rotated 90° clockwise by the addition of b, as illustrated by the arrow 3602, resulting in the pointer 3604 at position "5". The value $2^{L-1}$ is then added, resulting in a further 180° rotation of the pointer 3604, as illustrated by the arrow 3606 and resulting in the pointer 3608 at position "6" representing a value of 20. Since the sum of EQ. 66 represented by the pointer 3608 is greater than 16 (i.e., $2^L$), Bit 3, $n_{0,3}$ of Phase 0 will be set to "1". That is, since the pointer 5514 representing the value $A_3$ plus the phase offset rotates past the top of the vector circle 2000 when summed with b+$2^{L-1}$ in STEP 1907, the bit is set to "1".

Generation of Bit 3, $n_{1,3}$ of Phase 1

Figure 37:
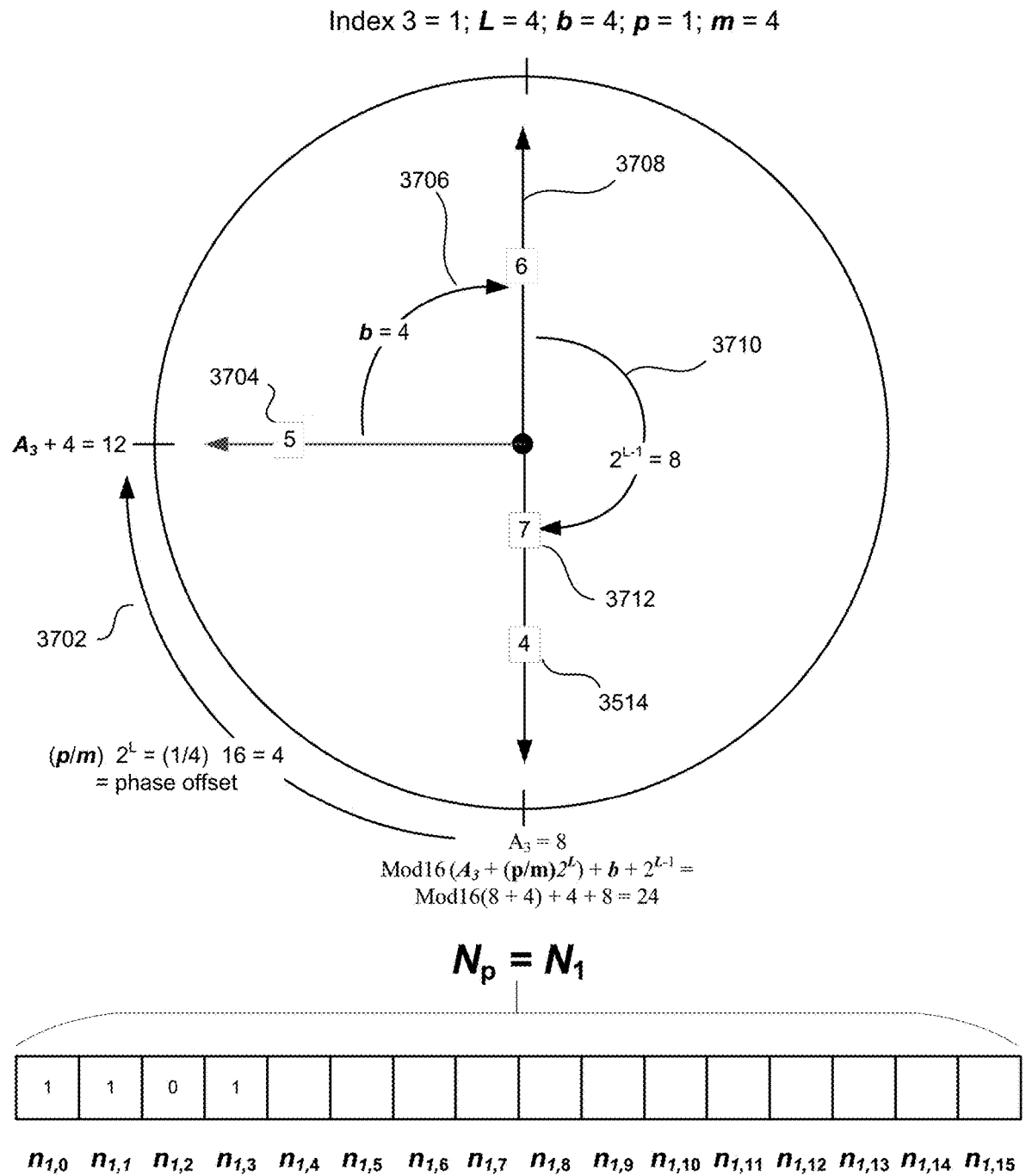
FIG. 37 is a graphical illustration of the process for a phase index value p=1 and a bit index value i=1 for generating Bit 1 of Phase 1.

FIG. 37 is a graphical illustration of the process performed in STEP 1907 for a phase index value p=1 and a bit index value i=1 for generating Bit 1 of Phase 1. EQ. 67 through EQ. 70 show the details of the calculation performed in STEP 1907.

Mod 16($A_3$+(p/m)$2^L$)+b+$2^{L-1}$ $\quad$ EQ. 67

Mod 16(8+(1/4)16)+4+8= $\quad$ EQ. 68

Mod 16(8+4)+4+8= $\quad$ EQ. 69

12+4+8=24 $\quad$ EQ. 70

As noted above in EQ. 68, the value $A_3$=8 and remains the same for each phase until the bit index i is incremented in STEP 1917 (i.e., upon all of the second bits of each phase being set). The pointer 3514 at position "4" represents the value $A_3$, similar to the case shown in FIG. 36. The pointer 3514 is rotated 90° by the addition of the phase offset (i.e., (p/m)16)=12 for Phase 1, as can be seen in EQ. 70 above, and illustrated by arrow 3702, resulting in a pointer 3704 at position "5".

A further 90° clockwise rotation representing the addition of b, is shown by the arrow 3706, resulting in the pointer 3708 at position "6". The value $2^{L-1}$ is then added, as illustrated by the arrow 3710, resulting in a further 180° clockwise rotation of the pointer 3708, resulting in the pointer 3712 at position "7", representing a value of 24. Since the sum of EQ. 70 represented by the pointer 3712 is greater than 16 (i.e., $2^L$), Bit 3, $n_{1,3}$ of Phase 1 will be set to "1" (STEP 1909). That is, since the pointer 3704 representing the value $A_1$ plus the phase offset rotated past the top of the vector circle 2000 when rotating in response to the sum Mod 16 $(A_3+(p/m)16)+b+2^{L-1}$ in STEP 1907, the bit is set to "1".

Generation of Bit 3, $n_{2,3}$ of Phase 2

Figure 38:
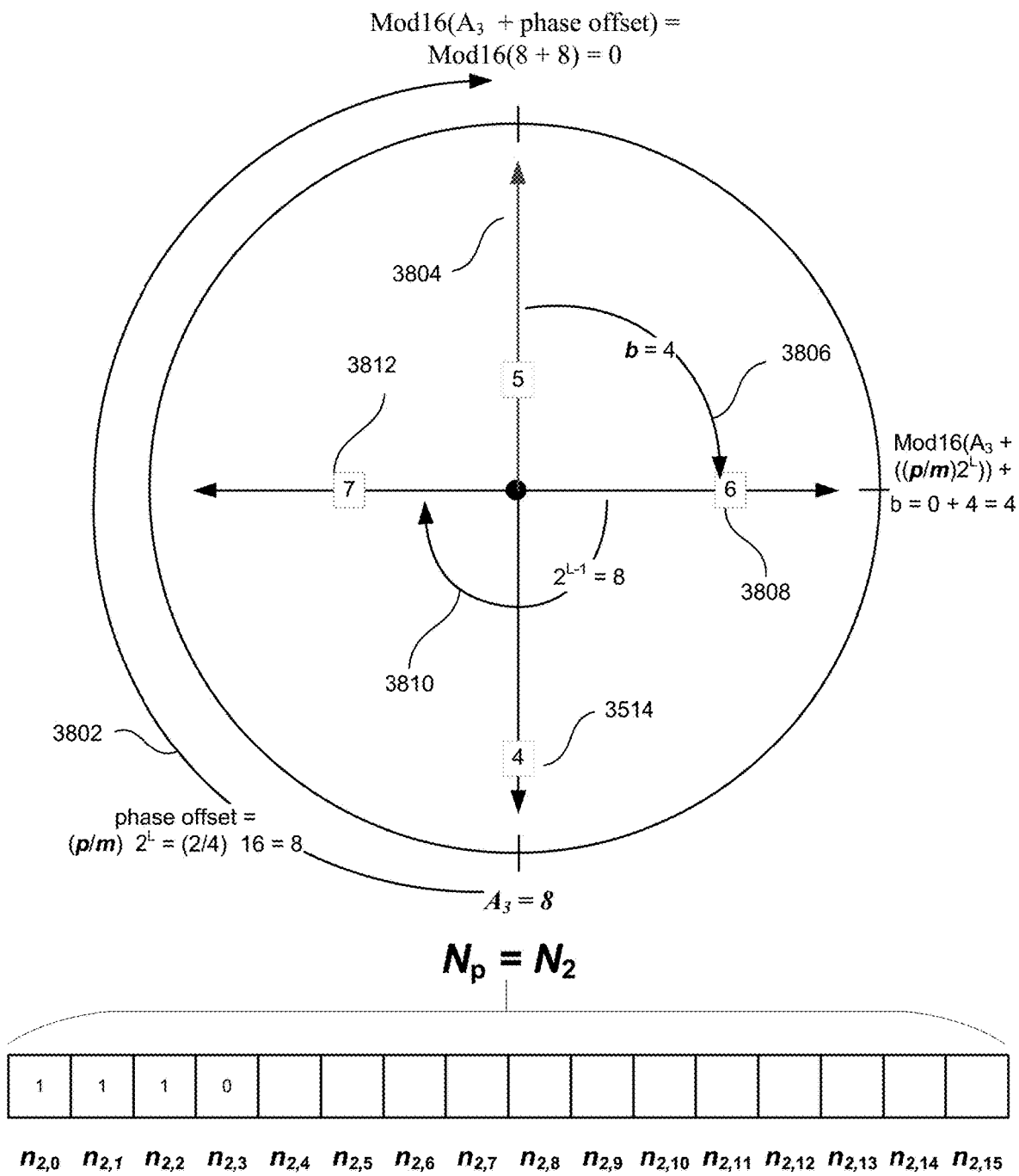
FIG. 38 is a graphical illustration of the process performed in STEP 1907 for a phase index value p=2 and a bit index value i=3.

FIG. 38 is a graphical illustration of the process performed in STEP 1907 for a phase index value p=2 and a bit index value i=3.

Mod 16($A_3$+(p/m)$2^L$)+b+$2^{L-1}$= $\quad$ EQ. 71

Mod 16(8+(2/4)16)+4+8= $\quad$ EQ. 72

Mod 16(8+8)+4+8= $\quad$ EQ. 73

0+4+8=12 $\quad$ EQ. 74

As noted above, the value $A_3$ of the accumulator A remains equal to 8 represented by the pointer 3514 at position "4". The pointer 3514 is rotated clockwise 180° by the addition of the phase offset (i.e., (p/m)16)=8 for Phase 2, as can be seen in EQ. 72 above, and illustrated by arrow 3802, resulting in a pointer 3804 at position "5".

A further 90° clockwise rotation representing the addition of b, is shown by the arrow 3806, resulting in the pointer 3808 at position "6". The value $2^{L-1}$ is then added, by a further 180° clockwise rotation of the pointer 3808, as shown by the arrow 3810, resulting in the pointer 3812 at position "7", representing a value of 20. Since the sum of EQ. 74 represented by the pointer 3812 is less than 16 (i.e., $2^L$), Bit 3, $n_{2,3}$ of Phase 2 will be set to "0". That is, since the pointer 3514 representing the value $A_3$ plus the phase offset did not rotate up to the top of the vector circle 2000 when rotating in response to the sum Mod 16 $(A_3+(p/m)16)+b+2^{L-1}$ in STEP 1907, the bit $n_{2,3}$ is set to "0".

Generation of Bit 3, $n_{3,3}$ of Phase 3

Figure 39:
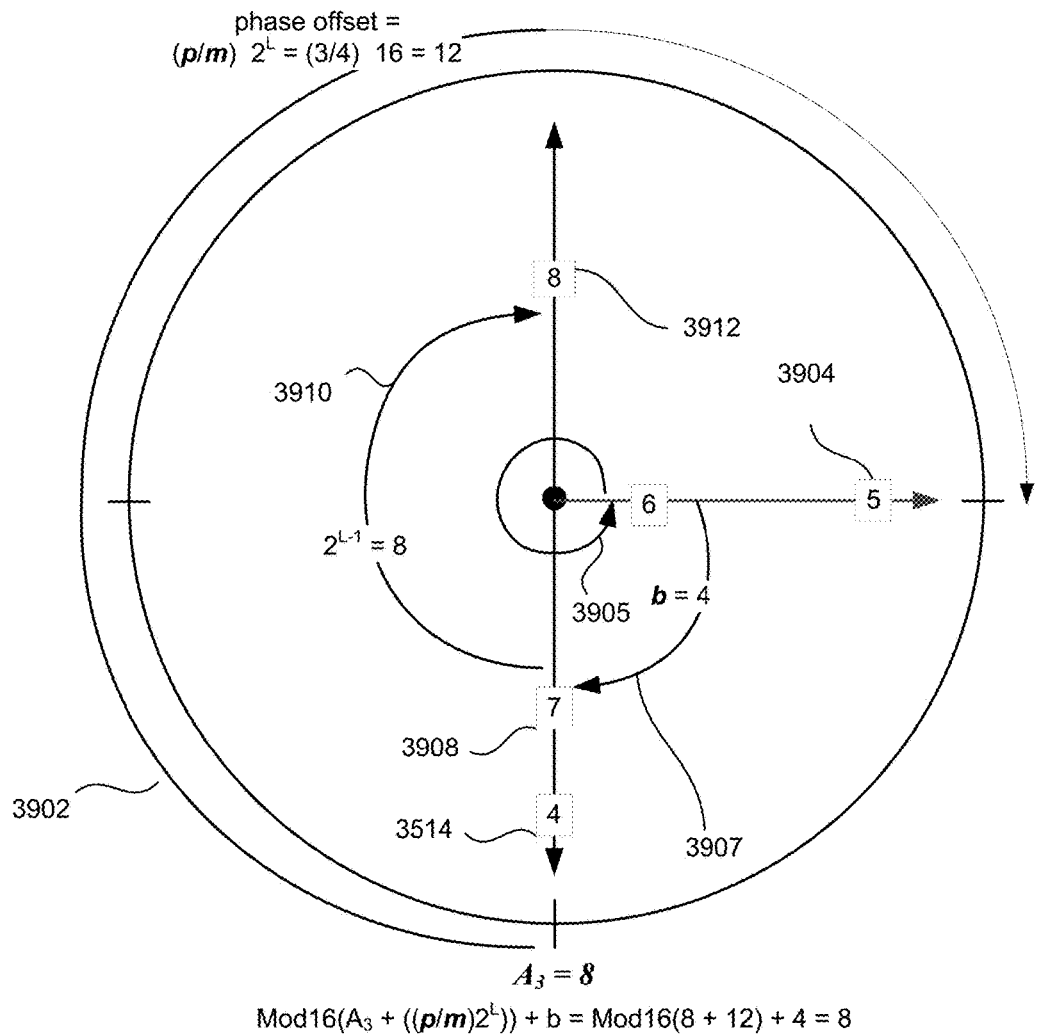
FIG. 39 is a graphical illustration of the process for a phase index value p=3 and a bit index value i=3.
Figure 39:
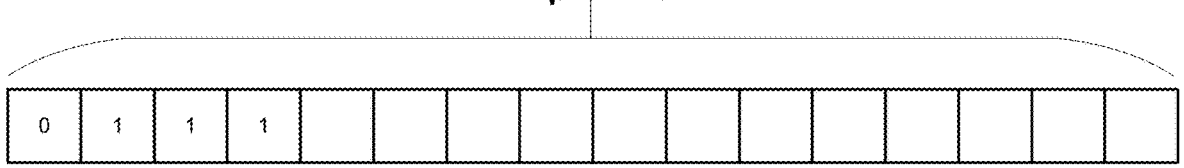

FIG. 39 is a graphical illustration of the process performed in STEP 1907 for a phase index value p=3 and a bit index value i=3.

$$\text{Mod } 16(A_3+(p/m)2^L)+b+2L^{-1}= \qquad \text{EQ. 75}$$

$$\text{Mod } 16(8+(3/4)16)+4+8= \qquad \text{EQ. 76}$$

$$\text{Mod } 16(8+12)+4+8= \qquad \text{EQ. 77}$$

$$4+4+8=16 \qquad \text{EQ. 78}$$

As noted above, the value $A_3$ of the accumulator A remains equal to 8 represented by the pointer 3514 at position "4". The pointer 3514 is rotated clockwise 270° by the addition of the phase offset (i.e., (p/m)16)=12 for Phase 3, as can be seen in EQ. 78 above, and illustrated by arrow 3902, resulting in a pointer 3904 at position "5" representing a value of 20. The modulo 16 operator results in a counter-clockwise rotation of 360°, as illustrated by arrow 3905 and resulting in a pointer 3906 at position "6" representing a value of 4.

A further 90° clockwise rotation representing the addition of b, is shown by the arrow 3907, resulting in the pointer 3908 at position "7". The value $2^{L-1}$ is then added, by a further 180° clockwise rotation of the pointer 3908, as shown by the arrow 3910, resulting in the pointer 3912 at position "8", representing a value of 16. Since the sum of EQ. 78 represented by the pointer 3912 is equal to 16 (i.e., $2^L$), Bit 3, $n_{3,3}$ of Phase 3 will be set to "1". That is, since the pointer 3906 representing the value $A_3$ plus the phase offset rotated up to the top of the vector circle 2000 when rotating in response to the sum Mod 16 $(A_3+(p/m)16)+b+2^{L-1}$ in STEP 1907, the bit $n_{3,3}$ is set to "1" (STEP 1909).

Next the value of p is incremented to a value of p=4 (STEP 1913). Accordingly, the comparison of STEP 1915 is true, indicating that Bit 3 has been set for all four phases. Therefore, the bit index i is incremented to i=4 and the phase index p is reset to p=0 (STEP 1917). The comparison in STEP 1919 is still false, indicating that there are more bits to be set, since the value of i is not yet equal to $2^L$.

Therefore, the value of the accumulator A is updated (STEP 1921) to:

$$A_4=A_3+b+2^{L-1}= \qquad \text{EQ. 79}$$

$$A_4=8+4+8=20 \qquad \text{EQ. 80}$$

$$A_4=A_4-16=4 \qquad \text{EQ. 81}$$

The sum of EQ. 79 is calculated in STEP 1921. Then the value of the accumulator A is checked to see whether it is equal to or greater than $2^L$ (i.e., 16). Since the result of the compare (STEP 1903) is true, the value of the accumulator A is reduced (STEP 1905) before performing the calculation and compare in STEP 1907.

It will be seen that the value of the accumulator $A_4$ is the same as the previously calculated value $A_o$. Since all of the other variables (p, m, L, b) in the comparison of STEP 1907 are the same as they were when the value of the bit index was i=0, the process will start to repeat itself. That is, the state of bit 5 of each phase will be the same as the state of bit 0 for each phase. For example, the bit $n_{0,0}$ will be in the same state as the bit $n_{0,4}$. Similarly, bit $n_{0,1}$ will be in the same state as bit $n_{0,5}$.

Figure 40:
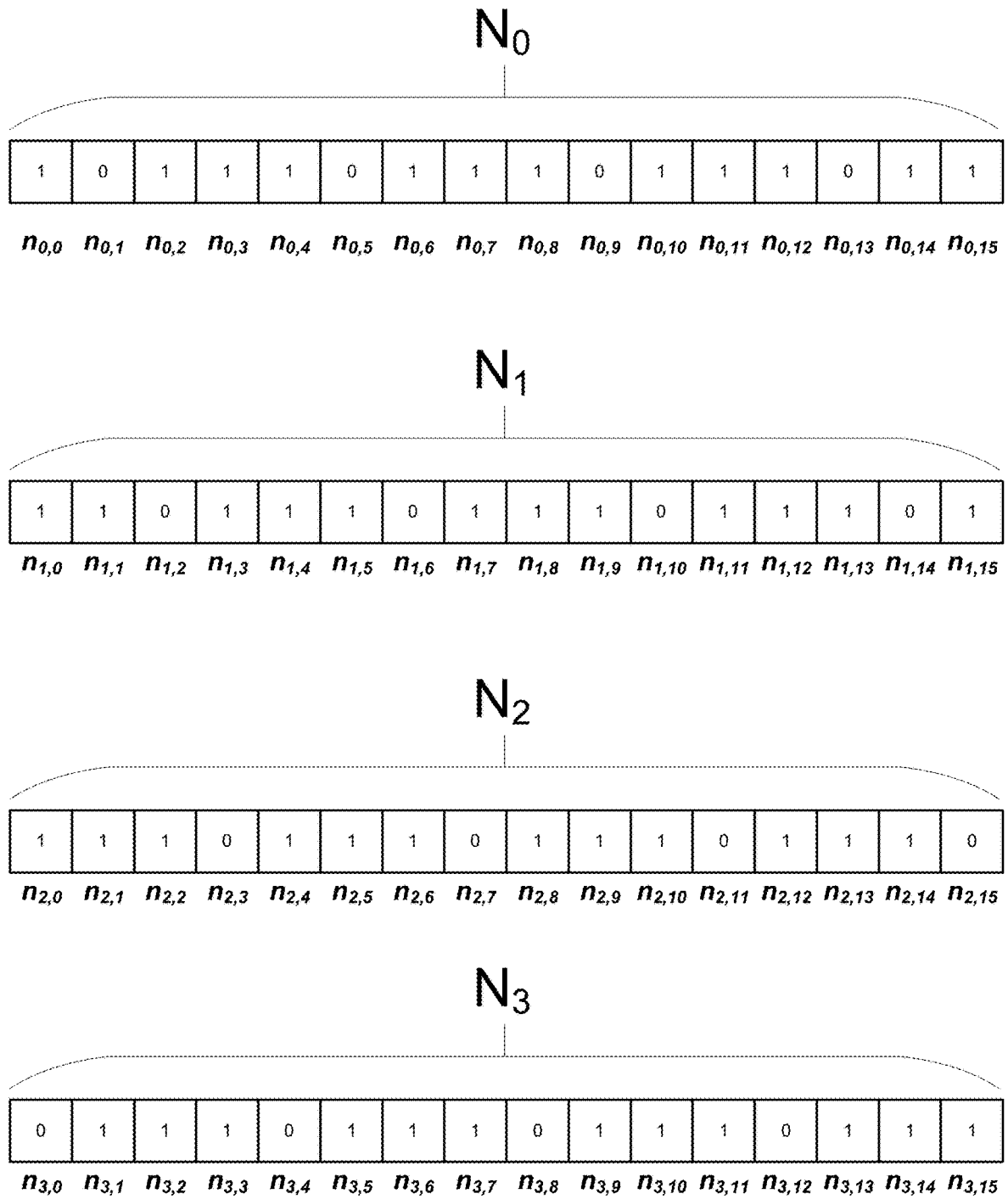
FIG. 40 shows the value of each of the bits from i=0 to i=15 for each of the four sequences generated in each phase (p=1 through p=3).

FIG. 40 shows the value of each of the bits from i=0 to i=15 for each of the four sequences generated in each phase (p=1 through p=3). It should be noted that the pattern of bits in each sequence repeats in a four-bit pattern in response to the value b=4. For other values of b, the pattern repeats with a different period. For example, if b=0, the pattern repeats with a period of 2 bits rather than 4 bits. However, in each case, the ones and zeros will be evenly distributed throughout each sequence, with the placement of the bits shifted in phase from one sequence to the next. That is, the sequence for $N_0$ is shifted one bit to the left with respect to the sequence for $N_1$, which is shifted one bit to the left with respect to the sequence for $N_2$, which is shifted on bit to the left with respect to the sequence $N_3$, which is shifted one bit to the left with respect to the sequence of $N_0$. Note that when each sequence is shifted, the bit at $n_{p,0}$ is shifted to bit $n_{p,15}$.

Table 1 below shows the values for the accumulator for each bit index i. It can be seen from Table 1 and from STEP 1921, STEP 1903 and STEP 1905 that the value $A_i$ of the accumulator A is incremented at each increment of the bit index i by $A_i$=Mod $16(A_{i-1}+b+2^{L-1})$. Table 1 also shows that the value repeats every four increments of the bit index i (i.e., every four bits).

TABLE 1

| | |
|---|---|
| $A_0$ | 4 |
| $A_1$ | 0 |
| $A_2$ | 12 |
| $A_3$ | 8 |
| $A_4$ | 4 |
| $A_5$ | 0 |
| $A_6$ | 12 |
| $A_7$ | 8 |
| $A_8$ | 4 |
| $A_9$ | 0 |
| $A_{10}$ | 12 |
| $A_{11}$ | 8 |
| $A_{12}$ | 4 |
| $A_{13}$ | 0 |
| $A_{14}$ | 12 |
| $A_{15}$ | 8 |

Figure 41:
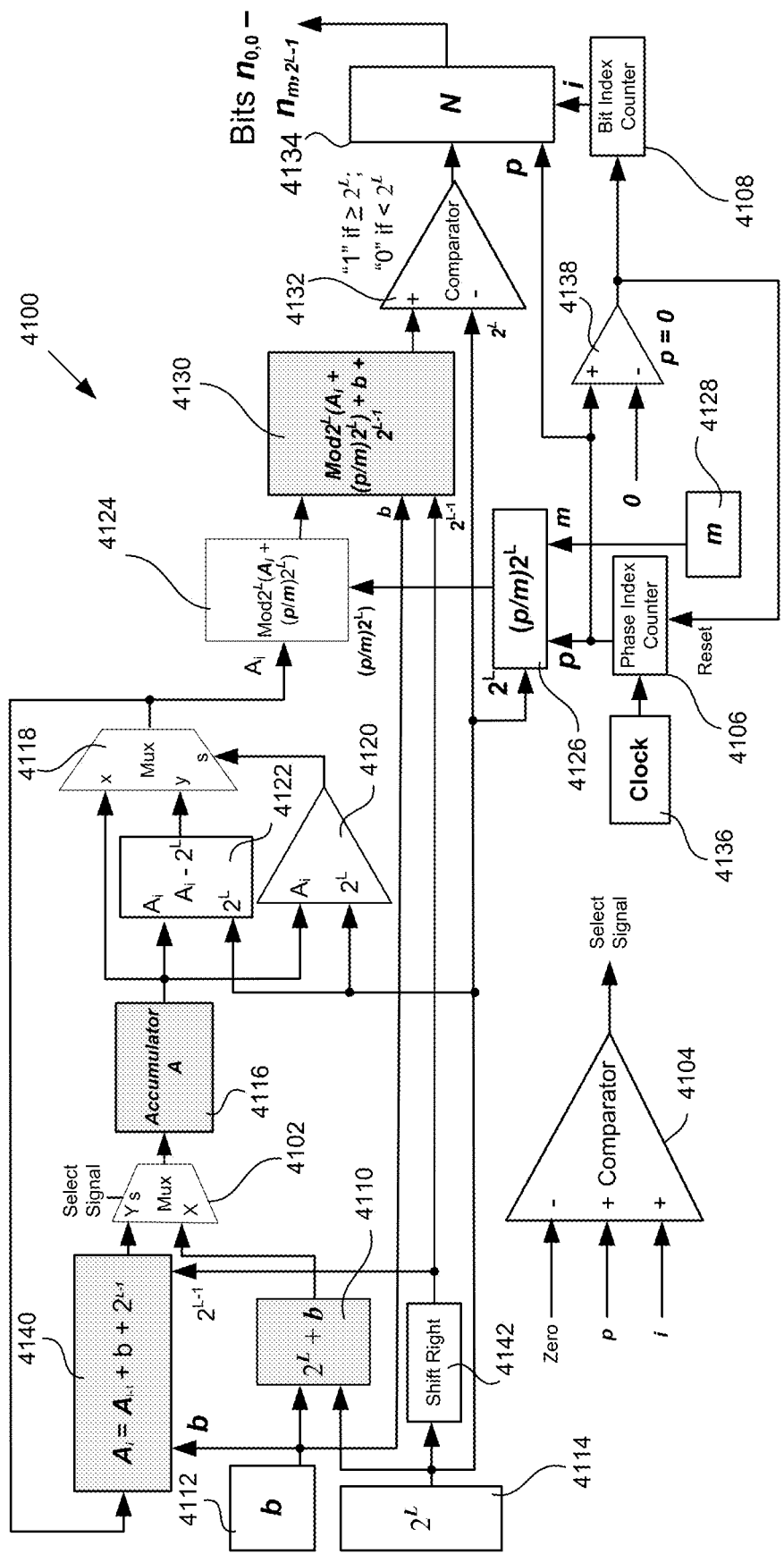
FIG. 41 is a simplified schematic of one embodiment for implementing a multiphase δ-sequence generator.

FIG. 41 is a simplified schematic of one embodiment for implementing the multiphase δ-sequence generator described above. A multiplexer 4102 selects between two inputs ("X" and "Y") based on the state of a select signal. The select signal is generated by a comparator 4104. The comparator 4104 outputs a logical "1" when the value of the phase index p and the bit index i are both equal to zero. The phase index p is maintained in a phase index counter 4106. In some embodiments, the phase index counter is a register that roles over to zero on the next count after p=m−1. That is, the phase index counter 4106 has a range from 0 to m−1. The bit index is maintained in a bit index counter 4108. In some embodiments, the bit index counter 4108 roles over to zero on the next count after i=$2^L$−1. Accordingly, the bit index counter has a range from 0 to $2^L$−1.

In some embodiments, the phase index counter 4106 and the bit index counter 4108 are provided a hard reset to zero when the circuit is initialized. Accordingly, upon initialization, the select signal will be a logic "1". When the select signal is a logic "1", the multiplexer 4102 selects the X input. The X input is coupled to a summing circuit 4110. The summing circuit 4110 has two inputs. The first input is coupled to a register 4112 that holds the value of b. The second input is coupled to a register 4114 that holds the value of $2^L$. The summing circuit outputs the sum of the values coupled to the two inputs, b and $2^L$. The selected output from the multiplexer 4102 is coupled to an accumulator 4116. The accumulator 4116 holds each value until the value of the bit index i changes. The particular input used to cause the accumulator to store the next value is not shown, but those of ordinary skill will understand how to generate the input.

With the value $2^L+b$ stored in the accumulator 4116, the output of the accumulator 4116 is coupled to three different devices. The first device is a multiplexer 4118. The output of the accumulator is coupled to the first input of the multiplexer 4118. The second device is a comparator 4120. The output of the accumulator is coupled to the non-inverting input to the comparator 4120. The third device is subtraction circuit 4122. The output of the accumulator is coupled to one of two inputs to the subtraction circuit. The second input to the subtraction circuit 4122 and the inverting input to the comparator 4120 are coupled to the output of the register 4114 that holds the value $2^L$. The output of the subtraction circuit 4122 is coupled to the second input to the multiplexer 4118. The output of the comparator 4120 is coupled to the select input of the multiplexer 4118. Therefore, when the $2^L$ is equal to or greater than the value stored in the accumulator 4116, the comparator will output a logical "1", causing the multiplexer to select the Y input that is coupled to the subtraction circuit 4122. The selected input is coupled to the output of the multiplexer 4118. Accordingly, the output of the multiplexer will be equal to the value of the accumulator minus $2^L$. Alternatively, if the value in the accumulator 4116 is less than the $2^L$, the multiplexer will select the X input and the output of the multiplexer will be equal to the value stored in the accumulator 4116. Accordingly, the circuitry described thus far performs the STEPs 1901 through 1905 shown in FIG. 19.

The output of the multiplexer 4118 is coupled to a first input to a summing circuit 4124. The summing circuit 4124 outputs the sum $\text{Mod}2^L(A_i+(p/m)2^L)$. The value $(p/m)2^L$ is provided to the second input to the summing circuit 4124 by a register 4126. The output of the register 4126 is coupled to the second input to the summing circuit 4124. In some embodiments, the register 4126 is a look up table that is addressed by the values of the phase index p and the terminal value of the phase index m and potentially the value $2^L$. The terminal value m is provided to the the register 4126 by a register 4128 that holds the value m. The output of the phase index counter 4106 provides the value of the phase index p. In addition, the output of the 4114 is coupled to the register 4126 to provide the value $2^L$.

The output $\text{Mod}2^L(A_i+(p/m)2^L)$ of the summing circuit 4124 is coupled to another summing circuit 4130. The summing circuit 4130 adds the values b and $2L^1$ to $\text{Mod}2^L(A_i+(p/m)2^L)$. This sum is then coupled from the output of the summing circuit 4130 to the non-inverting input of a comparator 4132. The inverting input to the comparator 4132 is coupled to the register 4114 that holds the value $2^L$. Accordingly, the comparator 4132 outputs a logical "1" if the output of the summing circuit 4130 is greater than or equal to $2^L$ and a logical "0" if not. It can be seen that the output of the comparator performs the function that is noted in STEPs 1907, 1909 and 1911 of FIG. 19. The particular bit at issue is set by storing the output of the comparator 4132 at an address in a memory device 4134 that is determined by the values of the phase index p and the bit index i. Upon storing the bit in the memory 4134, a clock 4136 coupled to the phase index counter 4106 increments the value of the phase index counter 4106. A comparator 4138 checks whether the phase index counter 4106 has rolled over to zero. If so, the comparator 4138 output a reset signal to cause the value of the bit index counter 4108 to increment and the phase index counter 4106 to reset.

It should be clear that each time the clock 4136 increments the value of the phase index counter 4106, a new value will be determined at the output of the summing circuit 4130 and a determination will be made as to whether the particular bit $n_{p,i}$ associated with the values of the phase and bit index counters is to be a "1" or a "0". The $i^{th}$ bit of each of the $N_p$ sequences will in turn be stored until the phase index counter 4106 rolls over to zero indicating that all of the $i^{th}$ bits of each phase have been set, at which time the bit index counter 4108 will increment. The first time the bit index counter increments, a signal is generated to cause the accumulator 4116 to store the value that is provided at the input of the accumulator 4116. Since the bit index i is no longer zero at that time, the select signal to the multiplexer 4102 will cause the multiplexer 4102 to select the Y input, which is coupled to a summing circuit 4140. The summing circuit 4140 has three inputs, the first coupled to the output of the register that holds the value b. The second is coupled to the output of a shift register 4142. The shift register 4142 is coupled to the register that holds that value $2^L$. The shift register generates the value $2^{L-1}$ by performing a single shift right on the value $2^L$. The third input to the summing circuit 4140 is coupled to the output of the multiplexer 4118. Accordingly, the summing circuit 4140 outputs the sum $A_i=A_{i-1}+b+2^{L-1}$, as shown in STEP 1921 of FIG. 19, which is coupled by the multiplexer 4102 to the input of the accumulator. The output of the accumulator 4116 is then compared to $2^L$ in the comparator 4120. If equal or greater than $2^L$, subtraction circuit 4122 reduces the value by $2^L$. The new value of output from the multiplexer 4118 is then used to determine whether the next bit of each phase is to be set to a "1" or a "0". If the bit index counter 4108 rolls over to zero, the process will start again. In some embodiments, as shown in FIG. 19, a comparator can be used to determine when to end the process.

Figure 42:
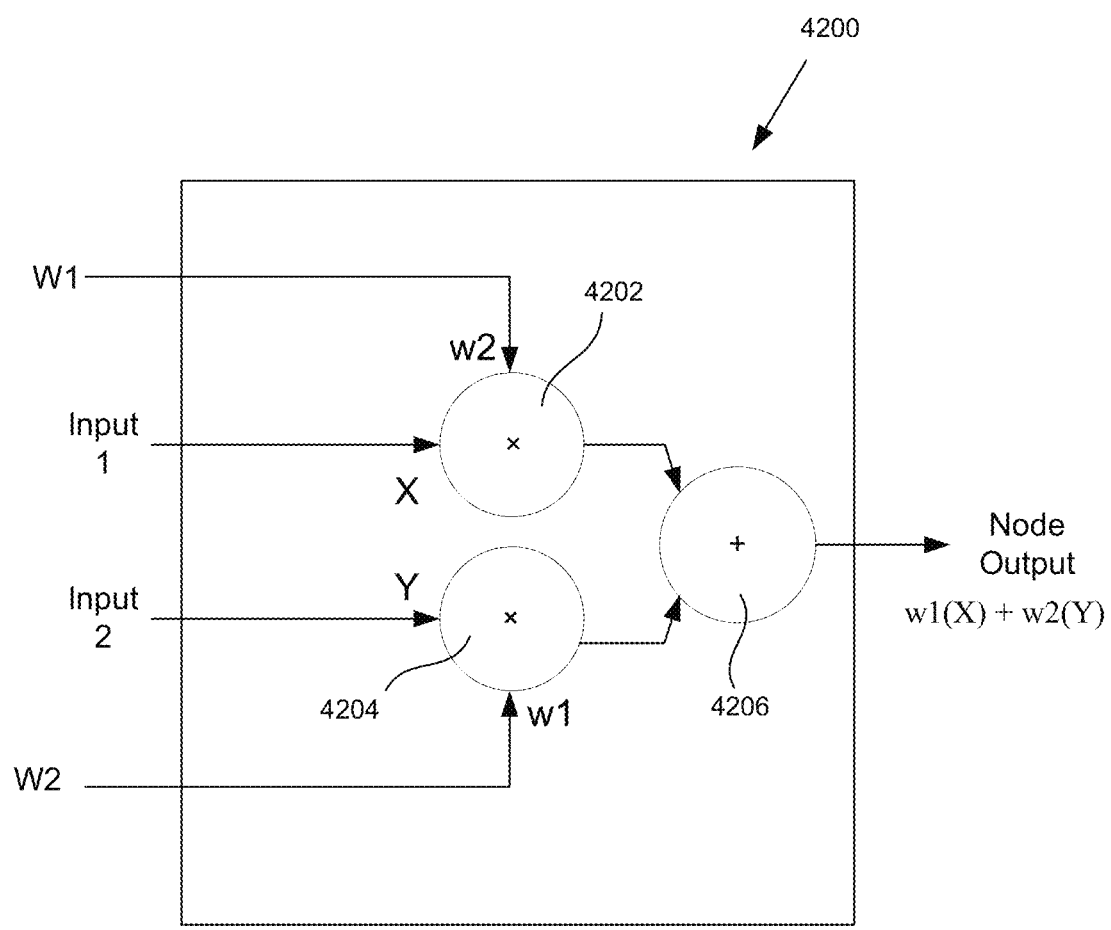
FIG. 42 is a simplified schematic illustrating single node 4200 of a neural network within an artificial intelligence engine.

FIG. 42 is a simplified schematic illustrating single node 4200 of a neural network within an artificial intelligence engine. The node 1400 consists of two multiplier circuits 4202, 4204 and a summing circuit 4206. The node 4200 receives four inputs, input signal 1, input signal 2, weight W1 and weight W2. Input signal 1 and input signal 2 are signals that represent an input values X and Y, respectively. Weights W1 and W2 are signals that represent weight values w1 and w2, respectively that are used to modify the input values X and Y, respectively. Input 1 and the weight W1 are coupled to the inputs of the multiplier circuit 4202. A signal representing the produce of X (i.e., the value represented by input signal 1) and w1 (i.e., the value represented by weight W1) is provided at the output of the multiplier circuit 4202. Similarly, input 2 and the weight W2 are coupled to the inputs of the multiplier circuit 4204. A signal representing the produce of the Y (i.e., the value represented by input signal 1) and w1 (i.e., the value represented by the weight W1) is provided at the output of the multiplier circuit 4204.

The output of the multiplier circuit 4202 and the output of the multiplier circuit 4204 are then each coupled to one of the two inputs to the summing circuit 4206. The output of the summing circuit 4206 is coupled to the output of the node 4200. Accordingly, the output of the node 4200 is equal to the sum:

$$w1(X)+w2(Y).\qquad\text{EQ. 82}$$

Figure 43:
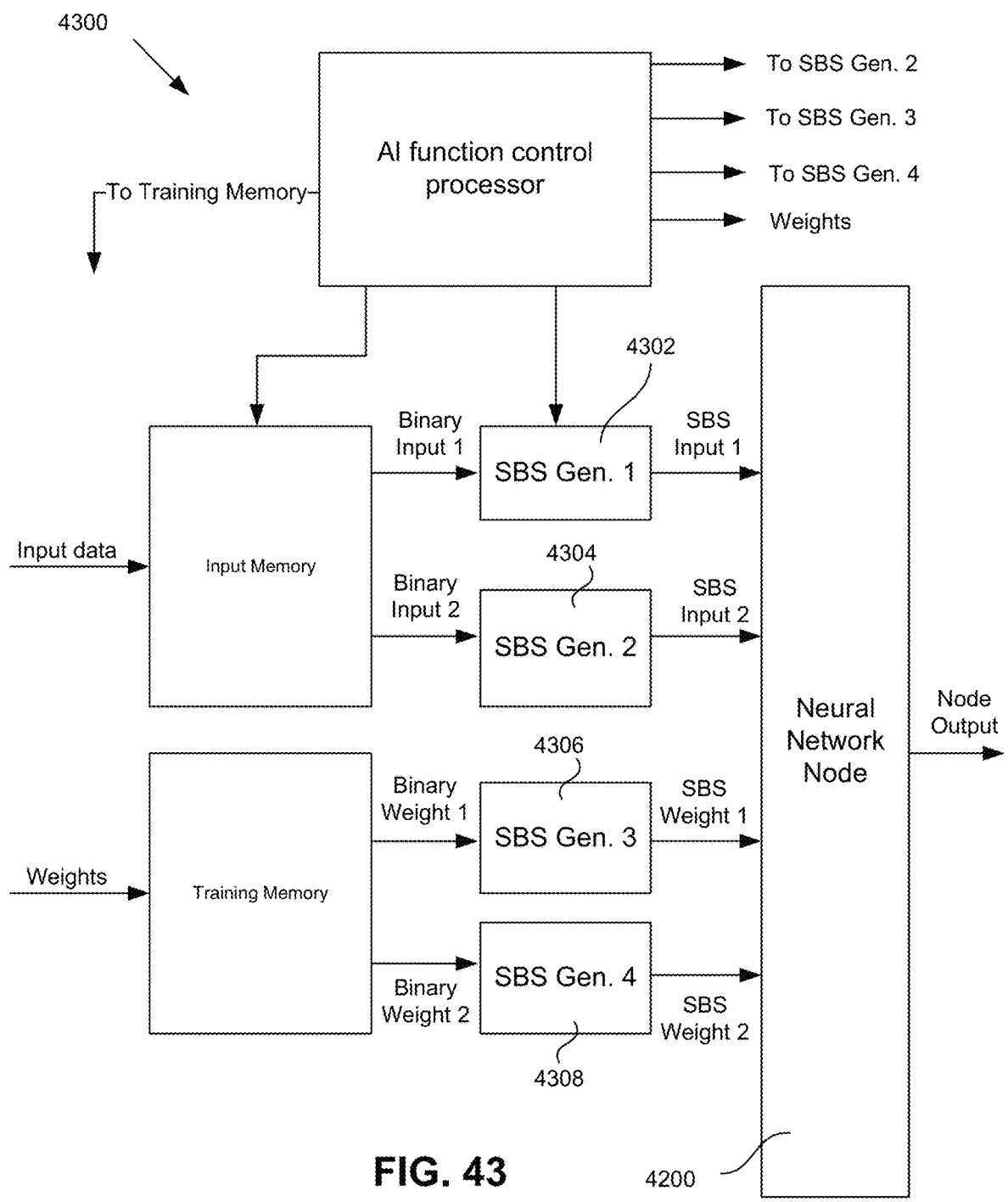
FIG. 43 is a simplified schematic of a portion of a neural network within an artificial intelligence engine.

FIG. 43 is a simplified schematic of a portion of a neural network (i.e., with only one node 4200 shown) within an artificial intelligence engine 4300. In the embodiment shown in FIG. 43, values to be multiplied at particular nodes (such as node 4200) within the artificial intelligence engine 4300 are stored in binary format and then converted to SBSs prior to being presented to the nodes. Storing the values in binary format allows the value to be stored in a relatively small amount of memory. Converting the values from binary format to SBS format prior to performing the multiplication operation reduces the hardware required to perform multiplication.

A series of SBS generators 4302, 4304, 4306, 4308 perform the conversion. In some embodiments, the SBS generators, 4302, 4304, 4306, 4308 function as described above to convert the binary values represented by the input signals (Binary input 1, Binary input 2, Binary weight 1, Binary weight 2) into SBS sequences represented by the SBS input signals (SBS input 1, SBS input 2, SBS input 3, SBS input 4).

It will be understood that the artificial intelligence engine 4300 is a simplification in which only one neural network node 4200 is shown. However, in other more interesting artificial intelligence engines (not expressly shown) there may be several nodes to which it might be beneficial to provide different phases of a particular binary input or binary weight. In such cases, a multi-phase δ-sequence generator can be used to convert a binary input or binary weight into a plurality of SBS sequences that are each out of phase with one another.

CONCLUSION

A number of embodiments of the disclosed method and apparatus have been described. It is to be understood that various modifications may be made without departing from the spirit and scope of the disclosed method and apparatus. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the any claims that are presented in later filed applications that might claim priority to this disclosure.

What is claimed is:

1. A multi-phase_stochastic binary string (SBS) generator, comprising:
 (a) a first multiplexer having:
  (1) an output, a select signal input;
  (2) an X input; and
  (3) a Y input;
 (b) a select comparator having:
  (1) a reference input;
  (2) a p input;
  (3) an i input and an output coupled to the select signal input of the first multiplexer;
 (c) a phase index counter having:
  (1) a clock signal input;
  (2) a reset input; and
  (3) an output, the output coupled to the p input of the select comparator;
 (d) a bit index counter having:
  (1) an output coupled to the i input of the select comparator; and
  (2) an increment input;
 (e) a first summing circuit having:
  (1) a b input;
  (2) a $2^L$ input; and
  (3) an output, the output coupled to the X input of the first multiplexer;
 (f) an accumulator having:
  an input coupled to the output of the first multiplexer; and
  (2) an accumulator output;
 (g) a second multiplexer having:
  (1) an output;
  (2) a select input;
  (3) an X input; and
  (4) a Y input, the X input being coupled to the output of the accumulator;
 (h) a subtraction circuit having:
  (1) an $A_i$ input coupled to the output of the accumulator;
  (2) a $2^L$ input; and
  (3) an output coupled to the Y input of the second multiplexer;
 (i) a first comparator having:
  (1) an $A_i$ input coupled to the output of the accumulator;
  (2) a reference input;
  (3) a $2^L$ input; and
  (4) an output coupled to the select input of the second multiplexer;
 (j) an $2^L$ register having:
  (1) an $2^L$ output coupled to the $2^L$ input of the first summing circuit, to the $2^L$ input of the first comparator and to the $2^L$ input of the subtraction circuit;
 (k) a b register having:
  (1) a b output coupled to the b input of the first summing circuit; and
 (l) a second summing circuit having:
  (1) an output;
  (2) an $A_i$ input coupled to the output of the second multiplexer; and
  (3) a $(p/m)2^L$ input;
 (m) a $(p/m)2^L$ register having:
  (1) a p input coupled to the p output of the phase index counter;
  (2) an $2^L$ input coupled to the $2^L$ output of the $2^L$ register;
  (3) an m input; and
  (4) a $(p/m)2^L$ output coupled to the $(p/m)2^L$ input of the second summing circuit;
 (n) an m register having:
  (1) an m output coupled to the m input of the $(p/m)2^L$ register;
 (o) a third summing circuit having:
  (1) a first input coupled to the output of the second summing circuit;
  (2) a b input coupled to the b output of the b register;
  (3) a $2^{L-1}$ input; and
  (4) an output;
 (p) a shift register having:
  (1) a $2^L$ input coupled to the $2^L$ output of the $2^L$ register; and (2) a $2^{L-1}$ output coupled to the $2^{L-1}$ input of the third summing circuit;
(q) a second comparator having:
 (1) a non-inverting input coupled to the output of the third summing circuit;
 (2) an inverting input coupled to the output of the $2^L$ register; and
 (3) an output;
(r) a memory device having:
 (1) an input coupled to the output of the second comparator;
 (2) a p input coupled to the p output of the phase index counter; and
 (3) an i input coupled to the i output of the bit index counter;
(s) a clock source having:
 (1) a clock signal output coupled to the clock signal input of the phase index counter;
(t) a third comparator having:
 (1) a non-inverting input coupled to the p output of the phase index counter;
 (2) an inverting input coupled to a reference value; and
 (3) an output coupled to the reset input of the phase index counter and to the increment input of the bit index counter; and
(u) a fourth summing circuit having:
 (1) an $A_i$ input coupled to the $A_i$ output of the second multiplexer;
 (2) a b input coupled to the b output of the b register;
 (3) a $2^{L-1}$ input coupled to the $2^{L-1}$ output of the shift register; and
 (4) a Y output coupled to the Y input of the first multiplexer.

* * * * *